(12) United States Patent
Lai et al.

(10) Patent No.: US 10,170,467 B2
(45) Date of Patent: Jan. 1, 2019

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventors: Erh-Kun Lai, Taichung (TW); Kuang-Hao Chiang, Taoyuan (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/919,821

(22) Filed: Oct. 22, 2015

(65) Prior Publication Data
US 2017/0117271 A1 Apr. 27, 2017

(51) Int. Cl.
H01L 21/8229 (2006.01)
H01L 27/108 (2006.01)
H01L 27/06 (2006.01)
H01L 29/78 (2006.01)
H01L 29/66 (2006.01)
H01L 21/28 (2006.01)
H01L 21/265 (2006.01)
H01L 21/266 (2006.01)
H01L 27/11524 (2017.01)
H01L 27/11556 (2017.01)

(52) U.S. Cl.
CPC ........ *H01L 27/0688* (2013.01); *H01L 21/266* (2013.01); *H01L 21/26513* (2013.01); *H01L 21/28167* (2013.01); *H01L 27/11524* (2013.01); *H01L 27/11556* (2013.01); *H01L 29/6656* (2013.01); *H01L 29/66666* (2013.01); *H01L 29/7827* (2013.01)

(58) Field of Classification Search
USPC ........ 438/136, 137, 455–458, 149–165, 173, 438/192, 206, 212, 424, 427, 428, 591; 257/20, 194, 135–136, 213–413, 900, 257/902–903
See application file for complete search history.

(56) References Cited

U.S. PATENT DOCUMENTS

| | | | |
|---|---|---|---|
| 2006/0292781 A1* | 12/2006 | Lee | H01L 21/28282 438/197 |
| 2011/0233648 A1* | 9/2011 | Seol | H01L 21/32137 257/324 |
| 2014/0027816 A1* | 1/2014 | Cea | H01L 29/66545 257/192 |
| 2014/0183619 A1* | 7/2014 | Chen | H01L 29/66833 257/325 |
| 2015/0236115 A1* | 8/2015 | Chan | H01L 29/518 257/288 |

* cited by examiner

Primary Examiner — Moin Rahman
(74) Attorney, Agent, or Firm — McClure, Qualey & Rodack, LLP

(57) ABSTRACT

A 3D semiconductor memory device includes a semiconductor substrate, a source line, a gate line and a plurality of memory cells connected in series. The semiconductor substrate has a protruding portion. The source line is disposed in the semiconductor substrate and partially extending below the protruding portion. The gate line is configured to surround and cover the protruding portion and electrically separated from the source line and the protruding portion. The memory cells are disposed on the semiconductor substrate and connected in series to the protruding portion at a top surface thereof.

9 Claims, 49 Drawing Sheets

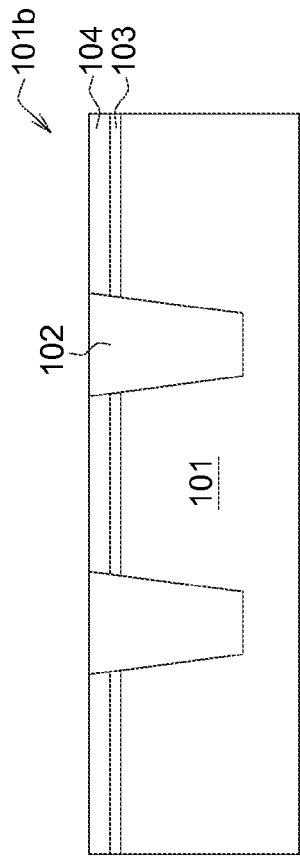
FIG. 1A3
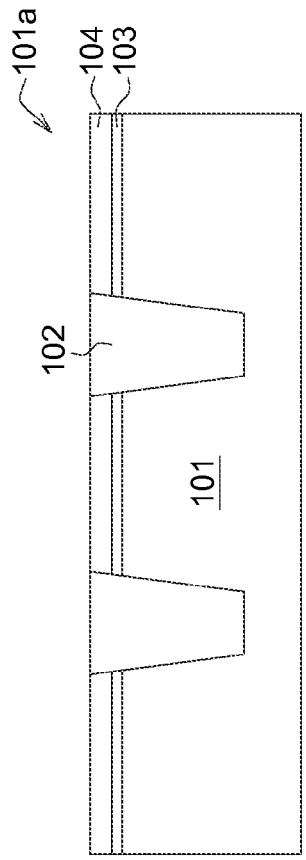
FIG. 1A2
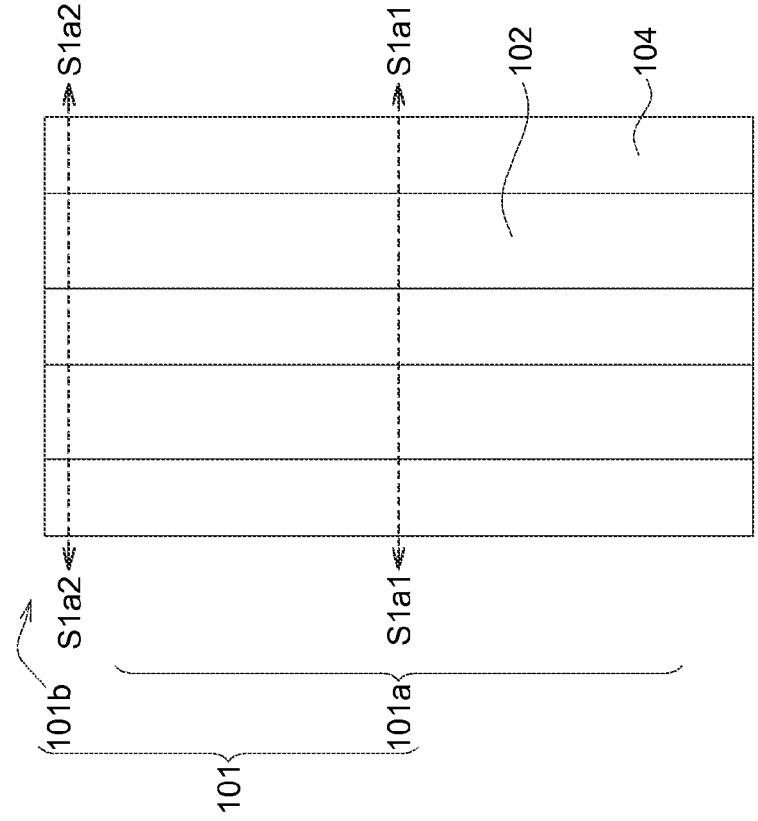
FIG. 1A1

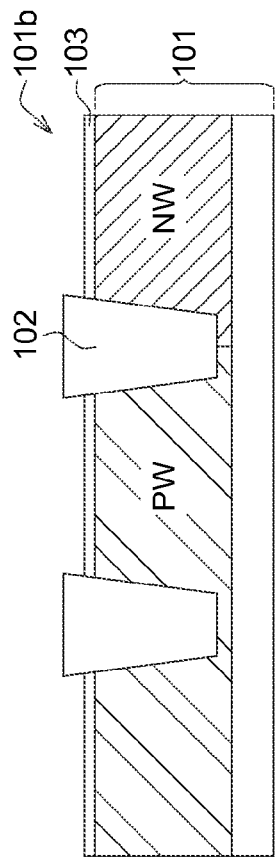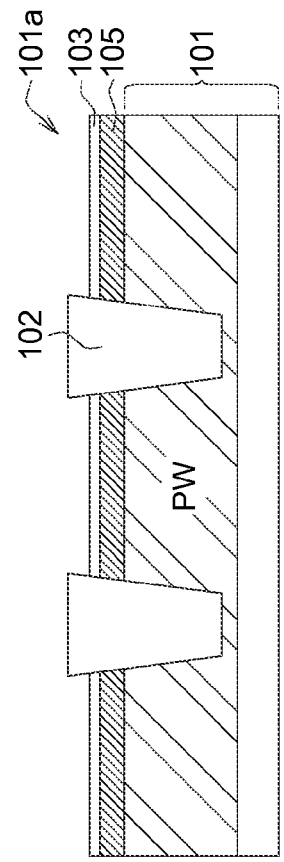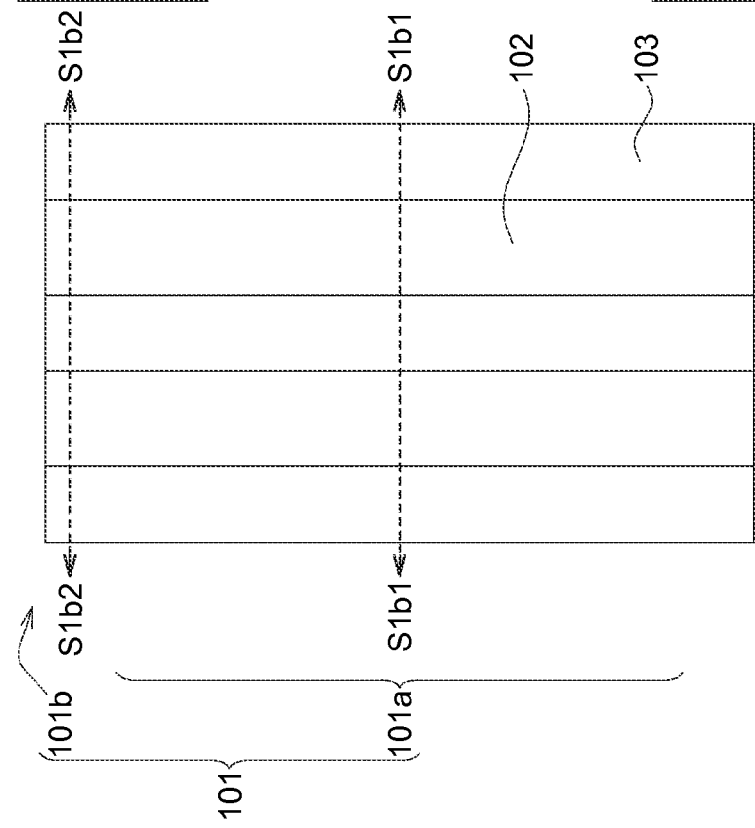

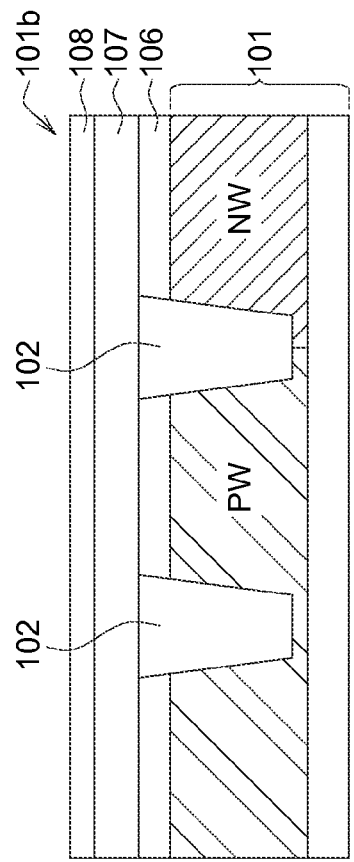
FIG. 1C3
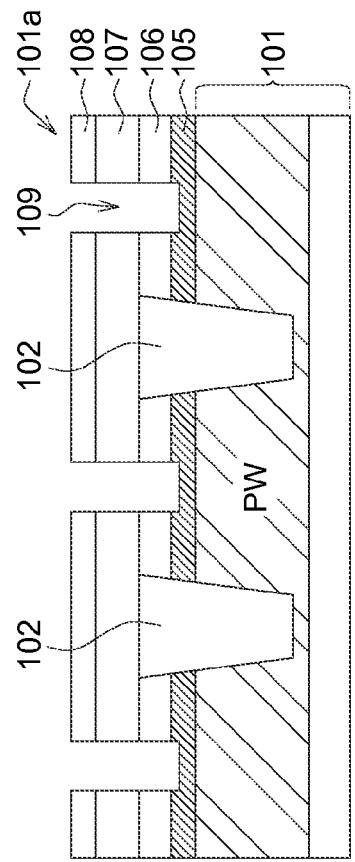
FIG. 1C2
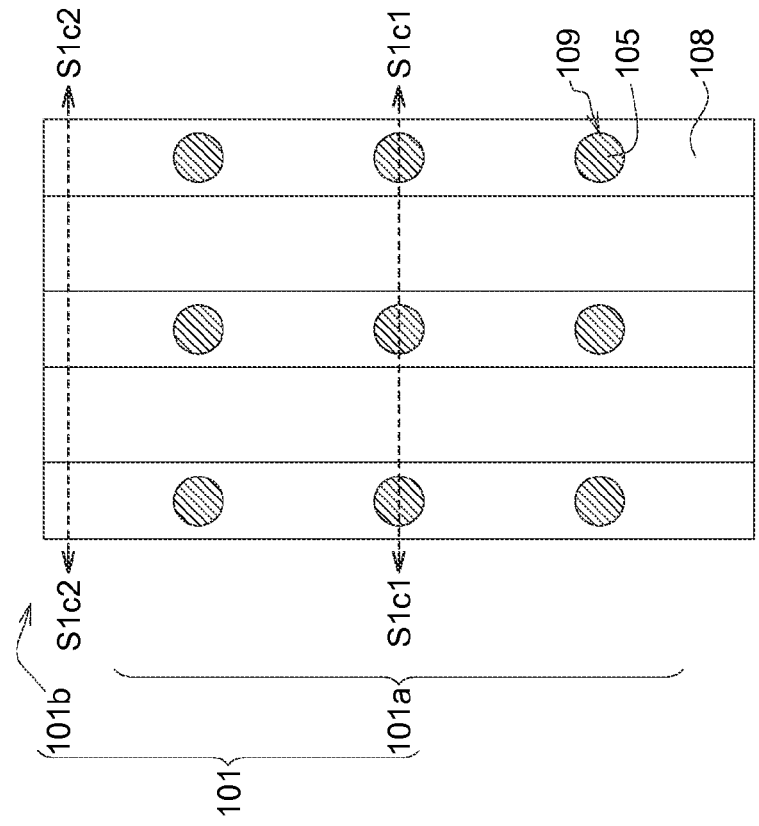
FIG. 1C1

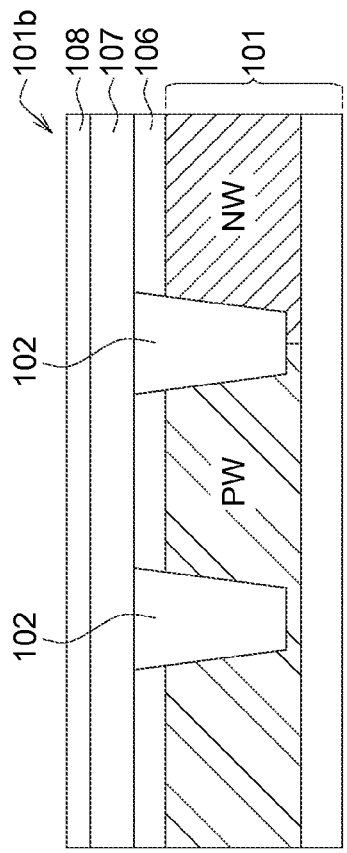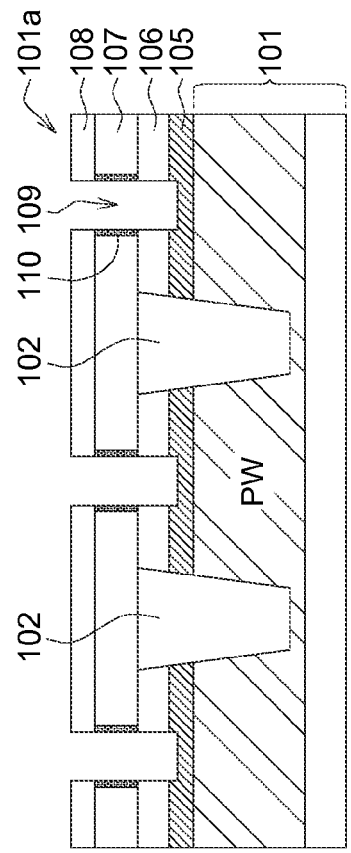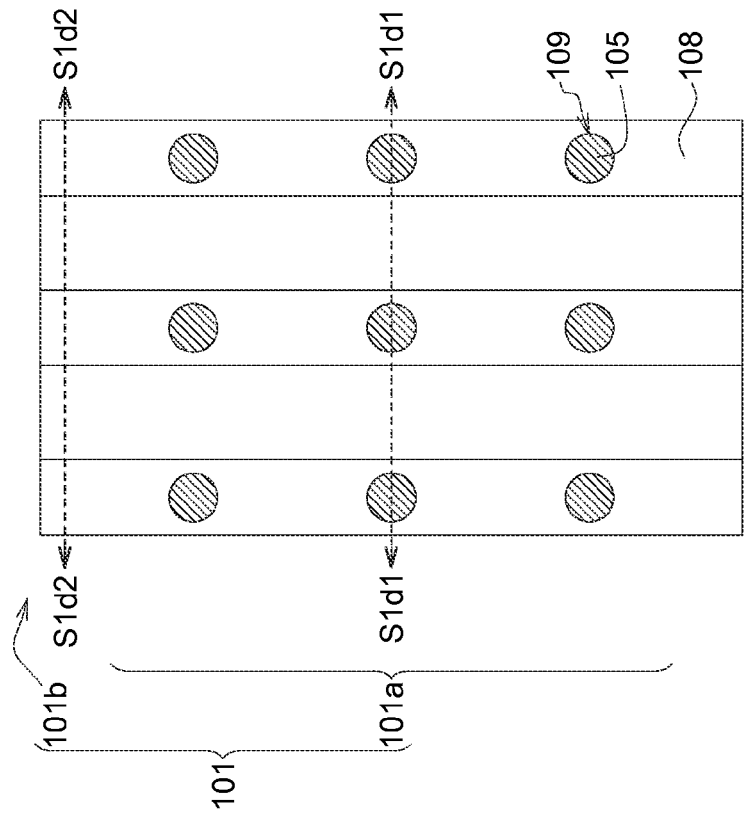

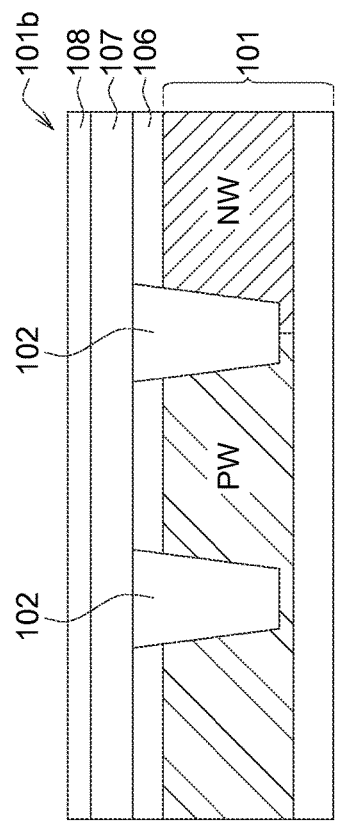
FIG. 1E3
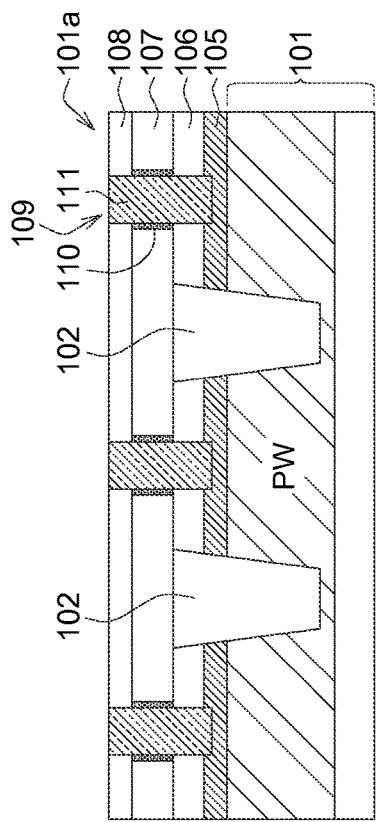
FIG. 1E2
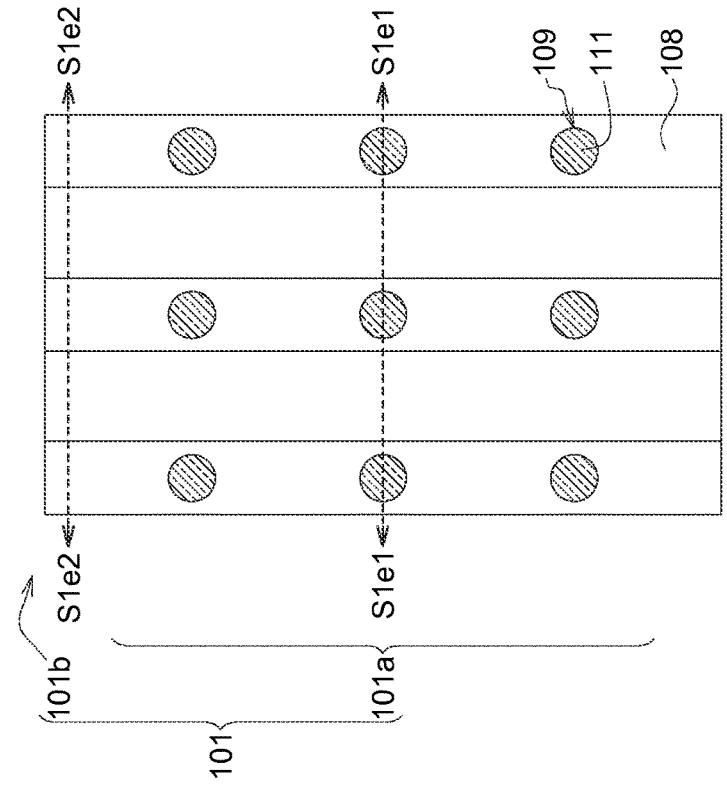
FIG. 1E1

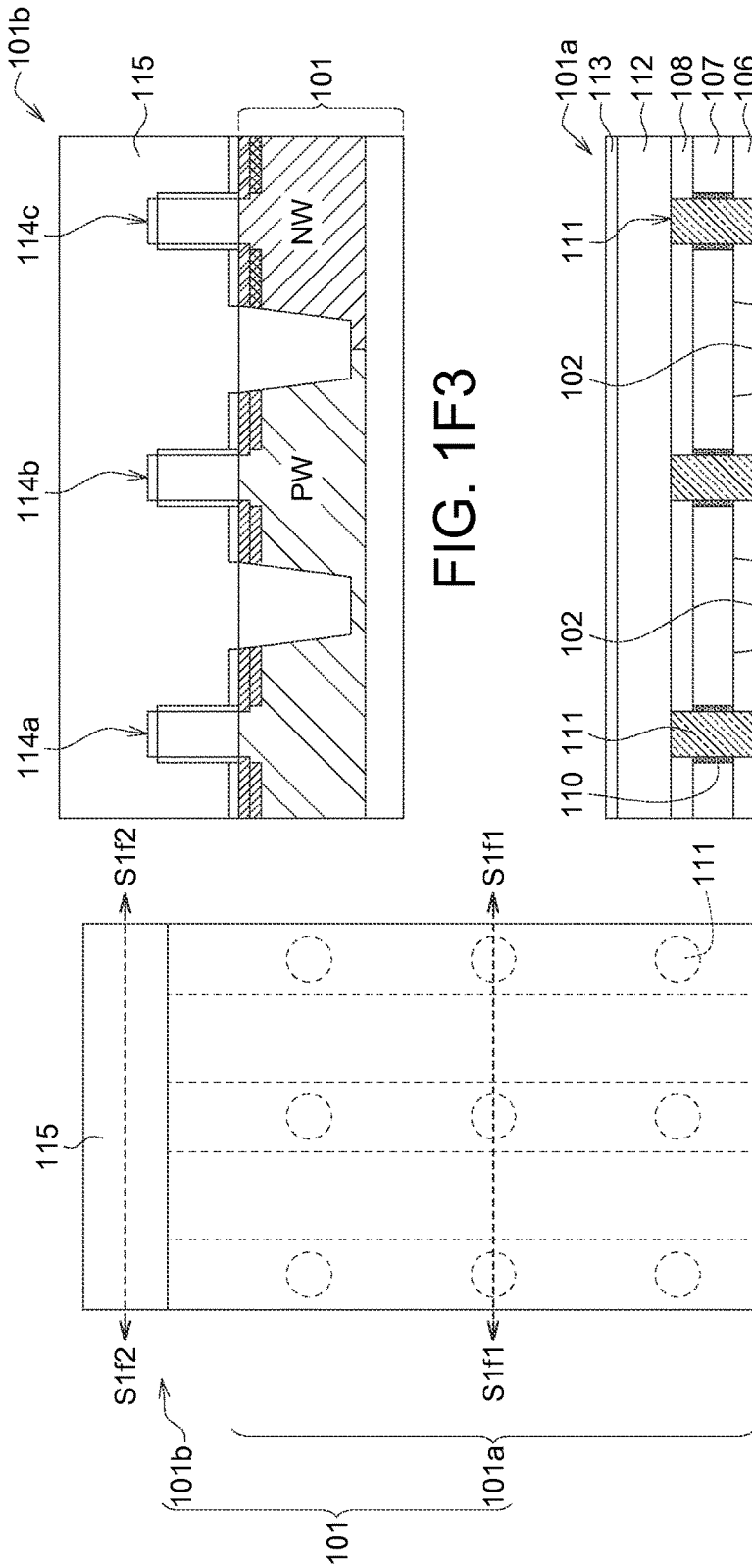

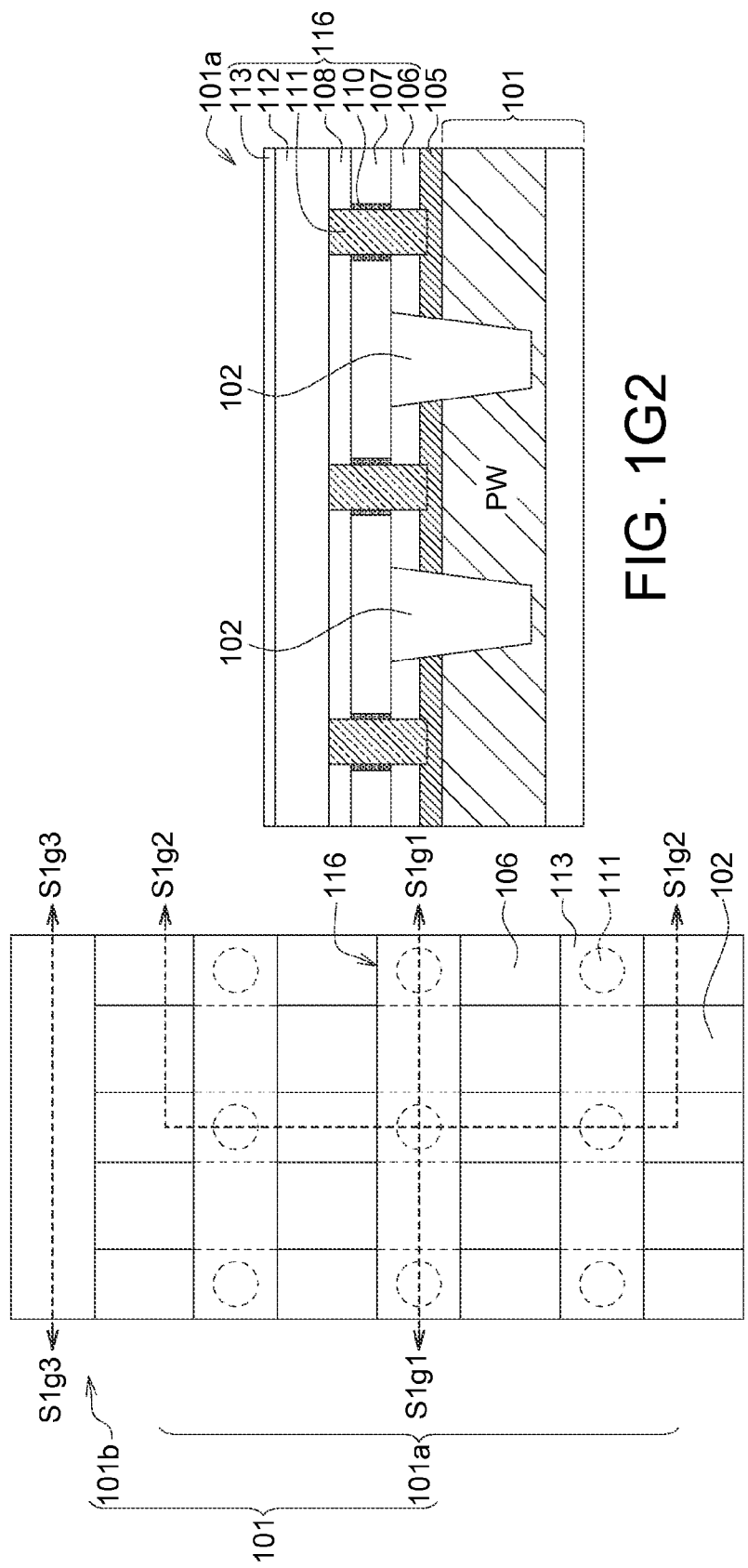

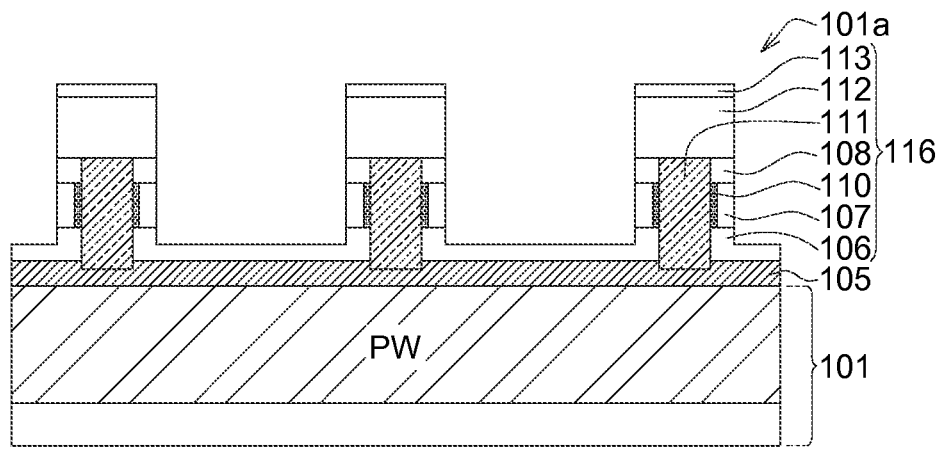
FIG. 1G3
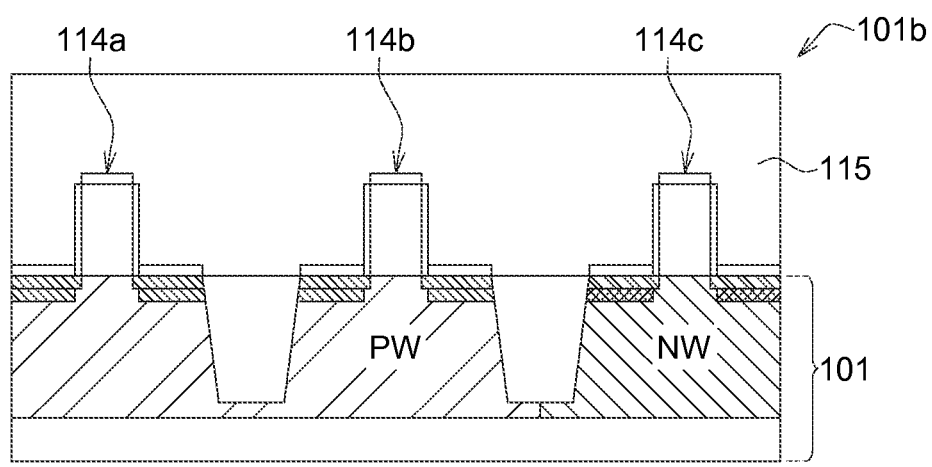
FIG. 1G4

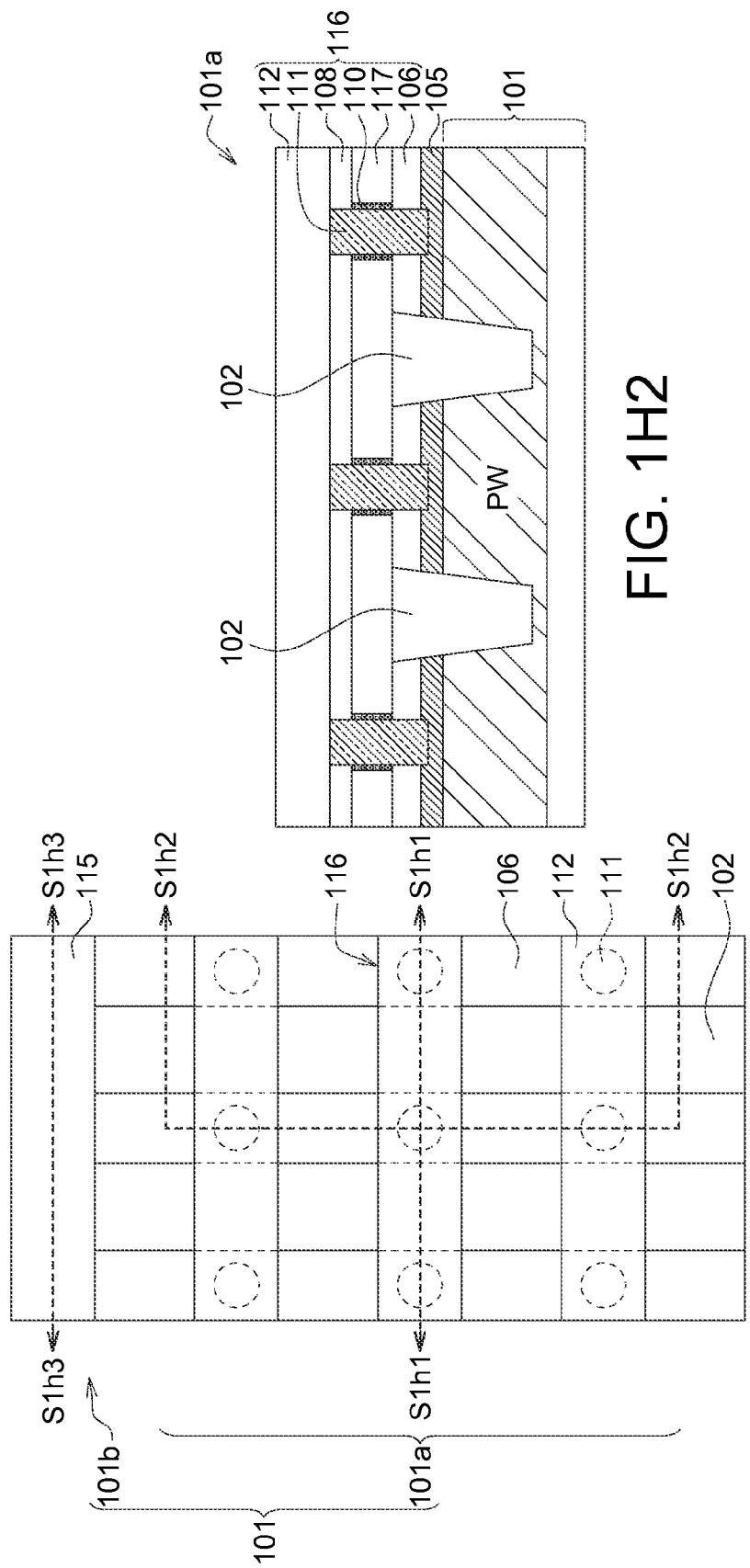

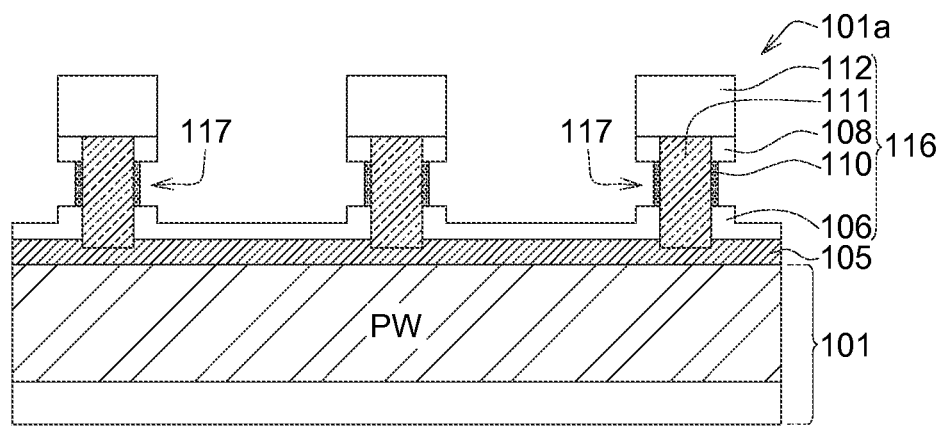
FIG. 1H3
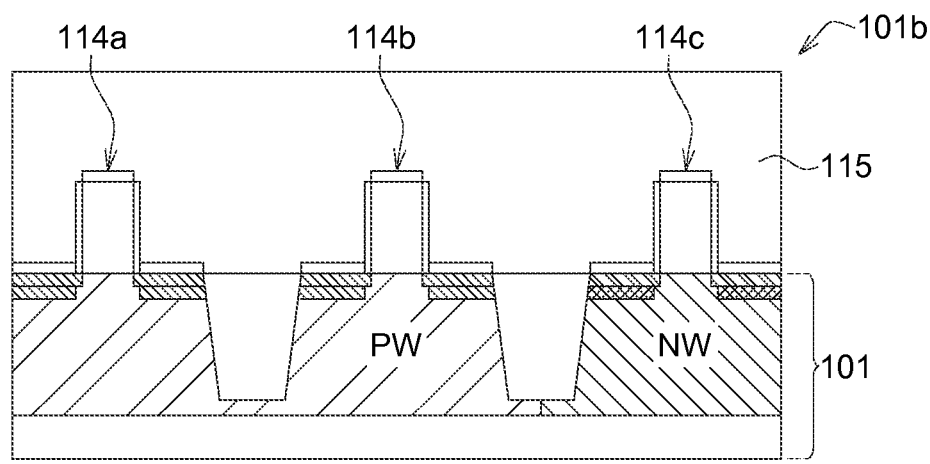
FIG. 1H4

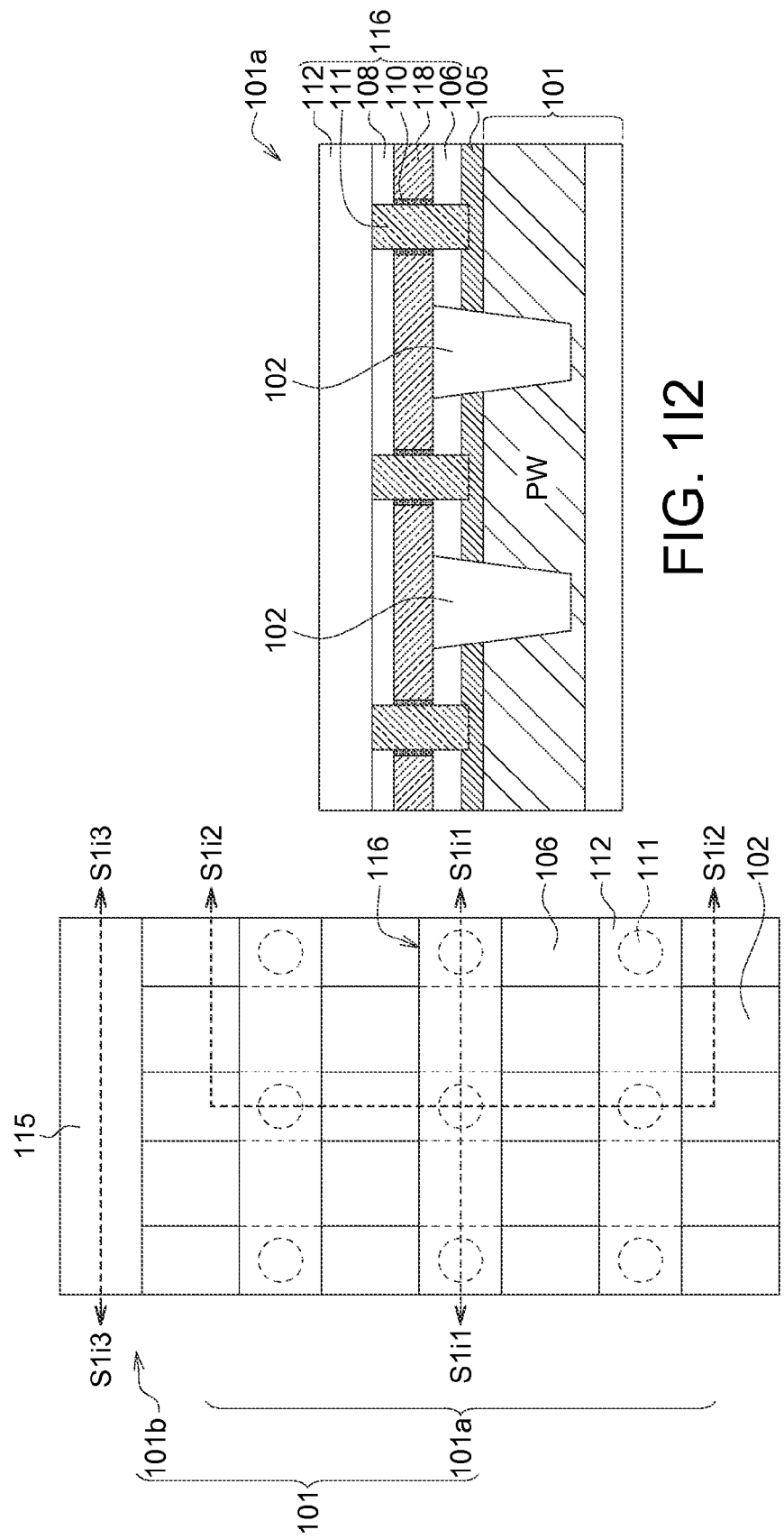

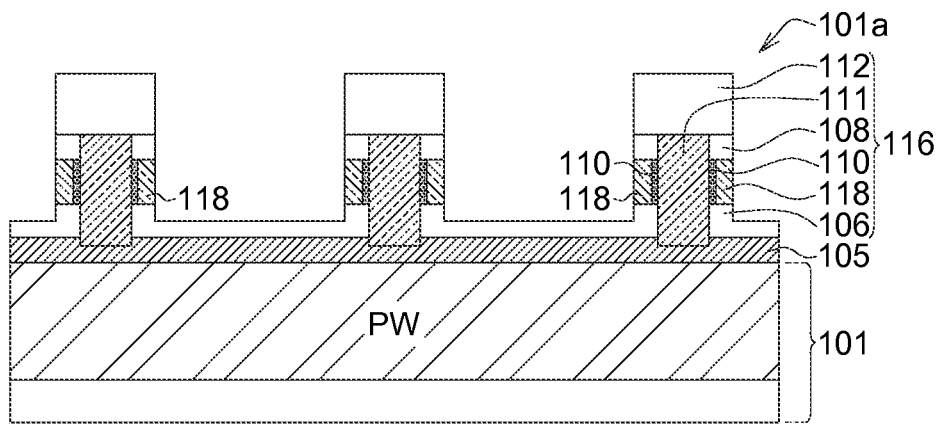
FIG. 1I3
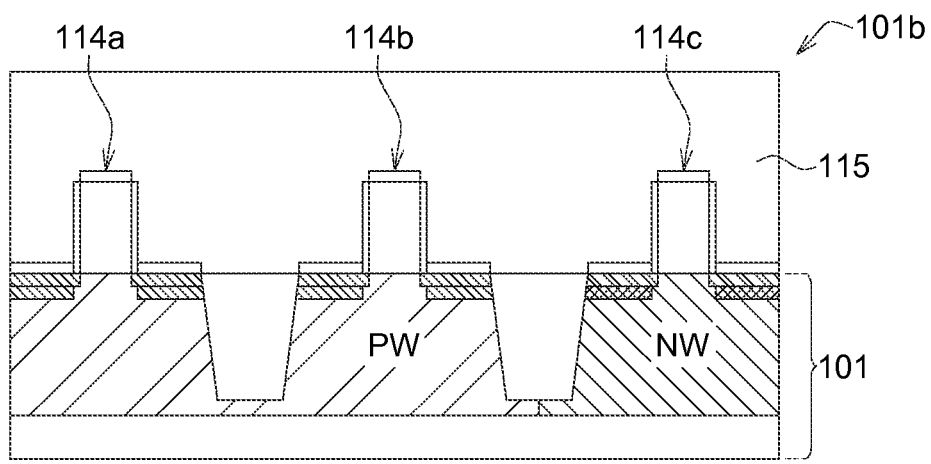
FIG. 1I4

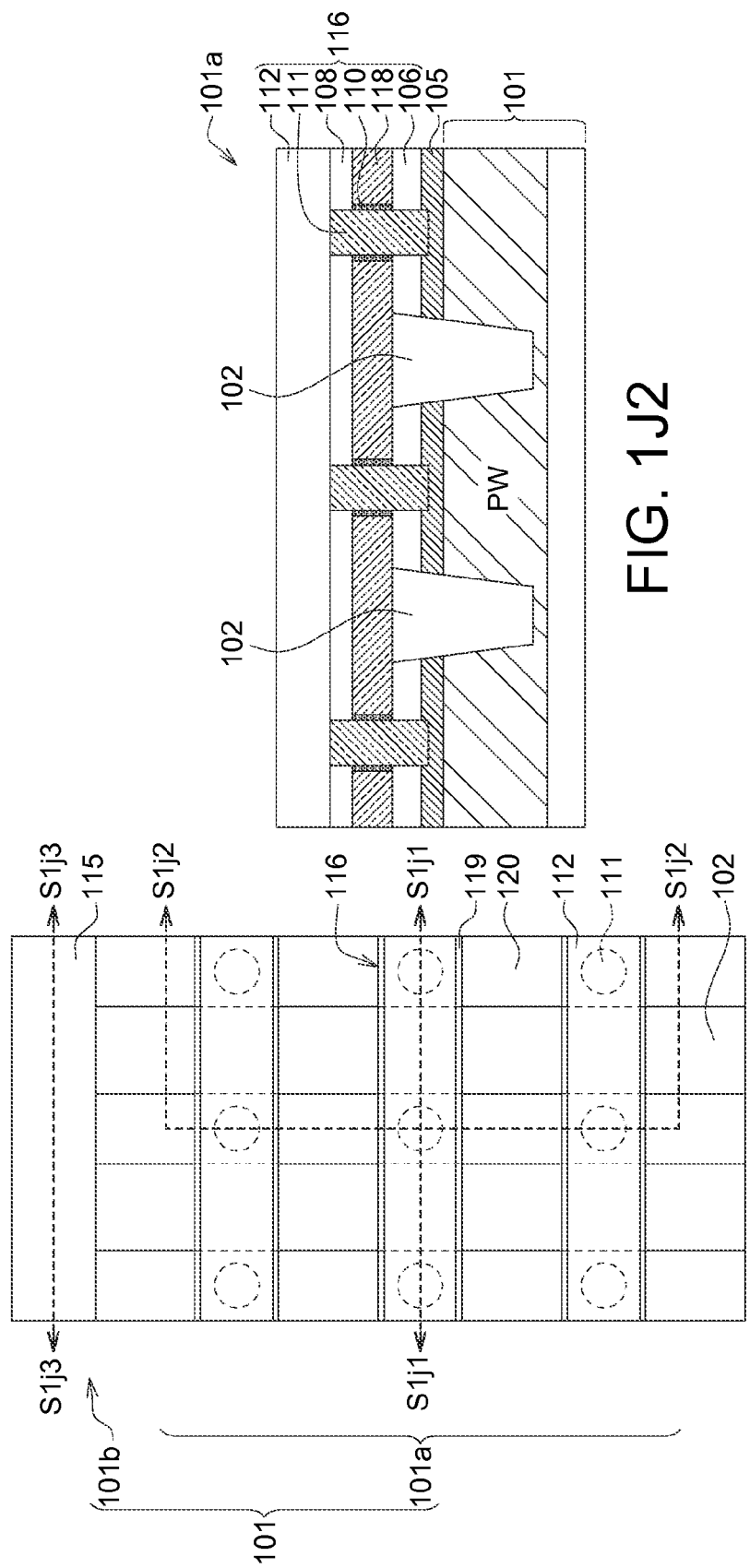
FIG. 1J1
FIG. 1J2

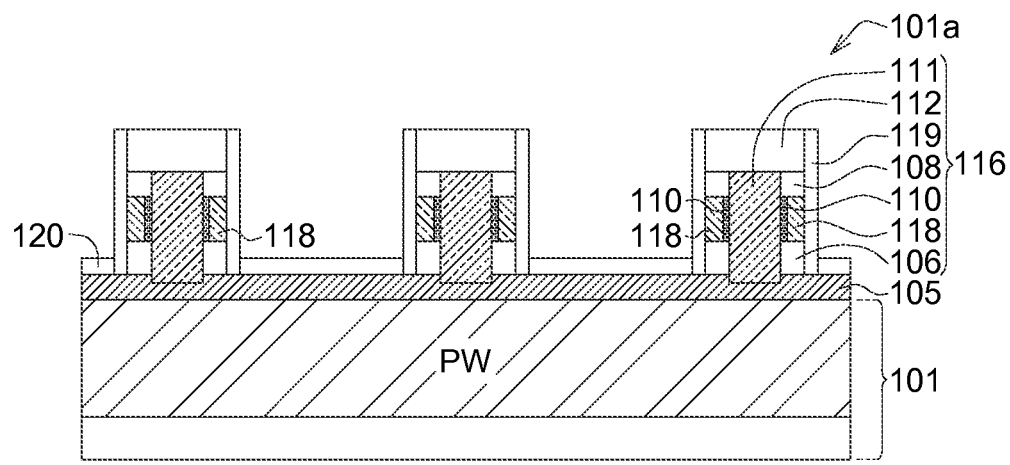
FIG. 1J3
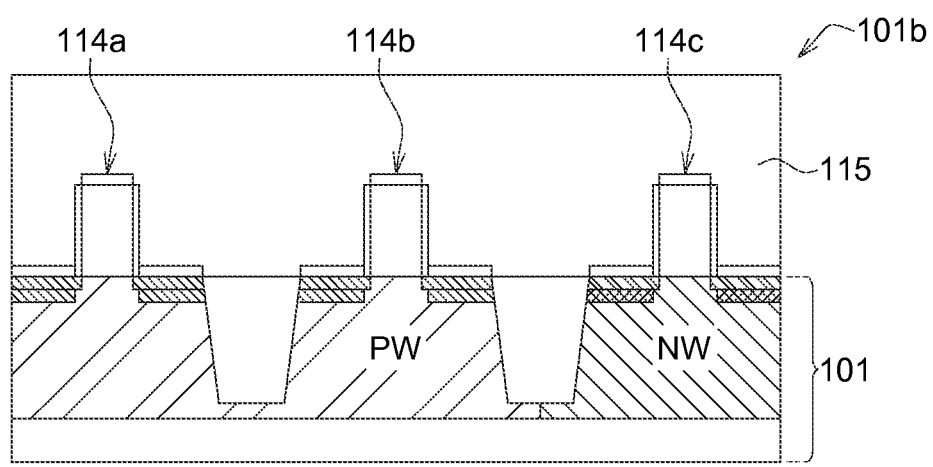
FIG. 1J4

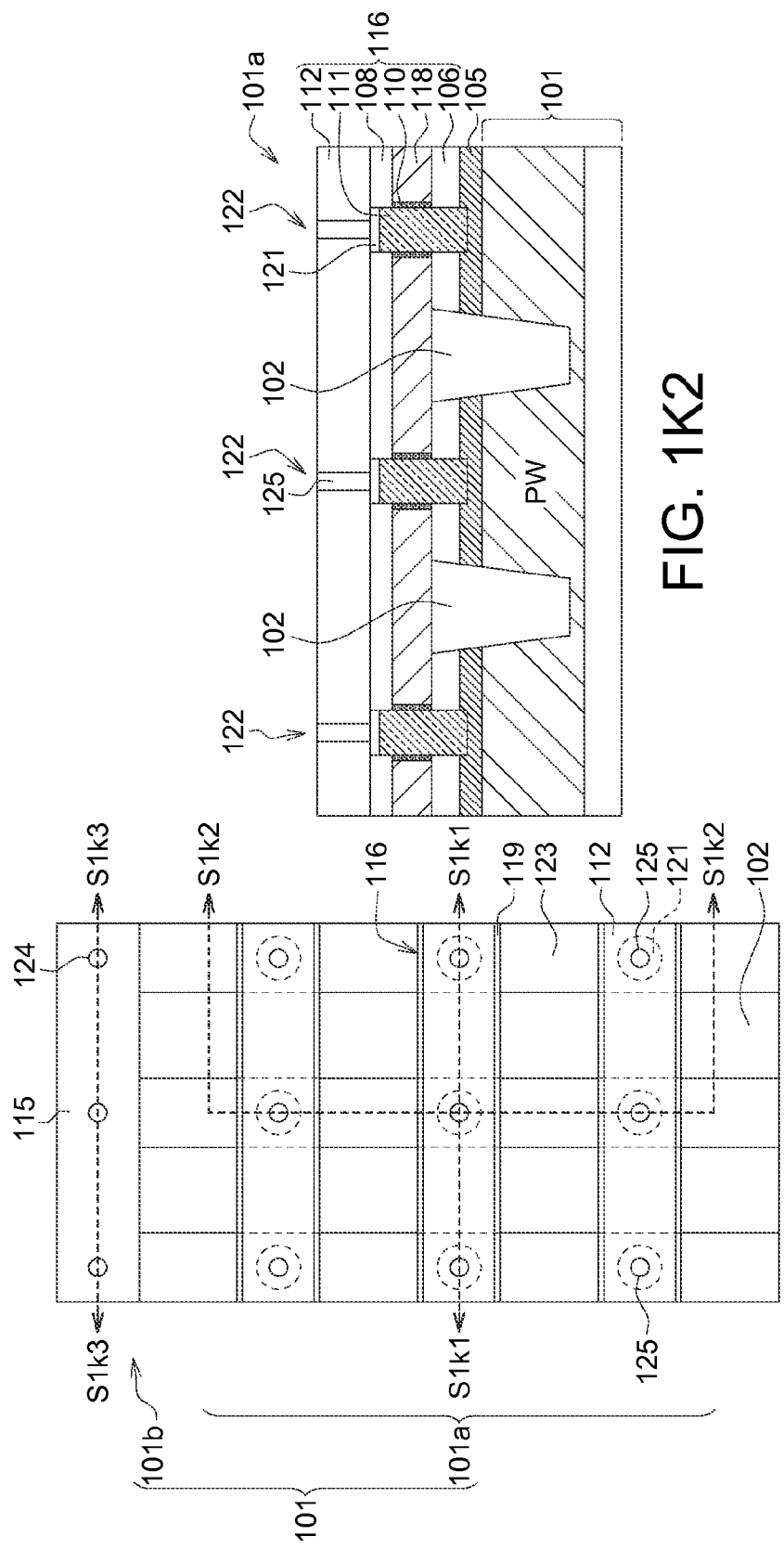
FIG. 1K1
FIG. 1K2

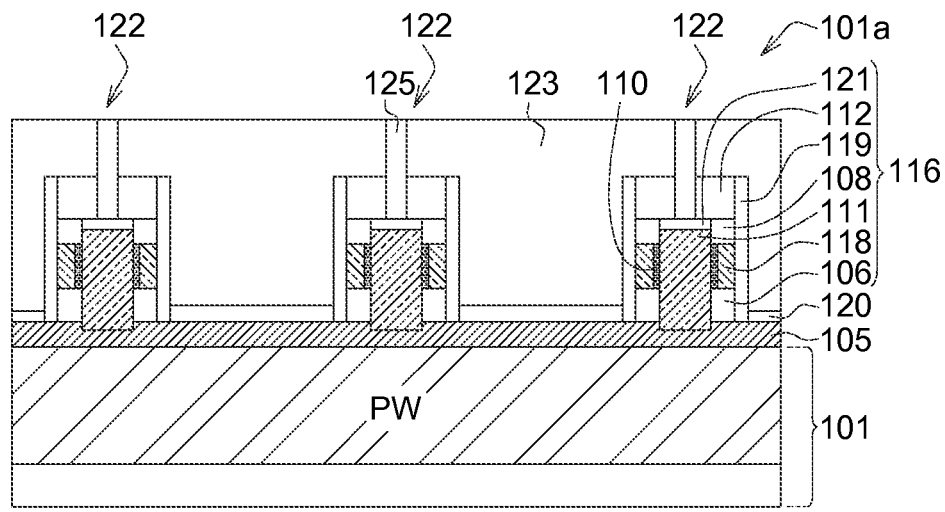
FIG. 1K3
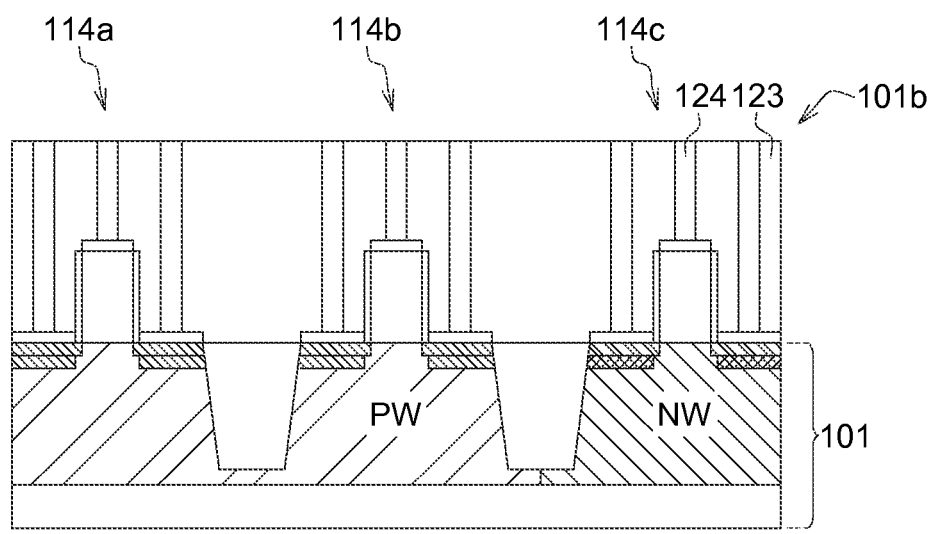
FIG. 1K4

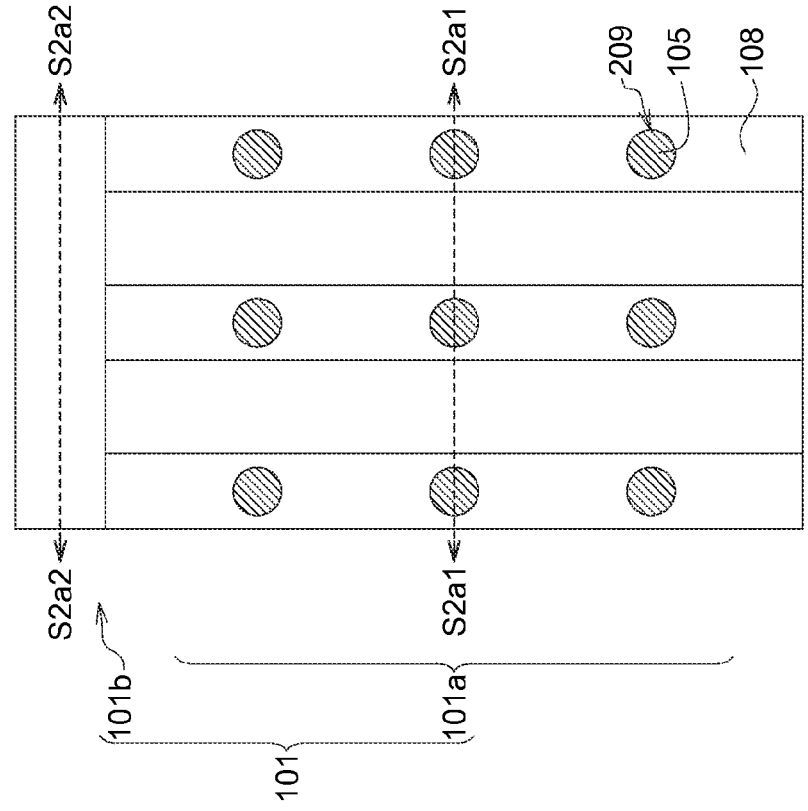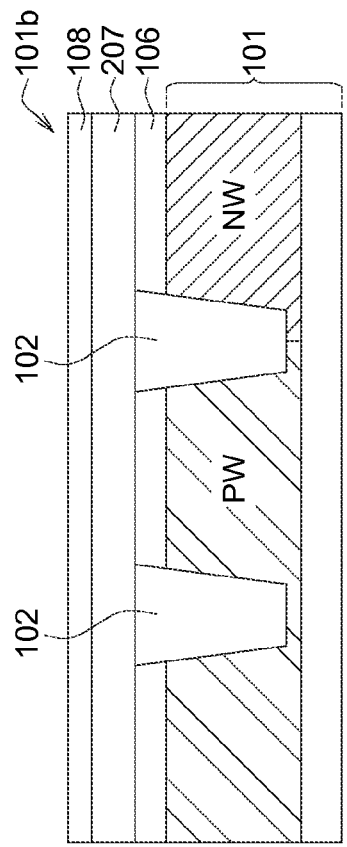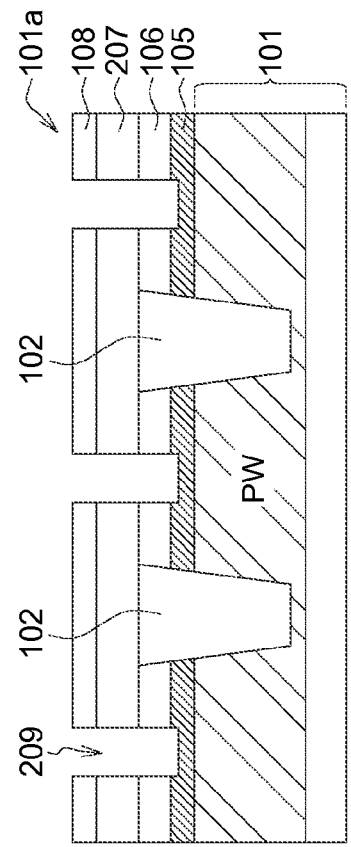
FIG. 2A1
FIG. 2A2
FIG. 2A3

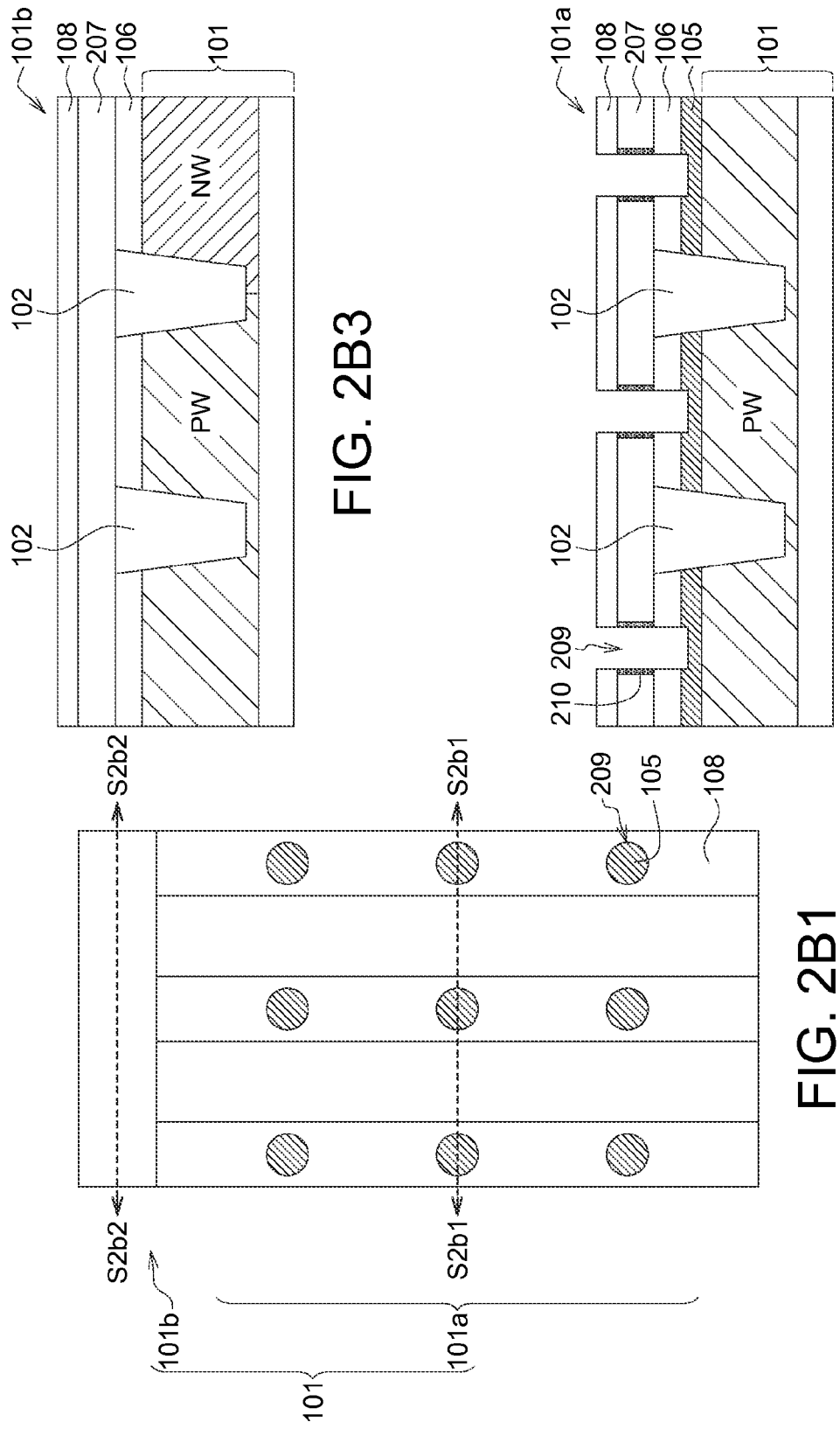

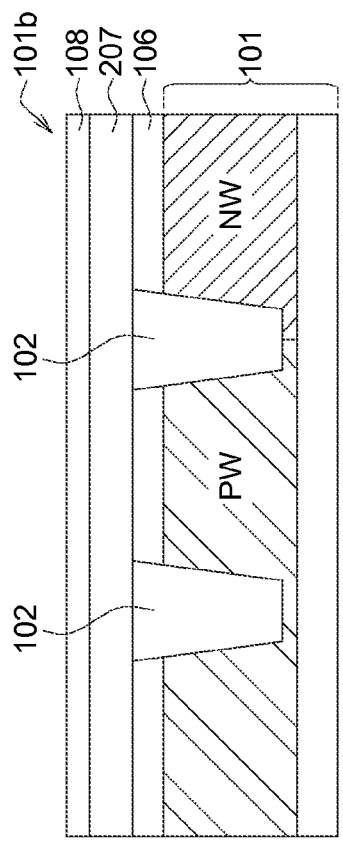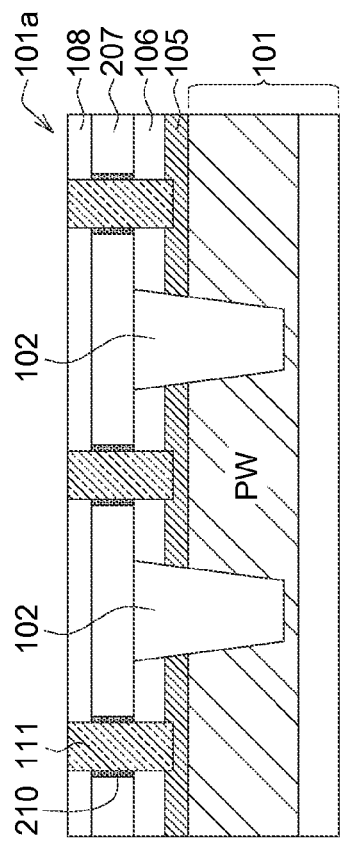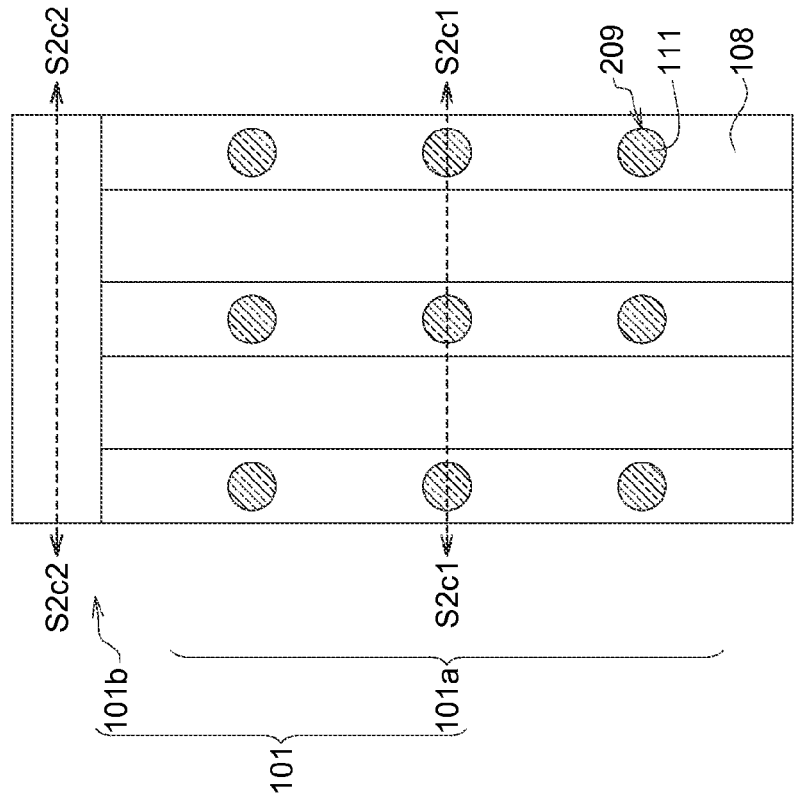

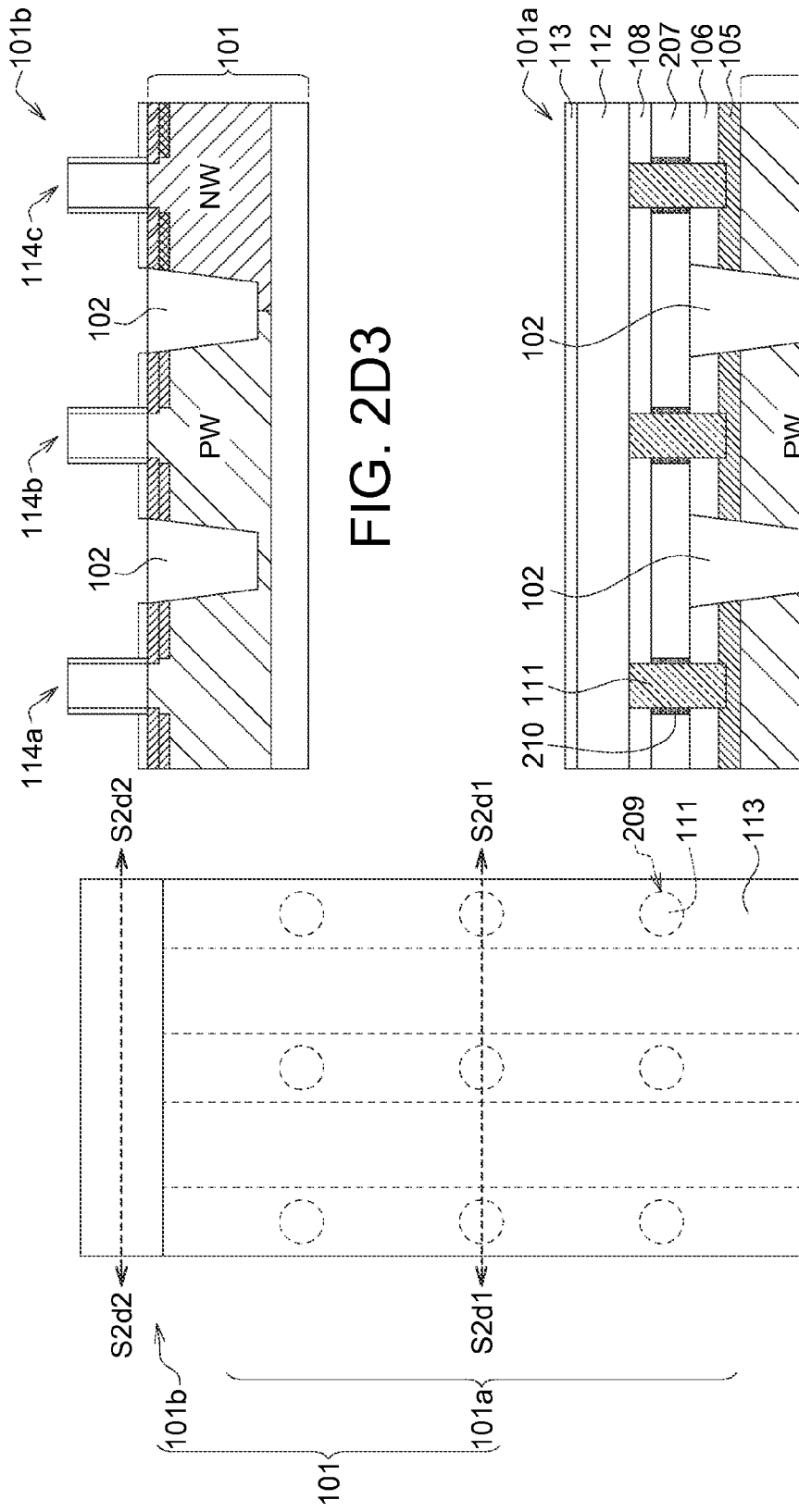

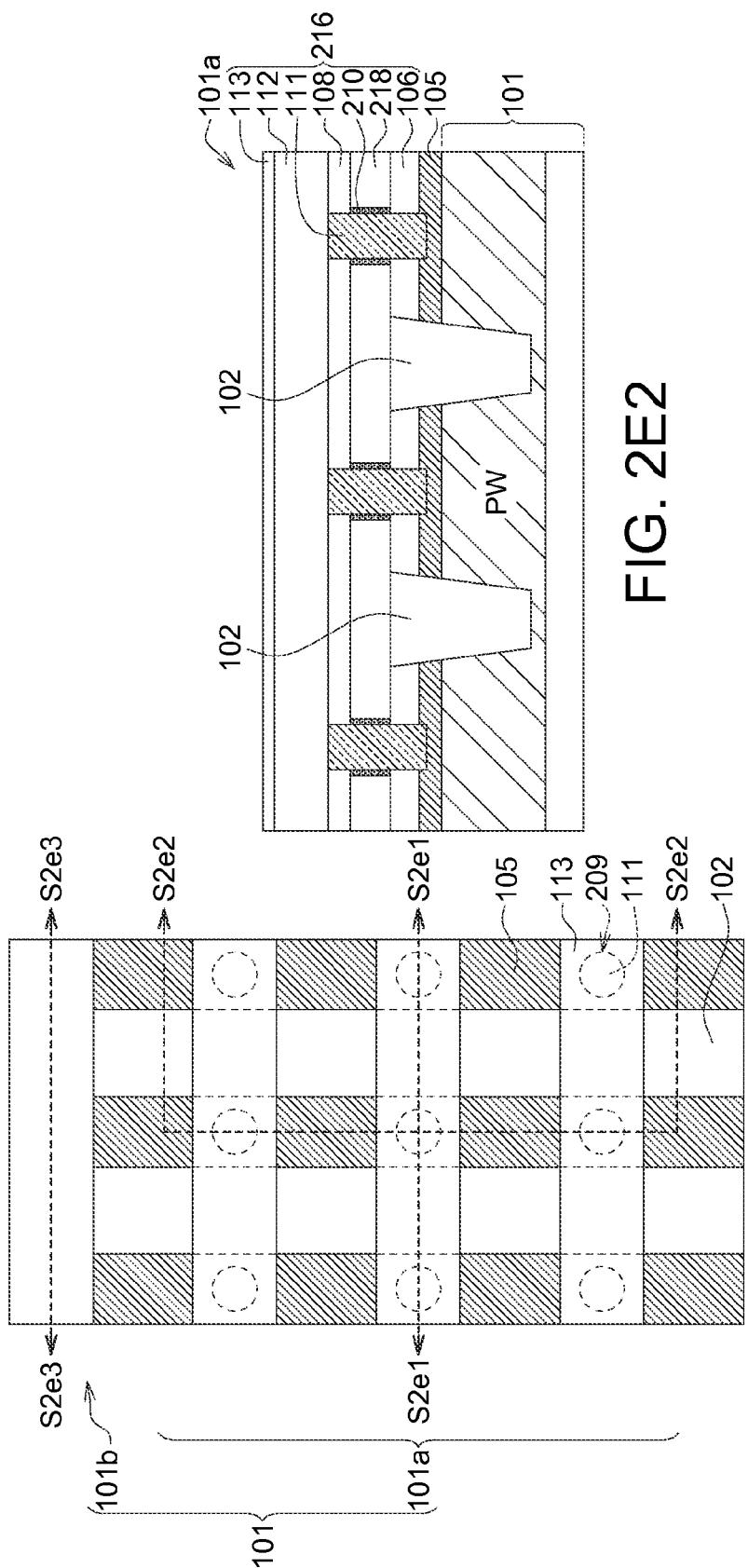

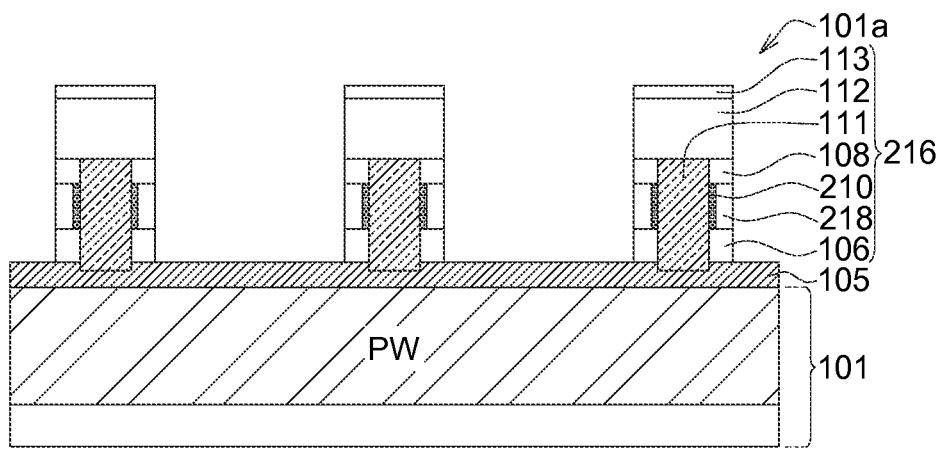
FIG. 2E3
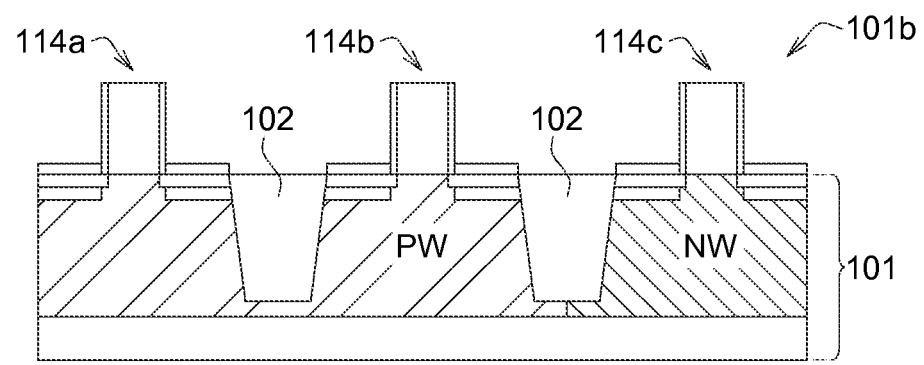
FIG. 2E4

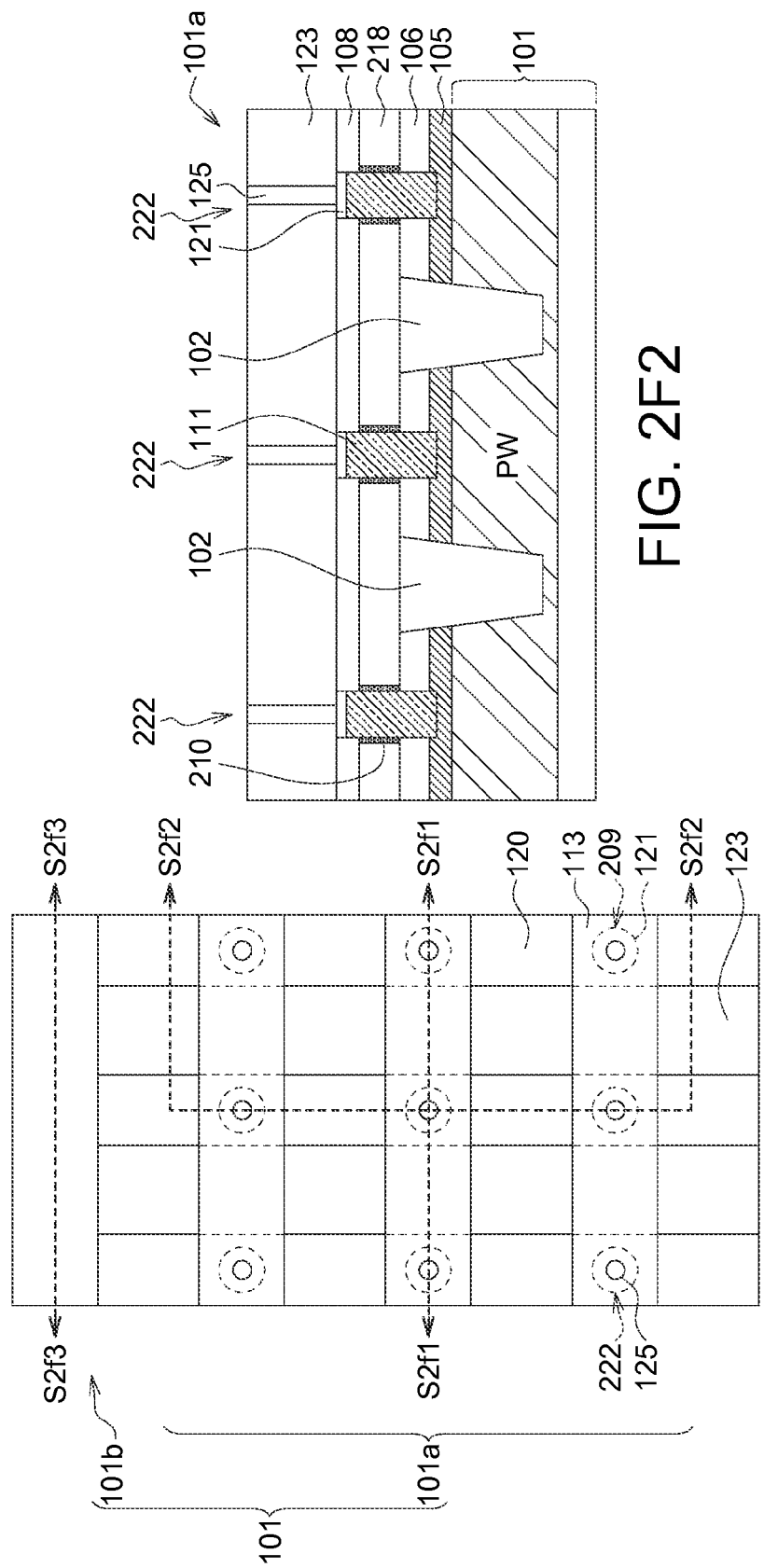

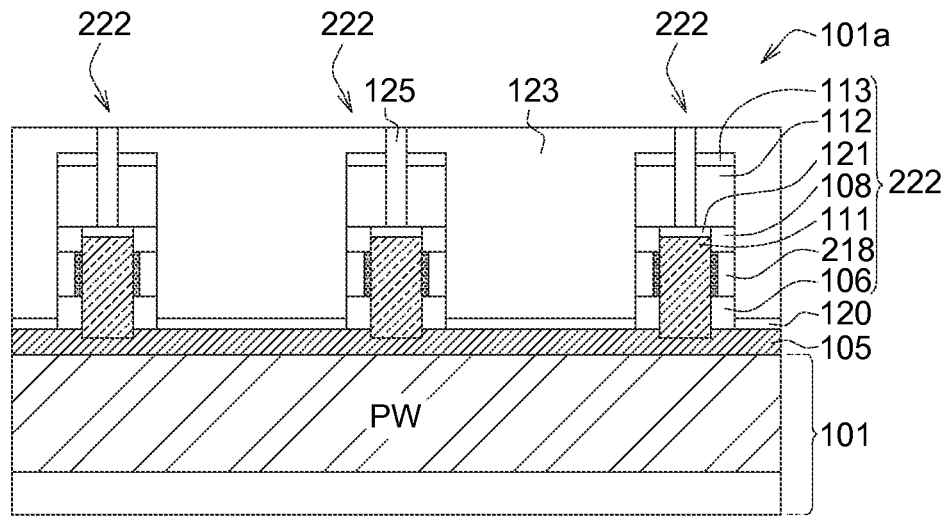
FIG. 2F3
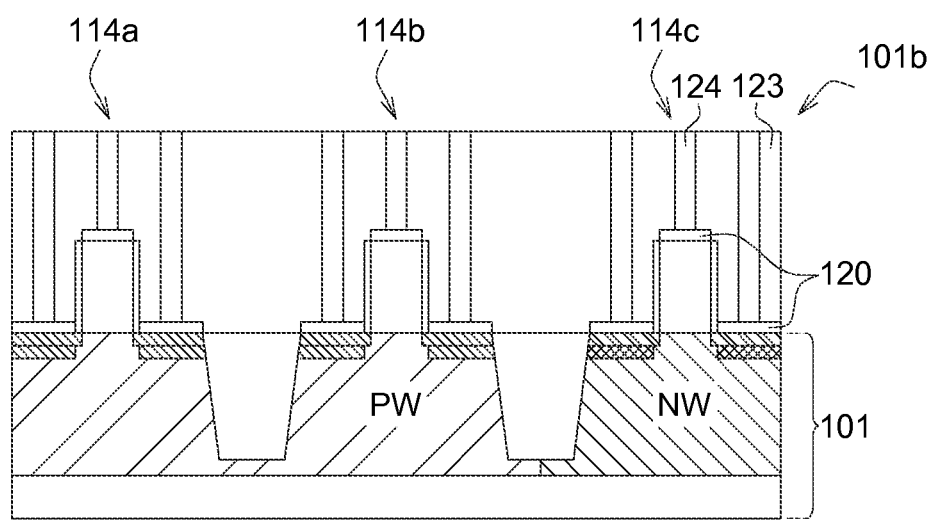
FIG. 2F4

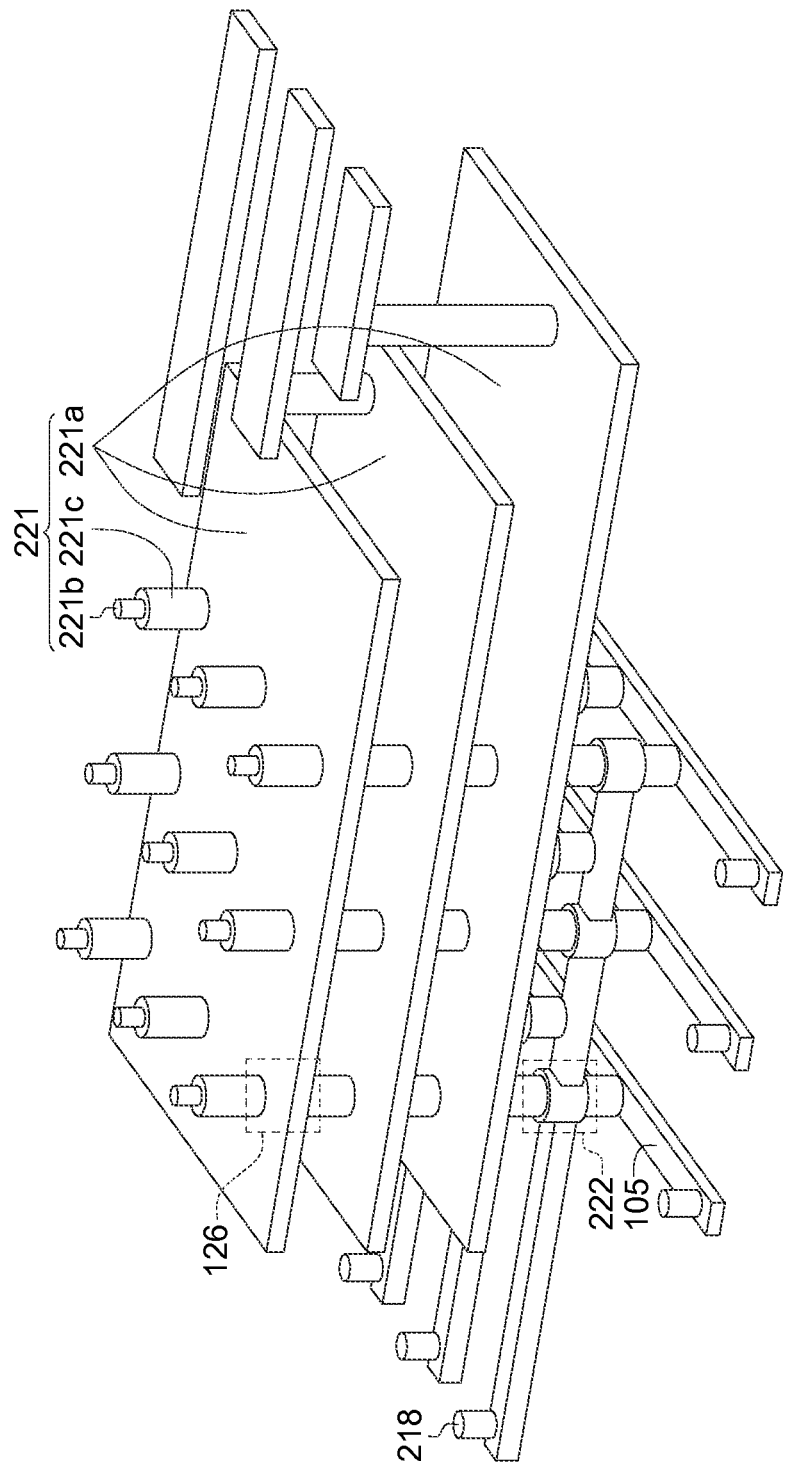

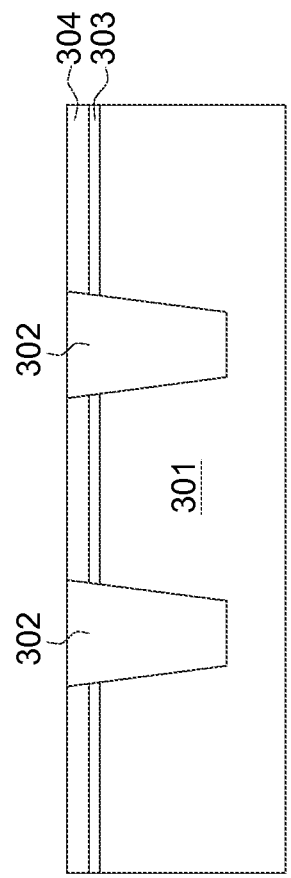
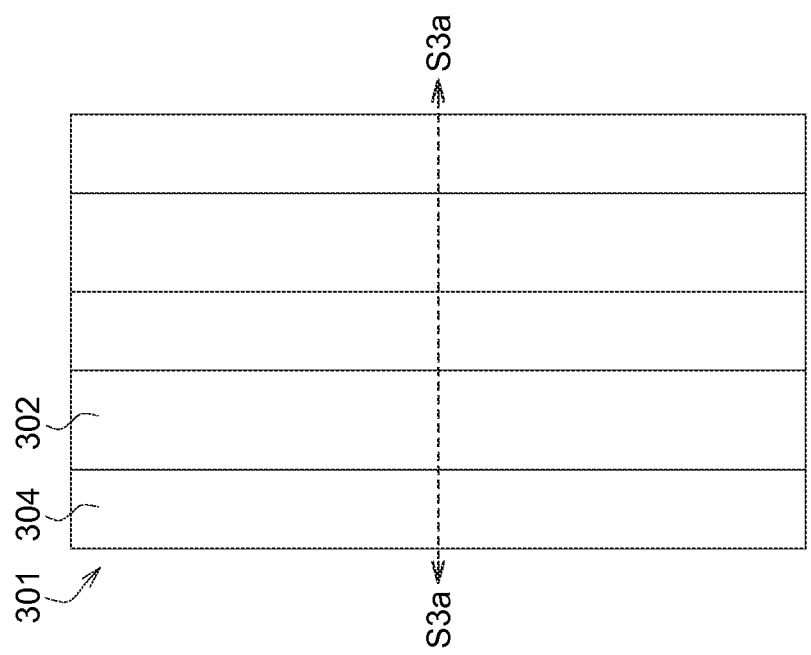
FIG. 3A2
FIG. 3A1

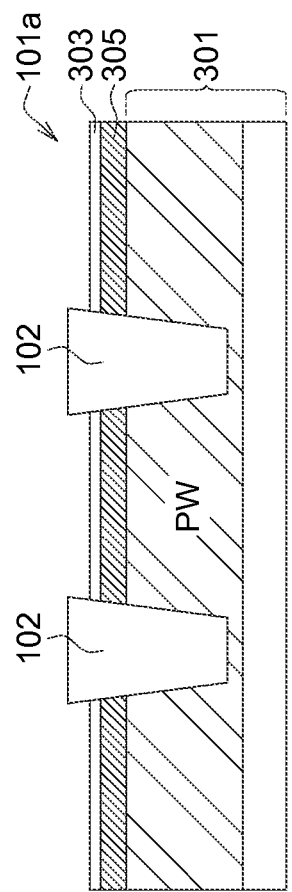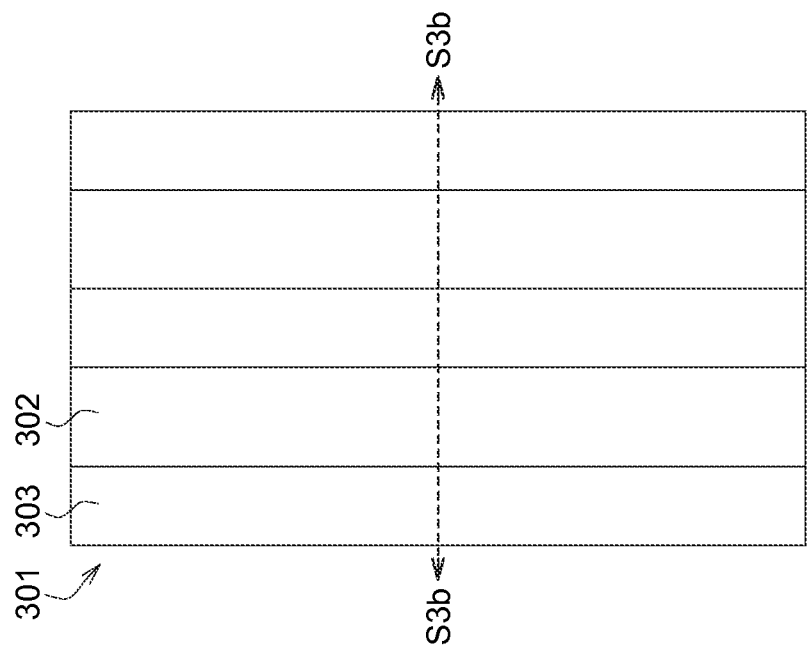

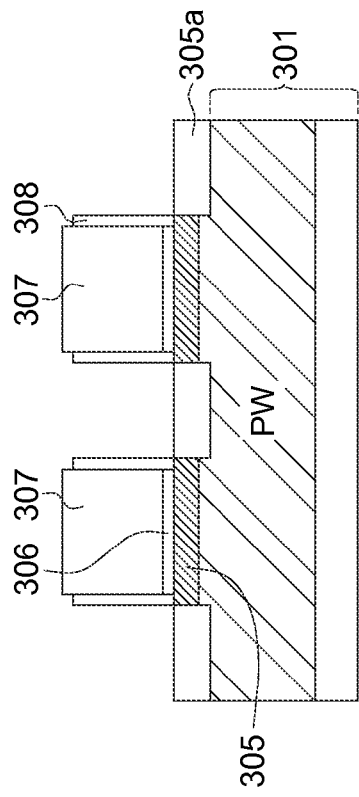
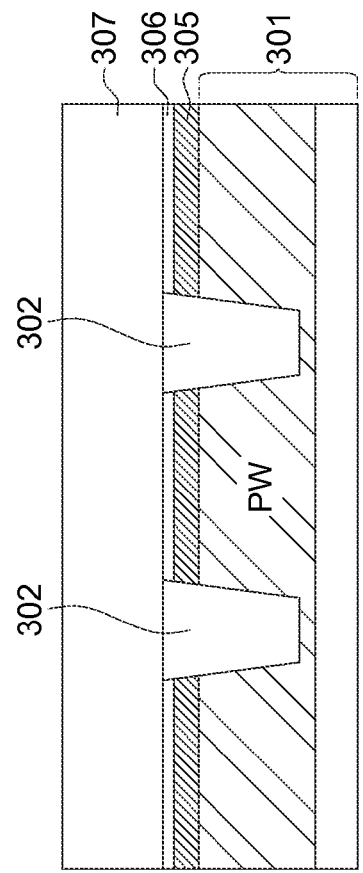
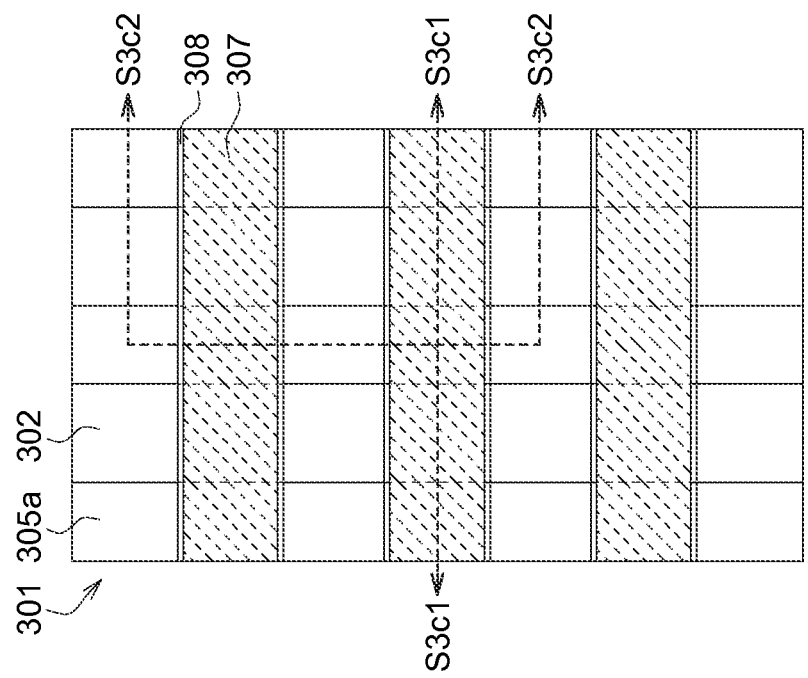
FIG. 3C3
FIG. 3C2
FIG. 3C1

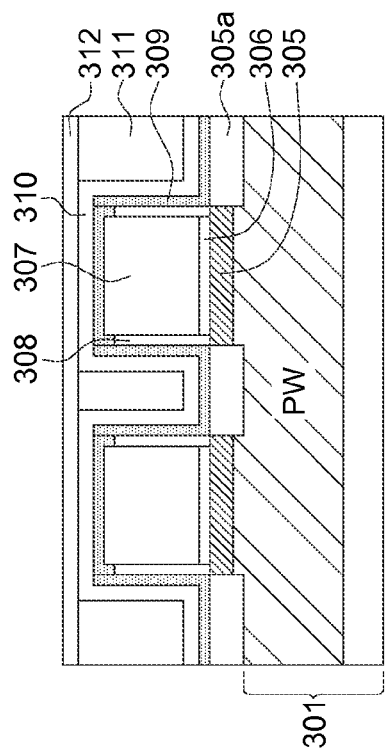
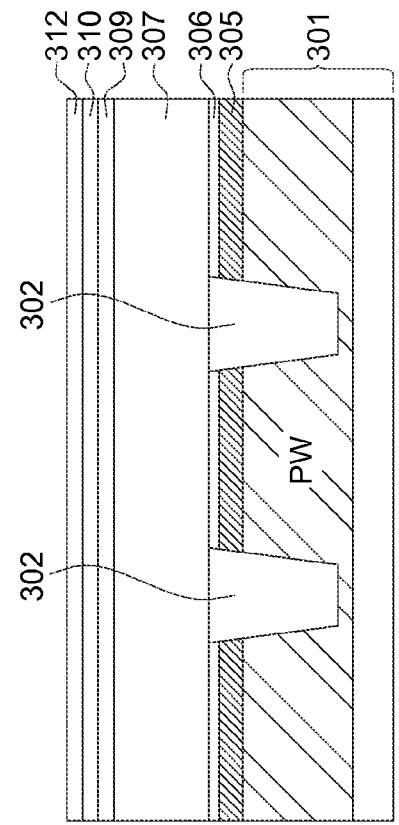
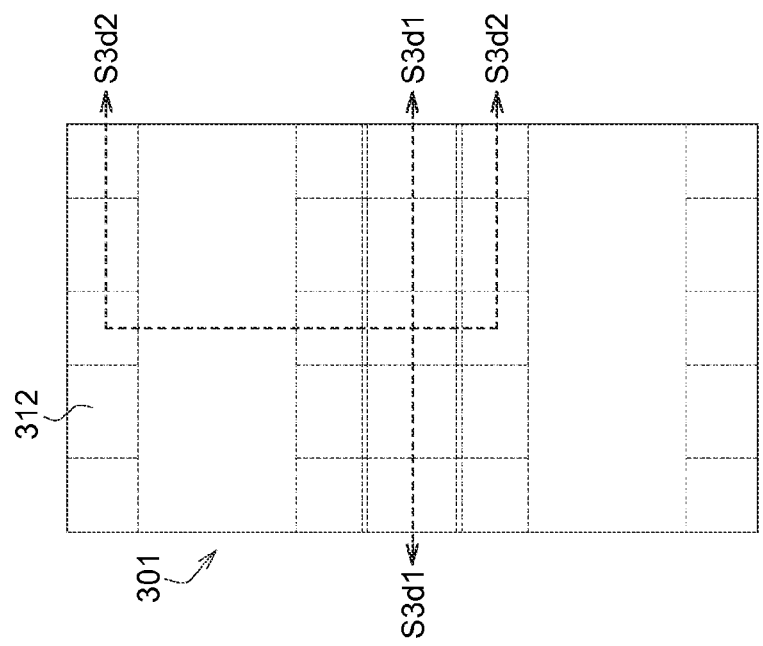
FIG. 3D3
FIG. 3D2
FIG. 3D1

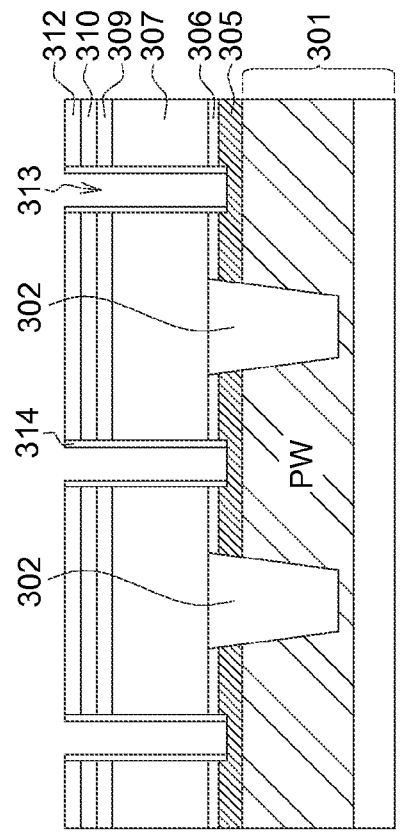
FIG. 3E2
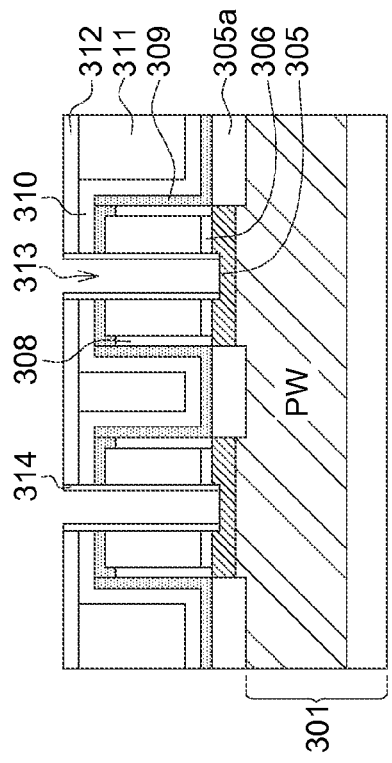
FIG. 3E3
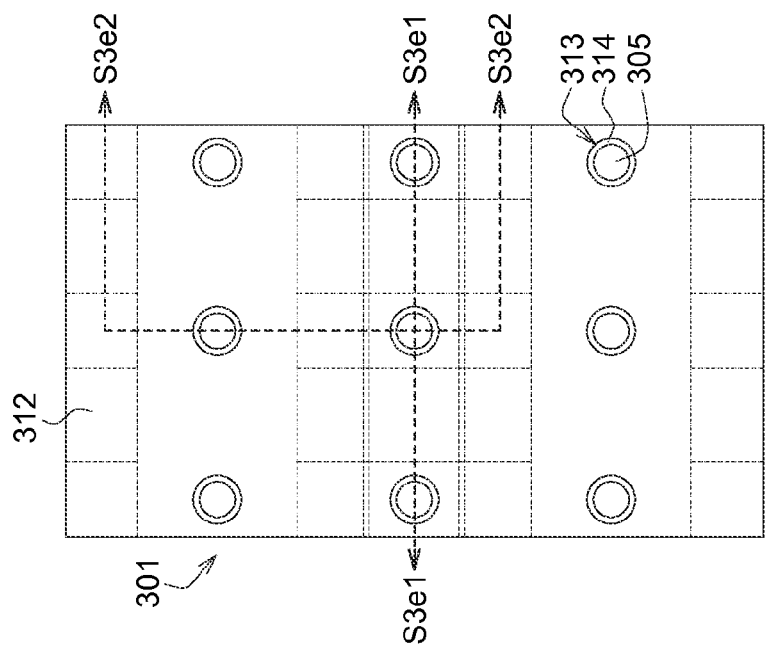
FIG. 3E1

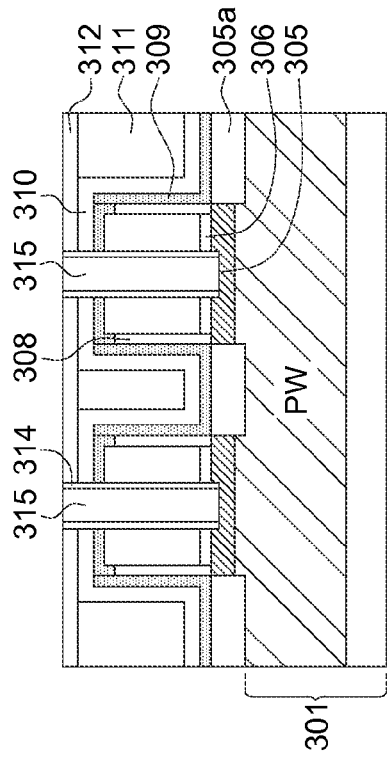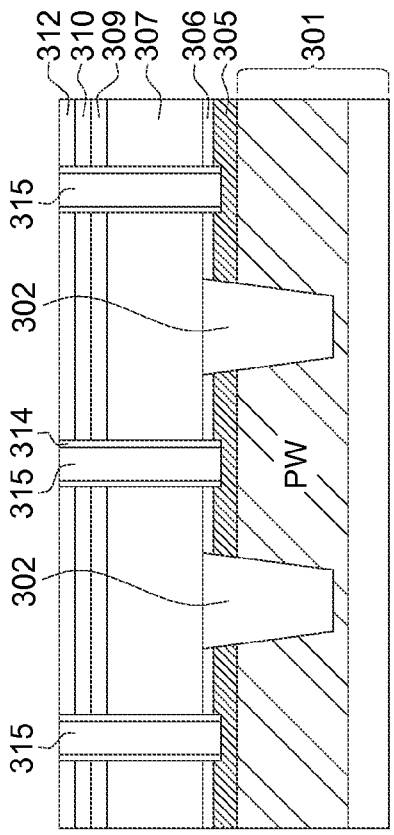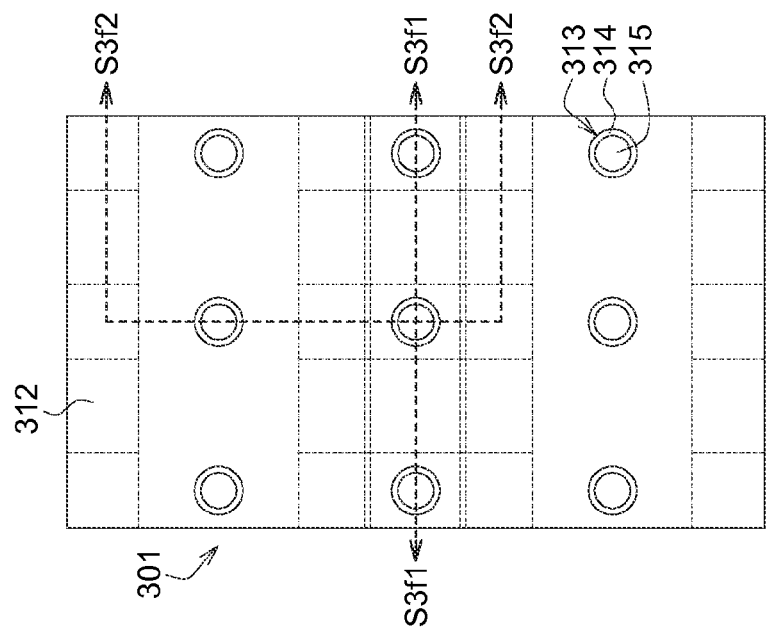

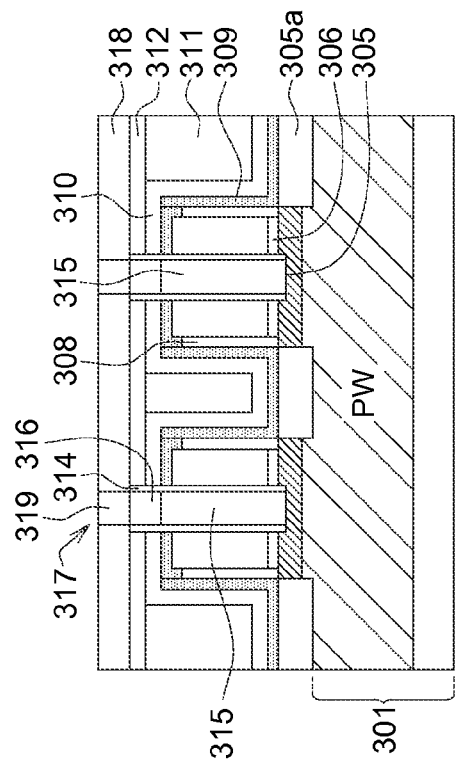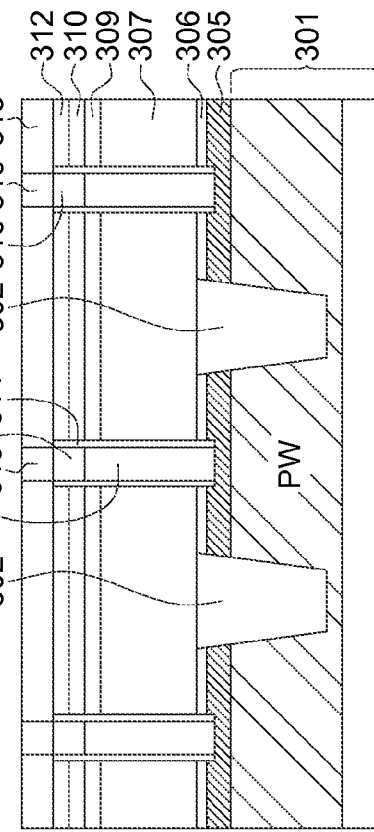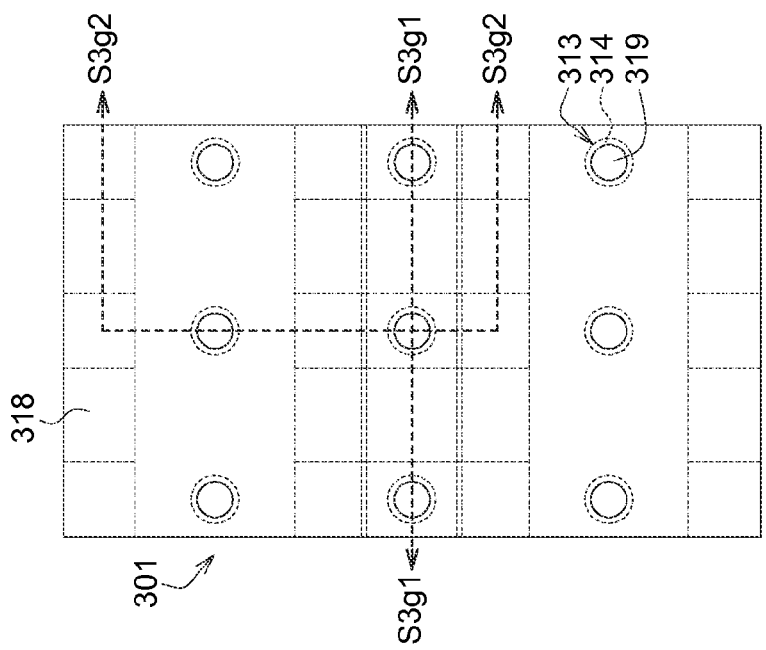

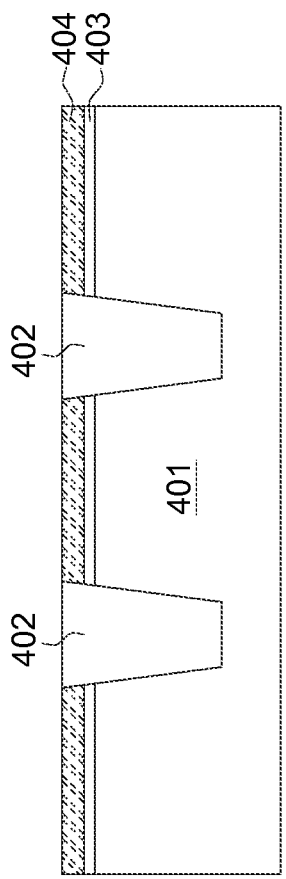
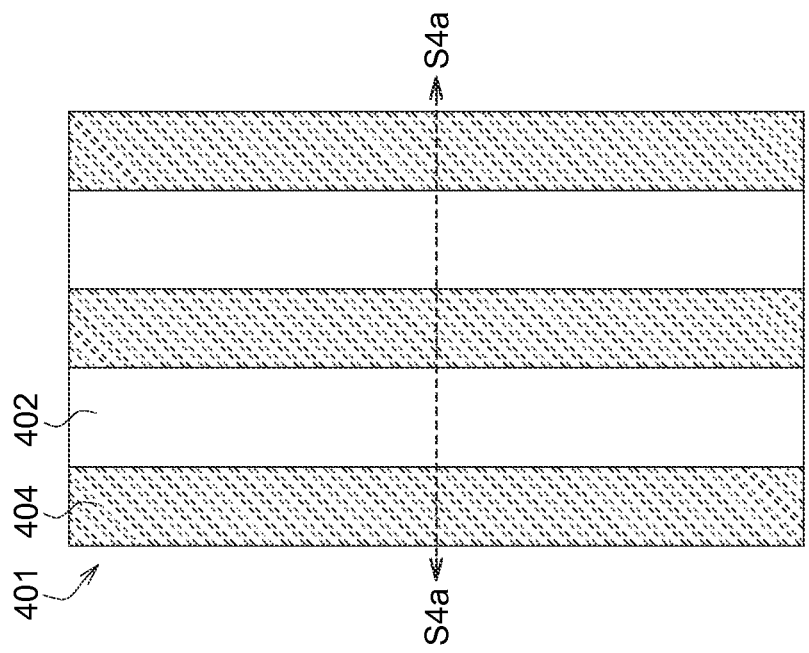

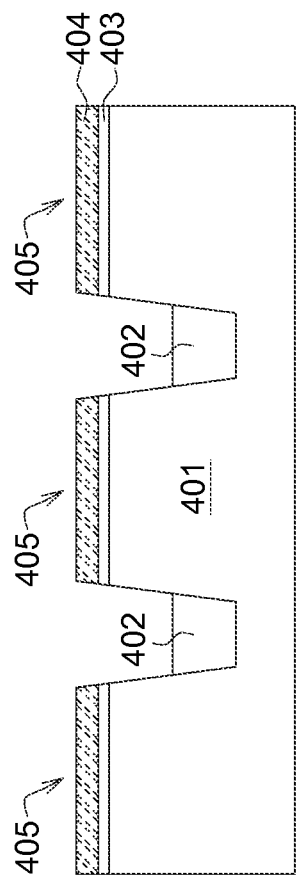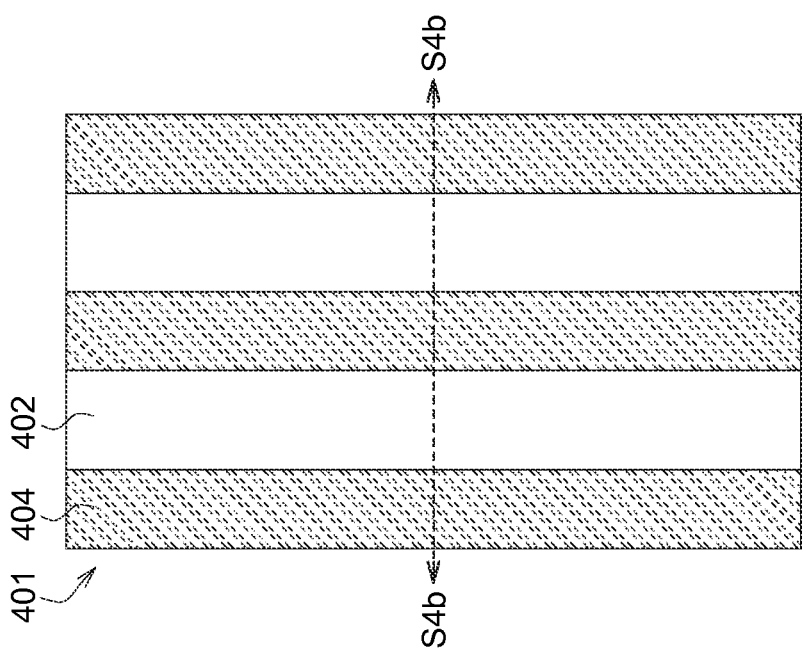
FIG. 4B2
FIG. 4B1

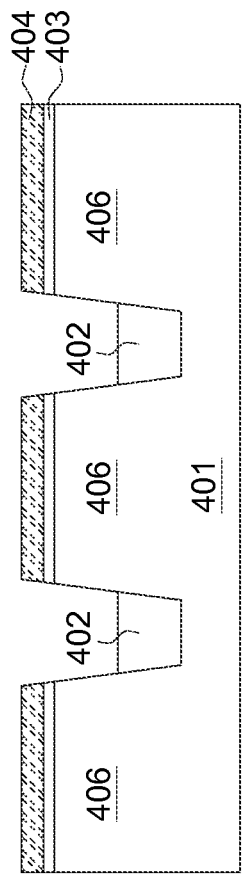
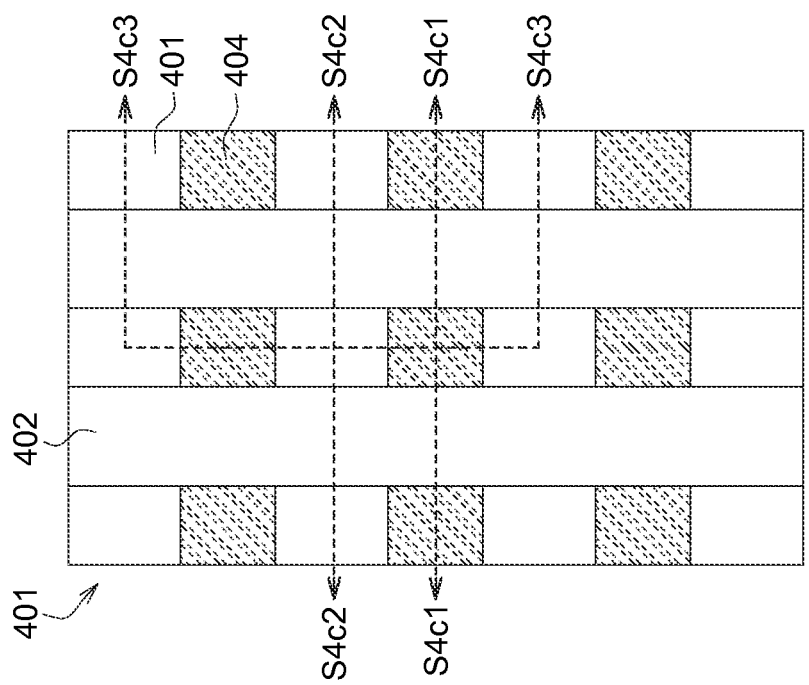
FIG. 4C2
FIG. 4C1

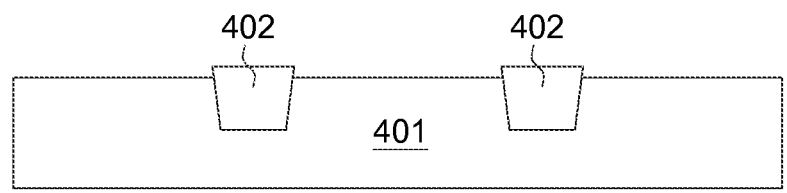
FIG. 4C3
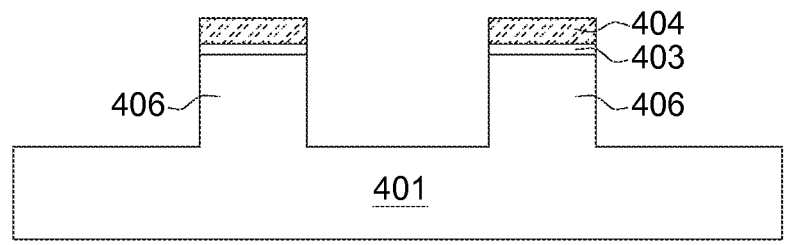
FIG. 4C4

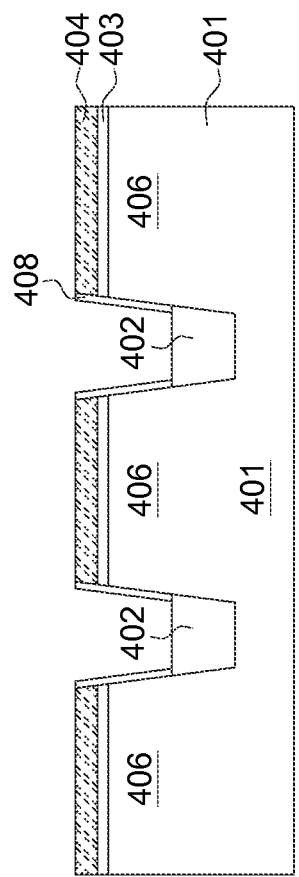
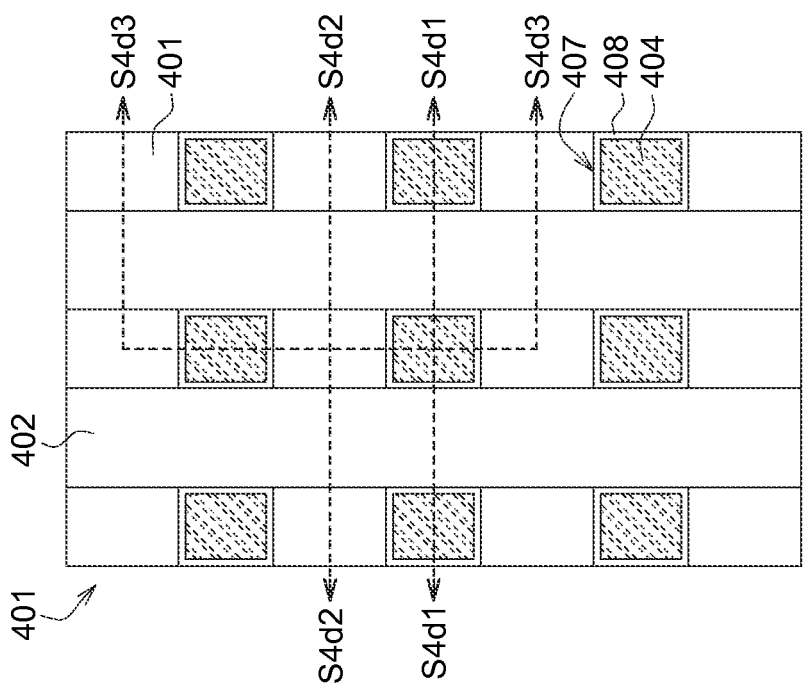
FIG. 4D2
FIG. 4D1

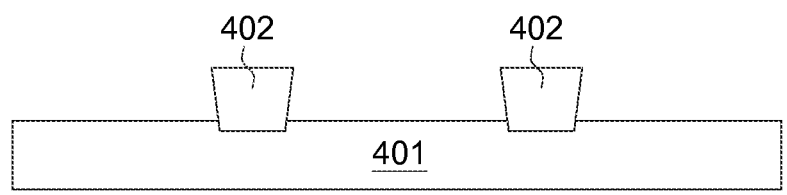
FIG. 4D3
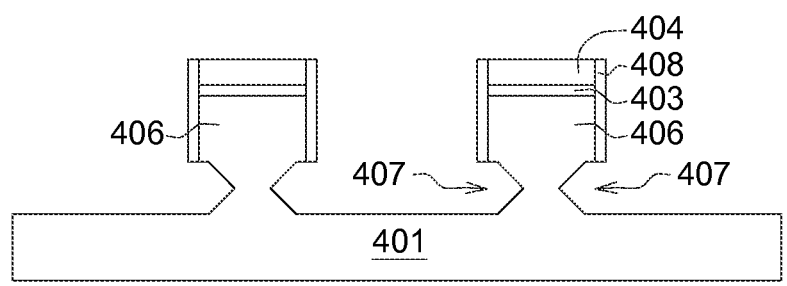
FIG. 4D4

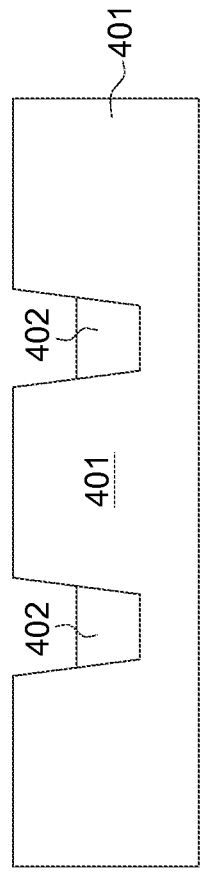
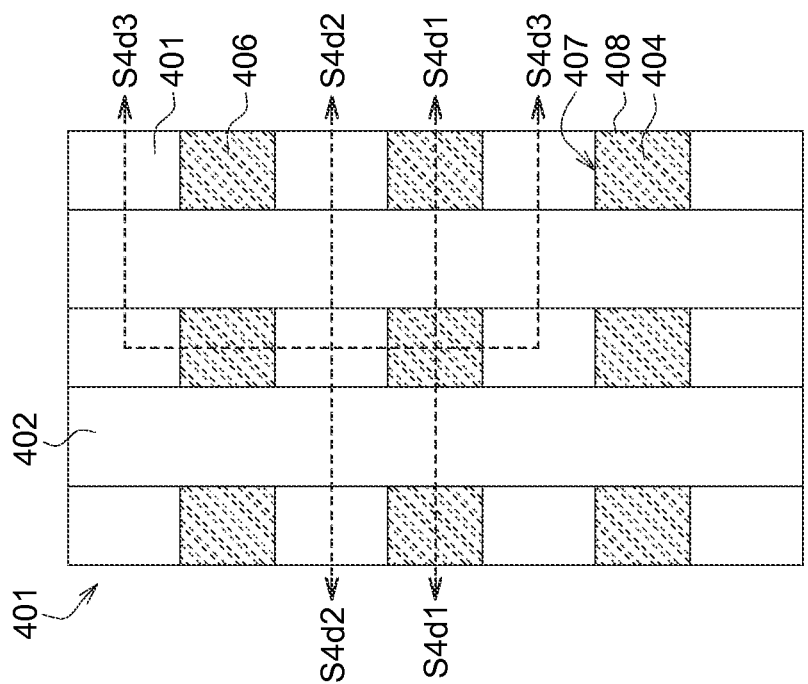

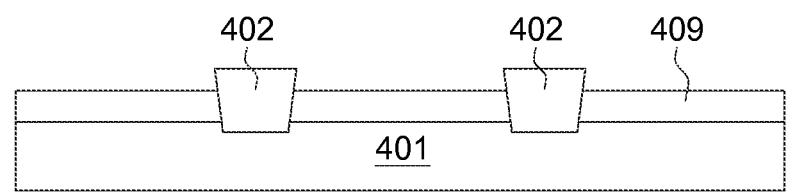
FIG. 4E3
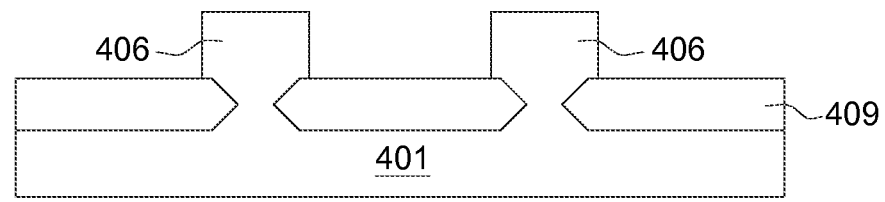
FIG. 4E4

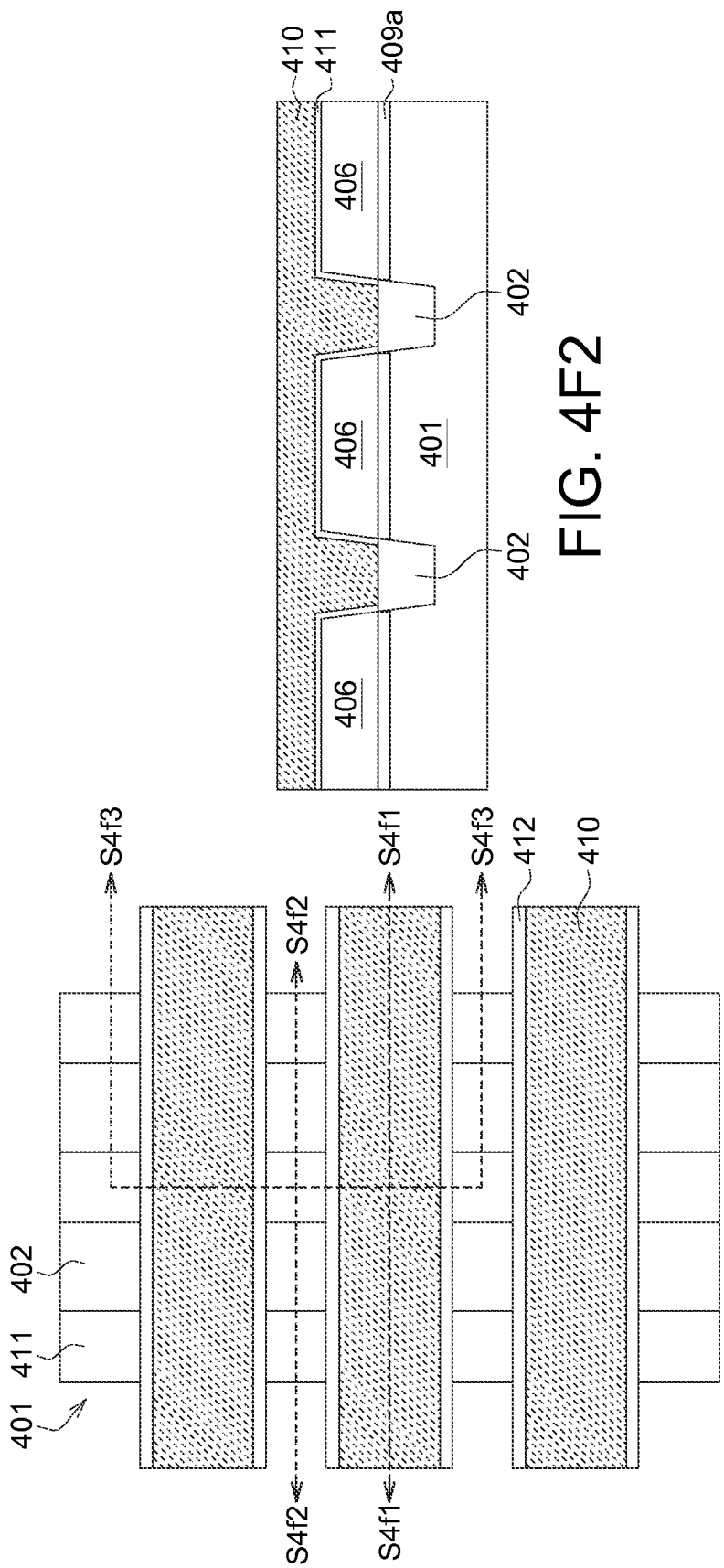

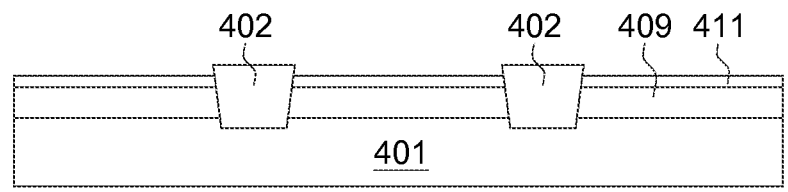
FIG. 4F3
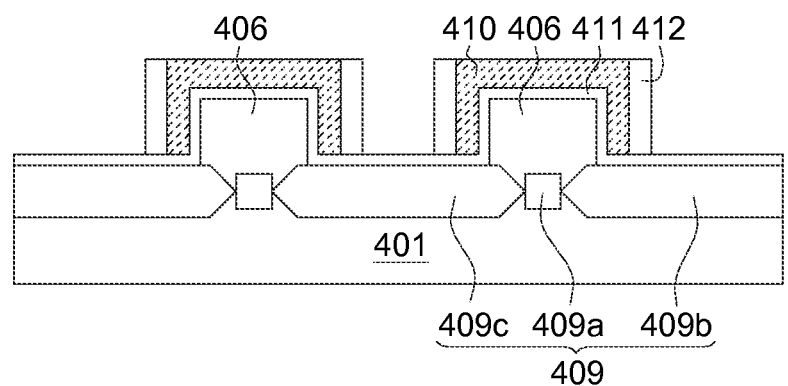
FIG. 4F4

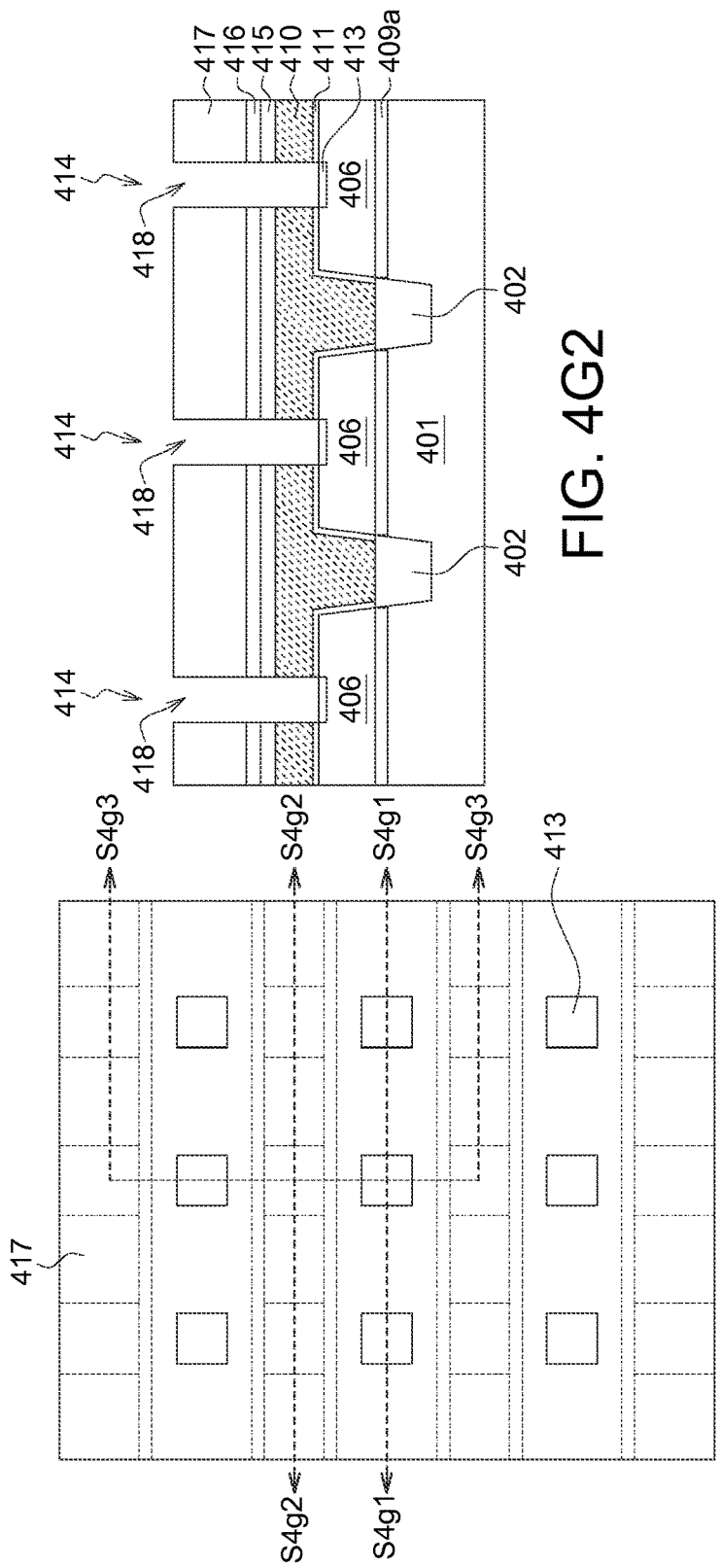
FIG. 4G2
FIG. 4G1

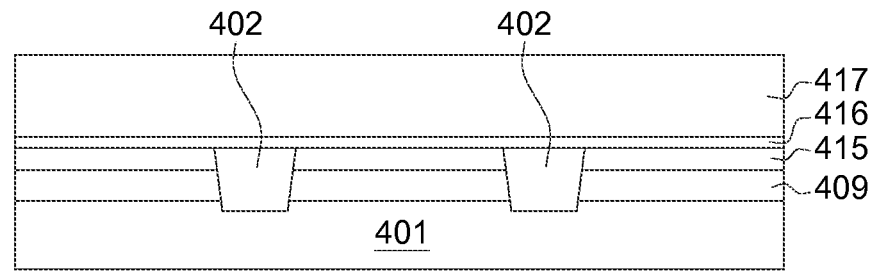
FIG. 4G3
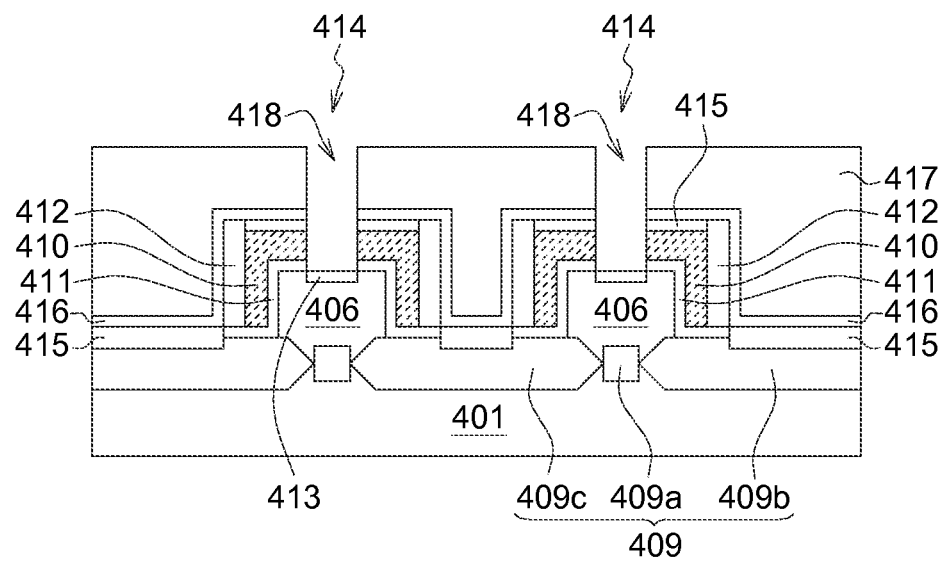
FIG. 4G4

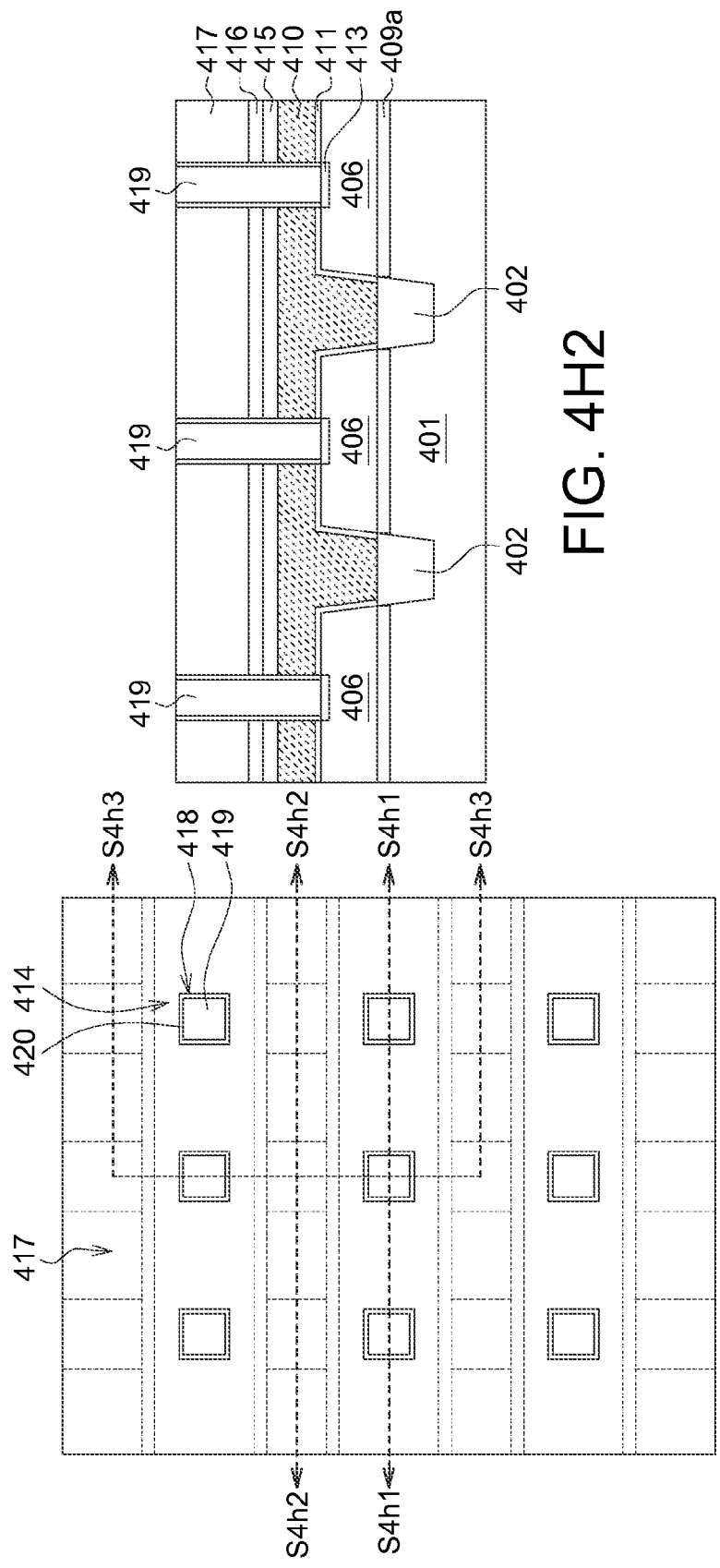

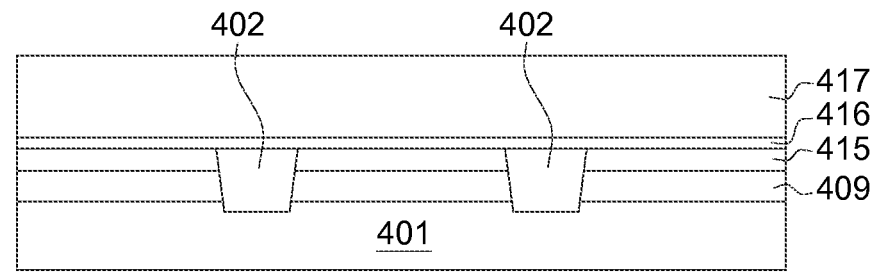
FIG. 4H3
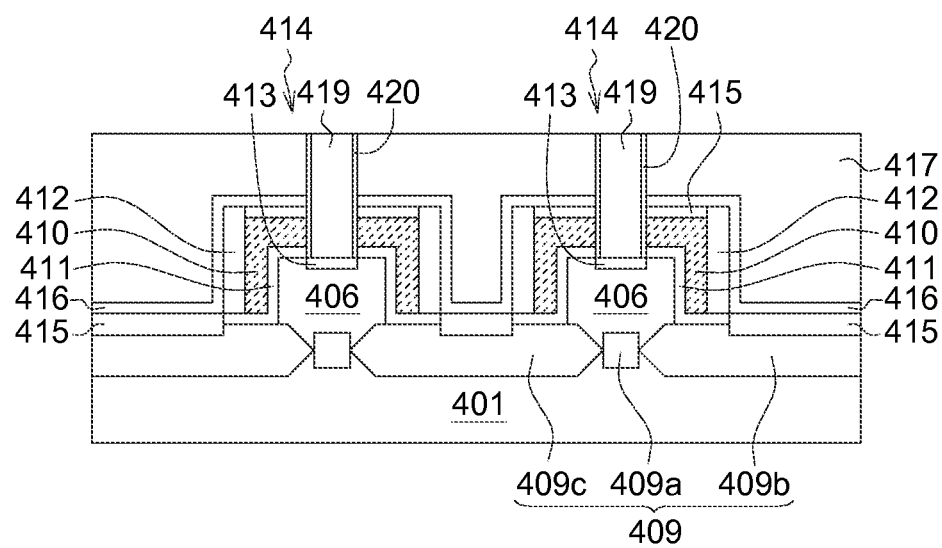
FIG. 4H4

THREE DIMENSIONAL MEMORY DEVICE AND METHOD FOR FABRICATING THE SAME

BACKGROUND

Technical Field

The disclosure in generally relates to a high-density memory device method for fabricating a memory device, and more particularly to a memory device with a three dimensional (3D) memory cells array and the method for fabricating the same.

Description of the Related Art

As the development of electrical technology, semiconductor memory devices have being broadly applied to various electronic products, such as MP3 players, digital cameras, notebooks, cell phones, etc. In order to accommodate the rising demand for reducing the size of the electronic products and improving the operation speed thereof, a 3D memory device having a higher density memory and excellent electrical characteristics, e.g. reliability in data storage and high operating speed, has been provided.

A typical 3D semiconductor memory device has a 3D memory cells array using surrounding gate transistor (SGT) configured in a multi-layer stack structure and a plurality of string select line (SSL) transistors connected in series with the 3D memory cells array. In order to reduce the size of the 3D semiconductor memory device to provide a higher density memory, it is necessary not only to reduce the size of the SGT but also to reduce the size of the SSL transistors. However, the SSL transistors conventionally implemented by field effect transistors (FET) having horizontally oriented gate which occupy large footprint and may limit the size reduction of the 3D semiconductor memory device.

Recently, bipolar junction transistors or diodes having smaller lateral footprint are applied to taking the place of the conventional horizontally oriented gate FET to serve as the SSL transistors of the 3D semiconductor memory device. However, it is hard to control the bipolar junction transistors or the diodes in a multi-bit operation due to the fact that the characteristic electrical current-voltage (I/V) curve is exponential.

Therefore, there is a need of providing an improved 3D semiconductor memory device and method for fabricating the same to obviate the drawbacks encountered from the prior art.

SUMMARY

One aspect of the present invention is to provide a 3D semiconductor memory device, wherein the 3D semiconductor memory device includes a semiconductor substrate, a source line, a gate line and a plurality of memory cells connected in series. The semiconductor substrate has a protruding portion. The source line is disposed in the semiconductor substrate and partially extending below the protruding portion. The gate line is configured to surround and cover the protruding portion and electrically separated from the source line and the protruding portion. The memory cells are disposed on the semiconductor substrate and connected in series to the protruding portion at a top surface thereof.

Another aspect of the present invention is to provide a method for fabricating a 3D semiconductor memory device, wherein the method includes steps as follows: A semiconductor substrate having a protruding portion is firstly provided. A source line is then formed in the semiconductor substrate and partially extending below the protruding portion. Next, a gate line is configured to surround and cover the protruding portion and electrically separated from the source line and the protruding portion. Subsequently, a plurality of memory cells connected in series are formed on the semiconductor substrate and connected in series to the protruding portion at a top surface thereof.

Yet another aspect of the present invention is to provide a method for fabricating a 3D semiconductor memory device, wherein the method includes steps as follows: A semiconductor substrate having an active region and a periphery region is firstly provided. At least one source line is then formed in the active region. A selective epitaxial growth (SEG) process is performed on the source line to form at least one pillar channel structure having a bottom portion connected to the source line. Next, at least one gate line intersecting to the source line is formed to surround the pillar channel structure in a manner of electrically separated from the source line and the pillar channel structure. Subsequently, a plurality of memory cells connected in series are formed on the active region and connected in series to the pillar channel structure at a top surface thereof.

Yet another aspect of the present invention is to provide a method for fabricating a 3D semiconductor memory device, wherein the method includes steps as follows: A semiconductor substrate is firstly provided, and at least one source line is then formed in the semiconductor substrate. Next, at least one gate line is formed to intersect to the source line and electrically separated from each other. Next, at least one penetrating hole is formed in the gate line to expose portions of the gate line and the source line. After a spacer is formed on sidewalls of the penetrating hole, a SEG process is performed to form at least one pillar channel structure in the penetrating hole. Subsequently, a plurality of memory cells connected in series are formed on the semiconductor substrate and connected in series to the pillar channel structure at a top surface thereof.

In accordance with the aforementioned embodiments of the present invention, a 3D semiconductor memory device and method for fabricating the same are provided, wherein a FET having a vertical channel is applied to serve as the SSL transistor connected in series to the 3D memory cells array of the 3D semiconductor memory device. In some embodiments of the present invention, the vertical channel of the FET can be configured in a protruding portion of a semiconductor device. In some embodiment, the vertical channel of the FET can be configured on a top surface of a semiconductor substrate by a SEG process.

Since the FET with vertical channel has smaller footprint and the he electrical current-voltage (I/V) characteristic thereof is liner, thus it can be controlled more easily during a multi-bit operation. In other words, using the FET as the SSL transistor connected in series to the 3D memory cells array of the 3D semiconductor memory device can solve the problems of size reduction caused by the horizontally oriented gate FETs and the controlling problems caused by the bipolar junction transistors or the diodes, so as to obviate the drawbacks encountered from the prior art.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A1 is a top view of a semiconductor substrate illustrated in accordance with one embodiment of the present invention;

FIG. 1A2 is a cross-sectional view taken along the section line S1a1 depicted in FIG. 1A1;

FIG. 1A3 is a cross-sectional view taken along the section line S1a2 depicted in FIG. 1A1

FIG. 1B1 is a top view illustrating the results after the active region and the periphery region depicted in FIG. 1A1 are respectively subjected to at least one ion implantation process;

FIG. 1B2 is a cross-sectional view taken along the section line S1b1 depicted in FIG. 1B1;

FIG. 1B3 is a cross-sectional view taken along the section line S1b2 depicted in FIG. 1B1;

FIG. 1C1 is a top view illustrating the results after a patterned first dielectric layer, a patterned sacrificing layer and a patterned second dielectric layer are formed on the structure depicted in FIG. 1A1;

FIG. 1C2 is a cross-sectional view taken along the section line S1c1 depicted in FIG. 1C1;

FIG. 1C3 is a cross-sectional view taken along the section line S1c2 depicted in FIG. 1C1;

FIG. 1D1 is a top view illustrating the results after a plurality of spacers are formed on the structure depicted in FIG. 1C1;

FIG. 1D2 is a cross-sectional view taken along the section line S1d1 depicted in FIG. 1D1;

FIG. 1D3 is a cross-sectional view taken along the section line S1d2 depicted in FIG. 1E1 is a top view illustrating the results after a SEG process is performed on the structure depicted in FIG. 1D1;

FIG. 1E2 is a cross-sectional view taken along the section line S1e1 depicted in FIG. 1E1;

FIG. 1E3 is a cross-sectional view taken along the section line S1e2 depicted in FIG. 1E1;

FIG. 1F1 is a top view illustrating the results after a plurality of planar metal-oxide-semiconductor (MOS) FETs are formed on the structure depicted in FIG. 1E1;

FIG. 1F2 is a cross-sectional view taken along the section line S1f1 depicted in FIG. 1F1;

FIG. 1F3 is a cross-sectional view taken along the section line S1f2 depicted in FIG. 1F1;

FIG. 1G1 is a top view illustrating the results after the patterned first dielectric layer, the patterned sacrificing layer and the patterned second dielectric layer depicted in FIG. 1F1 are subjected to another pattern process;

FIG. 1G2 is a cross-sectional view taken along the section line S1g1 depicted in FIG. 1G1;

FIG. 1G3 is a cross-sectional view taken along the section line S1g2 depicted in FIG. 1G1;

FIG. 1G4 is a cross-sectional view taken along the section line S1g3 depicted in FIG. 1G1;

FIG. 1H1 is a top view illustrating the results after the remaining sacrificing layer is removed from the structure depicted in FIG. 1G1;

FIG. 1H2 is a cross-sectional view taken along the section line S1h1 depicted in FIG. 1H1;

FIG. 1H3 is a cross-sectional view taken along the section line S1h2 depicted in FIG. 1H1;

FIG. 1H4 is a cross-sectional view taken along the section line S1h3 depicted in FIG. 1H1;

FIG. 1I1 is a top view illustrating the results after a plurality of gate lines is formed on the structure depicted in FIG. 1H1;

FIG. 1I2 is a cross-sectional view taken along the section line S1i1 depicted in FIG. 1I1;

FIG. 1I3 is a cross-sectional view taken along the section line S1i2 depicted in FIG. 1I1;

FIG. 1I4 is a cross-sectional view taken along the section line S1i3 depicted in FIG. 1I1;

FIG. 1J1 is a top view illustrating the results after a SiN spacer is formed on the structure depicted in FIG. 1I1;

Figure 1L:
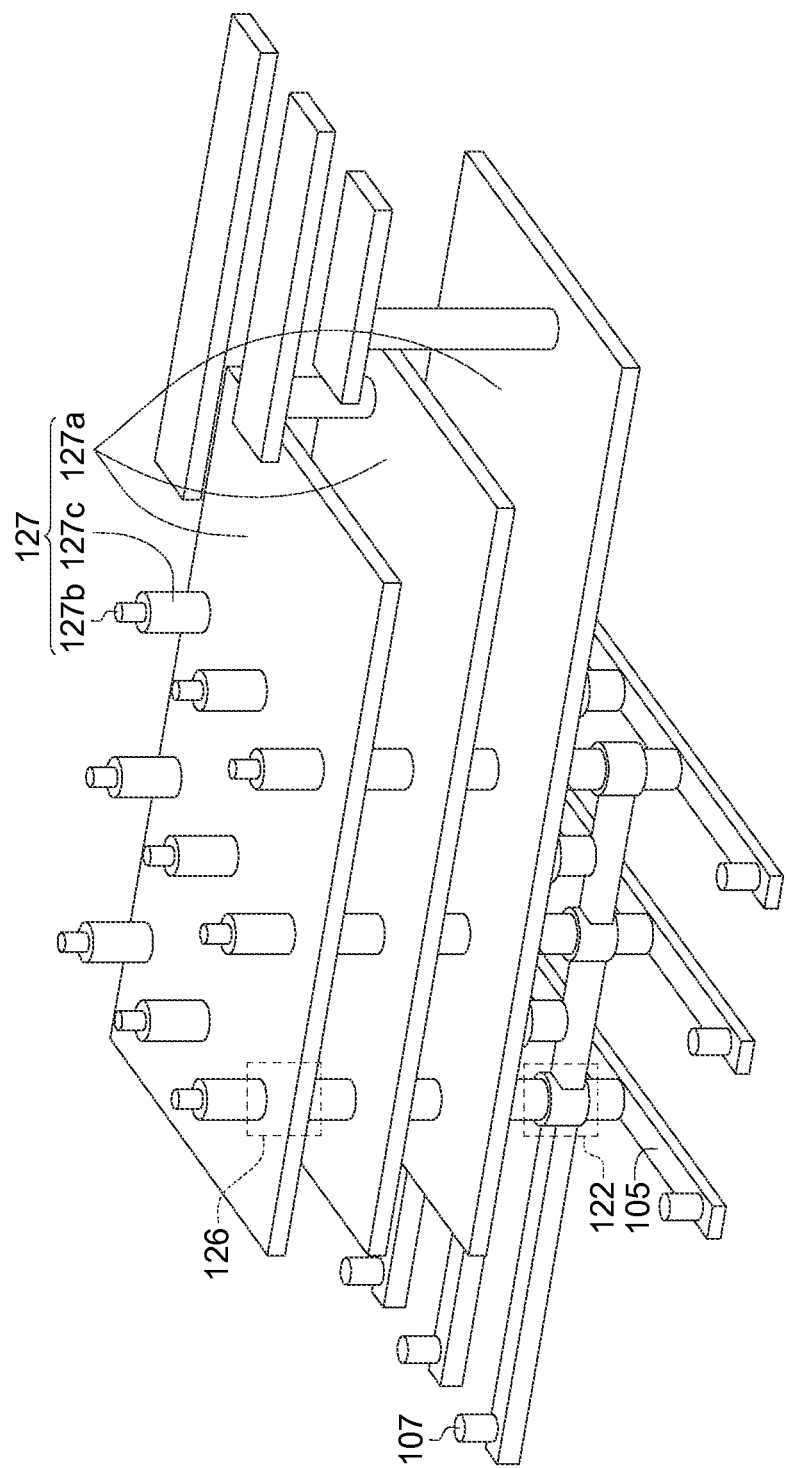

1J2 is a cross-sectional view taken along the section line S1j1 depicted in FIG. 1J1;

FIG. 1J3 is a cross-sectional view taken along the section line S1j2 depicted in FIG. 1J1;

FIG. 1J4 is a cross-sectional view taken along the section line S1j3 depicted in FIG. 1J1;

FIG. 1K1 is a top view illustrating the results after a plurality of SSL transistors are formed on the structure depicted in FIG. 1J1;

FIG. 1K2 is a cross-sectional view taken along the section line S1k1 depicted in FIG. 1K1;

FIG. 1K3 is a cross-sectional view taken along the section line S1k2 depicted in FIG. 1K1;

FIG. 1K4 is a cross-sectional view taken along the section line S1k3 depicted in FIG. 1K1;

FIG. 1L is a perspective view illustrating a 3D semiconductor memory device in accordance with one embodiment of the present invention;

FIG. 2A1 is a top view illustrating the results after a patterned first dielectric layer, a patterned conductive layer and a patterned second dielectric layer are formed on the structure depicted in FIG. 1B1;

FIG. 2A2 is a cross-sectional view taken along the section line S2a1 depicted in FIG. 2A1;

FIG. 2A3 is a cross-sectional view taken along the section line S2a2 depicted in FIG. 2A1;

FIG. 2B1 is a top view illustrating the results after a plurality of spacers are formed on the structure depicted in FIG. 2A1;

FIG. 2B2 is a cross-sectional view taken along the section line S2b1 depicted in FIG. 2B1;

FIG. 2B3 is a cross-sectional view taken along the section line S2b2 depicted in FIG. 2B1;

FIG. 2C1 is a top view illustrating the results after the SEG process is performed on the structure depicted in FIG. 2B1;

FIG. 2C2 is a cross-sectional view taken along the section line S2c1 depicted in FIG. 2C1;

FIG. 2C3 is a cross-sectional view taken along the section line S2c2 depicted in FIG. 2C1;

FIG. 2D1 is a top view illustrating the results after q plurality of MOS FETs are formed on the structure depicted in FIG. 2C1;

FIG. 2D2 is a cross-sectional view taken along the section line S2d1 depicted in FIG. 2D1;

FIG. 2D3 is a cross-sectional view taken along the section line S2d2 depicted in FIG. 2D1;

FIG. 2E1 is a top view illustrating the results after the patterned first dielectric layer, the patterned conductive layer and the patterned second dielectric layer depicted in FIG. 2D1 are subjected to another pattern process;

FIG. 2E2 is a cross-sectional view taken along the section line S2e1 depicted in FIG. 2E1;

FIG. 2E3 is a cross-sectional view taken along the section line S2e2 depicted in FIG. 2E1;

FIG. 2E4 is a cross-sectional view taken along the section line S2e3 depicted in FIG. 2E1

Figure 3H:
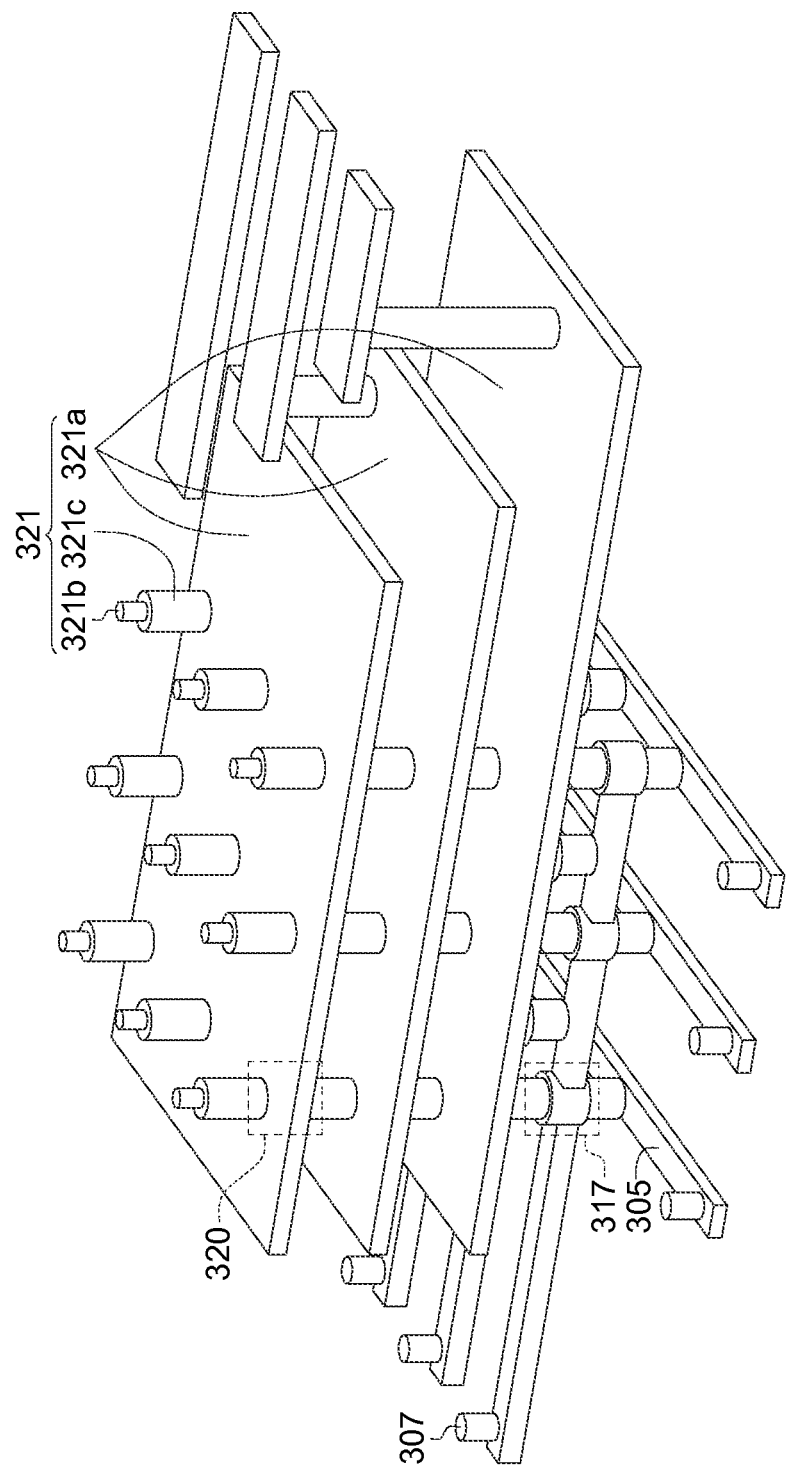
Figure 4I:
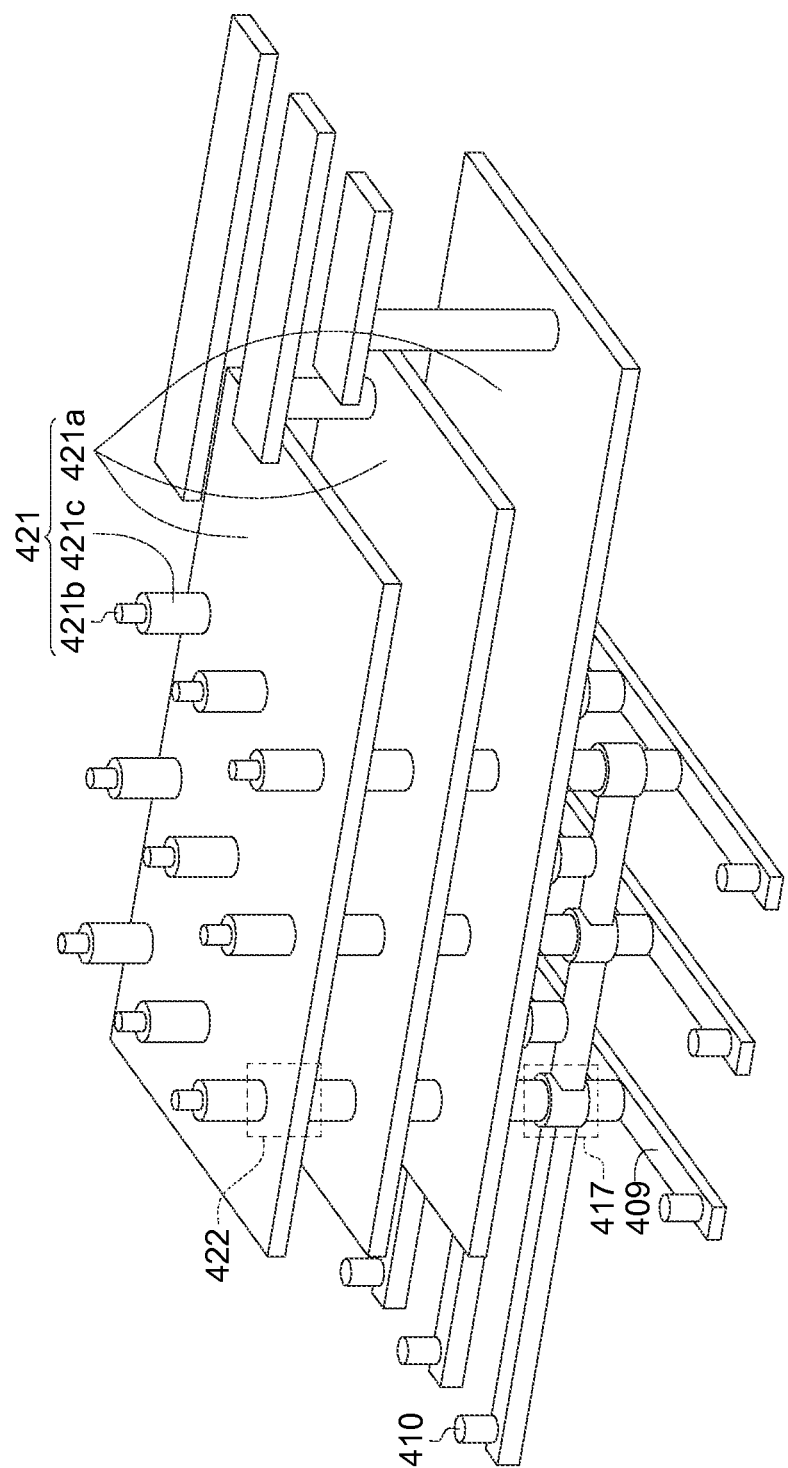

FIG. 2F1 is a top view illustrating the results after a plurality of SSL transistors are formed on the structure depicted in FIG. 2E1;

FIG. 2F2 is a cross-sectional view taken along the section line S2f1 depicted in FIG. 2F1;

FIG. 2F3 is a cross-sectional view taken along the section line S2f2 depicted in FIG. 2F1;

FIG. 2F4 is a cross-sectional view taken along the section line S2f3 depicted in FIG. 2F1;

FIG. 2G is a perspective view illustrating a 3D semiconductor memory device in accordance with another embodiment of the present invention;

FIG. 3A1 is a top view of a semiconductor substrate illustrated in accordance with one embodiment of the present invention;

FIG. 3A2 is a cross-sectional view taken along the section line S3a depicted in FIG. 3A1;

FIG. 3B1 is a top view illustrating the results after an ion implantation process is performed on the structure depicted in FIG. 3A1;

FIG. 3B2 is a cross-sectional view taken along the section line S3b depicted in FIG. 3B1;

FIG. 3C1 is a top view illustrating the results after a gate dielectric layer and a plurality of gate lines are formed on the structure depicted in FIG. 3B1;

FIG. 3C2 is a cross-sectional view taken along the section line S3c1 depicted in FIG. 3C1;

FIG. 3C3 is a cross-sectional view taken along the section line S3c2 depicted in FIG. 3C1;

FIG. 3D1 is a top view illustrating the results after a silicon oxide layer and a SiN hard mask are formed on the structure depicted in FIG. 3C1;

FIG. 3D2 is a cross-sectional view taken along the section line S3d1 depicted in FIG. 3D1;

FIG. 3D3 is a cross-sectional view taken along the section line S3d2 depicted in FIG. 3D1;

FIG. 3E1 is a top view illustrating the results after at least one through hole and a spacer are formed in the structure depicted in FIG. 3D1;

FIG. 3E2 is a cross-sectional view taken along the section line S3e1 depicted in FIG. 3E1;

FIG. 3E3 is a cross-sectional view taken along the section line S3e2 depicted in FIG. 3E1;

FIG. 3F1 is a top view illustrating the results after a plurality of pillar channel structures are formed in the structure depicted in FIG. 3E1;

FIG. 3F2 is a cross-sectional view taken along the section line S3f1 depicted in FIG. 3F1;

FIG. 3F3 is a cross-sectional view taken along the section line S3f2 depicted in FIG. 3F1;

FIG. 3G1 is a top view illustrating the results after a plurality of SSL transistors are formed on the structure depicted in FIG. 3F1;

FIG. 3G2 is a cross-sectional view taken along the section line S3g1 depicted in FIG. 3G1;

FIG. 3G3 is a cross-sectional view taken along the section line S3g2 depicted in FIG. 3G1;

FIG. 3H is a perspective view illustrating a 3D semiconductor memory device in accordance with yet another embodiment of the present invention;

FIG. 4A1 is a top view of the semiconductor substrate illustrated in accordance with one embodiment of the present invention;

FIG. 4A2 is a cross-sectional view taken along the section line S4a depicted in FIG. 4A1;

FIG. 4B1 is a top view illustrating the results after portions of the STIs are removed from the structure depicted in FIG. 4A1;

FIG. 4B2 is a cross-sectional view taken along the section line S4b depicted in FIG. 4B1;

FIG. 4C1 is a top view illustrating the results after portions of the ridge structures are removed from the structure depicted in FIG. 4B1;

FIG. 4C2 is a cross-sectional view taken along the section line S4c1 depicted in FIG. 4C1;

FIG. 4C3 is a cross-sectional view taken along the section line S4c2 depicted in FIG. 4C1;

FIG. 4C4 is a cross-sectional view taken along the section line S4c3 depicted in FIG. 4C1;

FIG. 4D1 is a top view illustrating the results after at least one undercut is formed in the structure depicted in FIG. 4C1;

FIG. 4D2 is a cross-sectional view taken along the section line S4d1 depicted in FIG. 4D1;

FIG. 4D3 is a cross-sectional view taken along the section line S4d2 depicted in FIG. 4D1;

FIG. 4D4 is a cross-sectional view taken along the section line S4d3 depicted in FIG. 4D1;

FIG. 4E1 is a top view illustrating the results after a plurality of source lines are formed in the structure depicted in FIG. 4D1;

FIG. 4E2 is a cross-sectional view taken along the section line S4e1 depicted in FIG. 4E1;

FIG. 4E3 is a cross-sectional view taken along the section line S4e2 depicted in FIG. 4E1;

FIG. 4E4 is a cross-sectional view taken along the section line S4e3 depicted in FIG. 4E1;

FIG. 4F1 is a top view illustrating the results after a plurality of gate lines are formed in the structure depicted in FIG. 4E1;

FIG. 4F2 is a cross-sectional view taken along the section line S4f1 depicted in FIG. 4F1;

FIG. 4F3 is a cross-sectional view taken along the section line S4f2 depicted in FIG. 4F1;

FIG. 4F4 is a cross-sectional view taken along the section line S4f3 depicted in FIG. 4F1;

FIG. 4G1 is a top view illustrating the results after a plurality of SSL transistors are formed on the structure depicted in FIG. 4F1;

FIG. 4G2 is a cross-sectional view taken along the section line S4g1 depicted in FIG. 4G1;

FIG. 4G3 is a cross-sectional view taken along the section line S4g2 depicted in FIG. 4G1;

FIG. 4G4 is a cross-sectional view taken along the section line S4g3 depicted in FIG. 4G1;

FIG. 4H1 is a top view illustrating the results after a plurality of via plugs are formed on the structure depicted in FIG. 4G1;

FIG. 4H2 is a cross-sectional view taken along the section line S4h1 depicted in FIG. 4H1;

FIG. 4H3 is a cross-sectional view taken along the section line S4h2 depicted in FIG. 4H1;

FIG. 4H4 is a cross-sectional view taken along the section line S4h3 depicted in FIG. 4H1; and FIG. 4I is a perspective view illustrating a 3D semiconductor memory device in accordance with yet another embodiment of the present invention.

DETAILED DESCRIPTION

The embodiments as illustrated below provide a 3D semiconductor memory device and method for fabricating the same. The present invention will now be described more specifically with reference to the following embodiments illustrating the structure and method for fabricating the 3D semiconductor memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

In accordance with one embodiment of the present invention, a method for fabricating a 3D semiconductor memory device 100 is provided, wherein the method includes several steps as follows: Firstly, semiconductor substrate 101 having an active region 101a and a periphery region 101b is provided. A plurality of shallow trench isolations (STIs) 102 are then formed in the semiconductor substrate 101.

FIG. 1A1 is a top view of the semiconductor substrate 101 illustrated in accordance with one embodiment of the present invention; FIG. 1A2 is a cross-sectional view taken along the section line S1a1 depicted in FIG. 1A1; and FIG. 1A3 is a cross-sectional view taken along the section line S1a2 depicted in FIG. 1A1.

In some embodiments of the present invention, as shown in FIG. 1A1 to 1A3, a pad oxide layer 103 and a silicon nitride (SiN) layer 104 are preferably formed on the semiconductor substrate 101 after the STIs 102 are formed; and a planarization process, such as a chemical mechanical polish (CMP) process, may be performed using the STIs 102 as a stop layer.

After the SiN layer 104 is removed, the active region 101a and the periphery region 101b are respectively subjected to at least one ion implantation process. FIG. 1B1 is a top view illustrating the results after the active region 101a and the periphery region 101b depicted in FIG. 1A1 are respectively subjected to at least one ion implantation process; FIG. 1B2 is a cross-sectional view taken along the section line S1b1 depicted in FIG. 1B1; and FIG. 1B3 is a cross-sectional view taken along the section line S1b2 depicted in FIG. 1B1.

After the at least one ion implantation process is carried out, a doping well with a p type conductivity referred to as P well PW and a doping well with an n type conductivity referred to as N well NW are formed in the periphery region 101b of the semiconductor substrate 101; as well, a P Well PW and an N well NW formed in the P Well PW are formed in the active region 101a of the semiconductor substrate 101. In some embodiments of the P wells PW respectively formed in the active region 101a and the periphery region 101b can be formed by the same ion implantation process for implanting p type dopants; and the N wells NW respectively formed in the active region 101a and the periphery region 101b can be formed by the same ion implantation process for implanting n type dopants. In the present embodiment, the STIs 102 are arranged as a plurality of parallel strips, and the active region 101a is divided into a plurality of semiconductor strips by the STIs 102. Each one of the semiconductor strips configured in the active region 101a can be referred to as a source line 105 of the 3D semiconductor memory device 100.

A first dielectric layer 106, a sacrificing layer 107 and a patterned second dielectric layer 108 are formed on the semiconductor substrate 101, after the pad oxide layer 103 is removed. FIG. 1C1 is a top view illustrating the results after the patterned first dielectric layer 106, the patterned sacrificing layer 107 and the patterned second dielectric layer 108 are formed on the structure depicted in FIG. 1B1; FIG. 1C2 is a cross-sectional view taken along the section line S1c1 depicted in FIG. 1C1; and FIG. 1C3 is a cross-sectional view taken along the section line S1c2 depicted in FIG. 1C1.

The forming of the patterned first dielectric layer 106, the patterned sacrificing layer 107 and the patterned second dielectric layer 108 includes steps as follows: Firstly, the first dielectric layer 106, the sacrificing layer 107 and the second dielectric layer 108 are formed in sequence to form a stack. The first dielectric layer 106, the sacrificing layer 107 and the second dielectric layer 108 are then etched to form a plurality of through holes 109 to expose portions of the source lines 105.

Next, a plurality spacers 110 are formed on the portions of the sacrificing layer 107 exposed from the through holes 109. FIG. 1D1 is a top view illustrating the results after the spacers 110 are formed on the structure depicted in FIG. 1C1; FIG. 1D2 is a cross-sectional view taken along the section line S1d1 depicted in FIG. 1D1; and FIG. 1D3 is a cross-sectional view taken along the section line S1d2 depicted in FIG. 1D1.

In some embodiments of the present invention, the forming of the spacers 110 includes steps as follows: A thermal oxidation process, such as an in situ steam generation (ISSG) oxidation, or a deposition process is firstly performed to form a silicon oxide layer coating on the sidewalls of the through holes 109 and the portions of the source lines 105 exposed from the through holes 109. An anisotropic etch process, such as a dry etch process, is then performed to remove the portions of the silicon oxide layer coving on the source lines 105, whereby the portions of the source lines 105 can be exposed from the through holes 109 again; meanwhile the portions of the silicon oxide layer coving on the portions of the sacrificing layer 107 exposed from the through holes 109 can be remained to serve as the spacers 110.

Thereinafter, a SEG (selective epitaxial growth) silicon or SiGex process is performed. FIG. 1E1 is a top view illustrating the results after the SEG process is performed on the structure depicted in FIG. 1D1; FIG. 1E2 is a cross-sectional view taken along the section line S1e1 depicted in FIG. 1E1; and FIG. 1E3 is a cross-sectional view taken along the section line S1e2 depicted in FIG. 1E1. After the SEG process is carried out, a plurality of pillar channel structures 111 are formed in the through holes 109, wherein each one of the pillar channel structures 111 fills up one of the through holes 109. In the present embodiment, the SEG silicon or SiGex process is performed on the surface of layer 108, and after the SEG silicon or SiGex process is carried out a CMP process is then performed to remove the portions of the SEG silicon or SiGex formed on the surface of the second dielectric layer 108, such that merely the portions of the SEG silicon or SiGex formed in the through holes 109 are only remained.

Subsequently, a plurality of planar MOS FETs, such as MOS FETs 114a, 114b and 114c, are formed on the periphery region 102b. FIG. 1F1 is a top view illustrating the results after the MOS FETs 114a, 114b and 114c are formed on the structure depicted in FIG. 1E1; FIG. 1F2 is a cross-sectional view taken along the section line S1f1 depicted in FIG. 1F1; and FIG. 1F3 is a cross-sectional view taken along the section line S1f2 depicted in FIG. 1F1.

In the present embodiment, the forming of the MOS FETs 114a, 114b and 114c includes steps as follows: An oxide capping layer 112 and a SiN hard mask 113 are formed to blanket over the substrate 101 for protecting the active region 101a from being damaged. After the portion of the capping layer 112 and the hard mask 113 covering on the periphery region 101b is removed, a plurality of n type MOS FETs 114a and 114b and a p type MOS FET 114c are formed on the periphery region 101b. An inter-layer dielectric (ILD) 115 is then formed to covering on the MOS FETs 114a, 114b and 114c; and a planarization process using the hard mask 113 a stop layer is performed.

FIG. 1G1 is a top view illustrating the results after the patterned first dielectric layer 106, the patterned sacrificing layer 107 and the patterned second dielectric layer 108 depicted in FIG. 1F1 are subjected to another pattern process; FIG. 1G2 is a cross-sectional view taken along the section line S1g1 depicted in FIG. 1G1; FIG. 1G3 is a cross-sectional view taken along the section line S1g2 depicted in FIG. 1G1; and FIG. 1G4 is a cross-sectional view taken along the section line S1g3 depicted in FIG. 1G1. In the present embodiment, portions of the patterned first dielectric layer 106, the patterned sacrificing layer 107 and the patterned second dielectric layer 108 surrounding the pillar channel structures 111 are remained, after the pattern process is carried out, so as to form a plurality of ridge structures 116 intersecting the source lines 105.

The remaining sacrificing layer 107 disposed in the ridge structures 116 is then removed. FIG. 1H1 is a top view illustrating the results after the remaining sacrificing layer 107 is removed from the structure depicted in FIG. 1G1; FIG. 1H2 is a cross-sectional view taken along the section line S1h1 depicted in FIG. 1H1; FIG. 1H3 is a cross-sectional view taken along the section line S1h2 depicted in FIG. 1H1; and FIG. 1H4 is a cross-sectional view taken along the section line S1h3 depicted in FIG. 1H1. In the present embodiment, after the remaining sacrificing layer 107 is removed, at least one recess 117 can be formed in each one of the ridge structures 116 to surround the corresponding spacer 110 and the pillar channel structure 111. In addition, the hard mask 113 can be removed simultaneously during the process for removing the remaining sacrificing layer 107. Normally, layer 107 is made of SiN. It can be removed by hot $H_3PO_4$ which is higher selective to silicon and silicon oxide.

Thereinafter, a plurality of gate lines 118 are formed. FIG. 1I1 is a top view illustrating the results after the gate lines 118 is formed on the structure depicted in FIG. 1H1; FIG. 1I2 is a cross-sectional view taken along the section line S1i1 depicted in FIG. 1I1; FIG. 1I3 is a cross-sectional view taken along the section line S1i2 depicted in FIG. 1I1; and FIG. 1I4 is a cross-sectional view taken along the section line S1i3 depicted in FIG. 1I1.

In the present embodiment, the forming of the gate lines 118 includes steps as follows: Conductive material, such as metal (e.g. tungsten (W)), alloy, metal nitride (e.g. titanium nitride (TiN)) or the arbitrary combinations thereof (wherein TiN/W is preferred), is firstly formed in the gaps between the ridge structures 116 in order to fill the recesses 117 formed in the ridge structures 116. An etch back process is than performed to remove a portion of the conductive material and remain the portion of the conductive material filled into the recesses 117, whereby a plurality of the gate lines 118 radially surrounding the pillar channel structures 111 and the spacers 110 are formed. Wherein the gate lines 118 intersect to the source lines 105, and both of which are electrically separated from each other by the first dielectric layer 106 disposed in the ridge structures 116. The gate lines 118 also electrically separated from the pillar channel structures 111 by the spacers 110. The ridge structures 116 which have the gate lines 118 to take the place of the patterned sacrificing layer 107 can be referred to as surrounding gate structures which will reduce the resistance of the gate lines 118 a lot.

In some preferred embodiments, an optional SiN spacer 119 can be formed to surround the ridge structures 116. FIG. 1J1 is a top view illustrating the results after the SiN spacer 119 is formed on the structure depicted in FIG. 1I1; FIG. 1J2 is a cross-sectional view taken along the section line S1j1 depicted in FIG. 1J1; FIG. 1J3 is a cross-sectional view taken along the section line S1j2 depicted in FIG. 1J1; and FIG. 1J4 is a cross-sectional view taken along the section line S1j3 depicted in FIG. 1J1.

In the present embodiment, prior to the forming of the SiN spacer 119, the portions of the first dielectric layer 106 disposed between two adjacent ridge structures 116 are removed to expose portions of the source lines 105. And after the forming of the SiN spacer 119, a silicide layer 120 is preferably formed on the exposed source lines 105 to reduce the resistance of the source lines 105.

A plurality of drain electrodes 121 are formed on the top surface of the pillar channel structures 110, so as to form a plurality of SSL transistors 122 on the active region 101a. Wherein, each one of the drain electrodes 121 is formed on one of the pillar channel structure 110. FIG. 1K1 is a top view illustrating the results after the SSL transistors 122 are formed on the structure depicted in FIG. 1J1; FIG. 1K2 is a cross-sectional view taken along the section line S1k1 depicted in FIG. 1K1; FIG. 1K3 is a cross-sectional view taken along the section line S1k2 depicted in FIG. 1K1; and FIG. 1K4 is a cross-sectional view taken along the section line S1k3 depicted in FIG. 1K1.

After the forming of the SSL transistors 122, a planarized ILD 123 is formed on the active region 101a and the periphery region 101b. Thereinafter, a plurality of via plugs 124 are formed in the planarized ILD 123 used to electrically connect the MOS FETs 114a, 114b and 114c with external elements or circuit (not shown). As well, a plurality of via plugs 125 are formed in the planarized ILD 123 used to connect the SSL transistors 122 with a plurality of memory cells 126 subsequently formed on the active region 101a.

FIG. 1L is a perspective view illustrating a 3D semiconductor memory device 100 in accordance with one embodiment of the present invention. The memory cells 126 connected in series are configured in a 3D memory cells array 127 formed on the structure depicted in FIGS. 1K1 to 1K4, wherein each one of the memory cells 126 is connected in series to one of the drain electrodes 121 disposed on the top surface of the pillar channel structures 110 of the corresponding SSL transistors 122.

In the present embodiment, the 3D memory cells array 127 includes a plurality of conductive planes 127a stacked with and electrically separated from each other, a plurality of conductive pillars 127b passing through the conductive planes 127a and a plurality of memory layers 127c disposed between the conductive planes 127a and the conductive pillars 127b. Each one of the memory cells 126 is formed at the point of intersection formed between the corresponding conductive plane 127a, the corresponding conductive pillar 127b and the corresponding memory layer 127c and electrically connected in series to a drain electrode 121 of the corresponding SSL transistor 122 disposed under the memory cells array 127.

However, it should be appreciated that the memory cells array 127 is not limited in this regard, any type of memory cells array that has vertical channel can be used to form series connections with the SSL transistors 122 to form the 3D semiconductor memory device 100.

In accordance with another embodiment of the present invention, a method for fabricating a 3D semiconductor memory device 200 is provided, wherein the method for fabricating the 3D semiconductor memory device 200 is similar to that for fabricating the 3D semiconductor memory device 100, except the steps for forming the gate lines. Since the process and the materials for forming the semiconductor substrate 101, the STIs 102 and the source lines 105 have been described above (as shown in FIGS. 1A1 to 1B3), thus the identical steps will not be redundantly repeated again. The description of the method for fabricating 3D semiconductor memory device 200 will continue following the steps as depicted in FIGS. 1B1 to 1B3.

Firstly, a first dielectric layer 106, a conductive layer 207 and a second dielectric layer 108 are formed on the semiconductor substrate 101 and then patterned. FIG. 2A1 is a top view illustrating the results after the patterned first dielectric layer 106, the patterned conductive layer 207 and the patterned second dielectric layer 108 are formed on the structure depicted in FIG. 1B1; FIG. 2A2 is a cross-sectional view taken along the section line S2a1 depicted in FIG. 2A1; and FIG. 2A3 is a cross-sectional view taken along the section line S2a2 depicted in FIG. 2A1.

In the present embodiment, the forming of the patterned first dielectric layer 106, the patterned conductive layer 207 and the patterned second dielectric layer 108 includes steps as follows: Firstly, the first dielectric layer 106, the conductive layer 207 and the second dielectric layer 108 are formed in sequence to form a stack. The first dielectric layer 106, the conductive layer 207 and the second dielectric layer 108 are then etched to form a plurality of through holes 209 to expose portions of the source lines 105.

Next, a plurality spacers 210 are formed on the portions of the conductive layer 207 exposed from the through holes 209. FIG. 2B1 is a top view illustrating the results after the spacers 210 are formed on the structure depicted in FIG. 2A1; FIG. 2B2 is a cross-sectional view taken along the section line S2b1 depicted in FIG. 2B1; and FIG. 2B3 is a cross-sectional view taken along the section line S2b2 depicted in FIG. 2B1.

In some embodiments of the present invention, the forming of the spacers 210 includes steps as follows: A thermal oxidation process or a deposition process is firstly performed to form a silicon oxide layer coating on the sidewalls of the through holes 209 and the portions of the source lines 105 exposed from the through holes 209. An anisotropic etch process, such as a dry etch process, is then performed to remove the portions of the silicon oxide layer coving on the source lines 205, whereby the portions of the source lines 205 can be exposed from the through holes 209 again; meanwhile the portions of the silicon oxide layer coving on the portions of the conductive layer 207 exposed from the through holes 209 can be remained to serve as the spacers 210.

Thereinafter, a SEG Si or SiGex process is performed. FIG. 2C1 is a top view illustrating the results after the SEG process is performed on the structure depicted in FIG. 2B1; FIG. 2C2 is a cross-sectional view taken along the section line S2c1 depicted in FIG. 2C1; and FIG. 2C3 is a cross-sectional view taken along the section line S2c2 depicted in FIG. 2C1. After the SEG process is carried out, a plurality of pillar channel structures 111 are formed in the through holes 209, wherein each one of the pillar channel structures 111 fills up one of the through holes 209. The SEG process might be on the surface of layer 208, then CMP to remove it. SEG are only remained in hole 209. In the present embodiment, the SEG silicon or SiGex process is performed on the surface of layer 108, and after the SEG silicon or SiGex process is carried out a CMP process is then performed to remove the portions of the SEG silicon or SiGex formed on the surface of the second dielectric layer 108, such that merely the portions of the SEG silicon or SiGex formed in the through holes 209 are only remained.

Subsequently, a plurality of planar MOS FETs, such as MOS FETs 114a, 114b and 114c, are formed on the periphery region 102b. FIG. 2D1 is a top view illustrating the results after the MOS FETs 114a, 114b and 114c are formed on the structure depicted in FIG. 2C1; FIG. 2D2 is a cross-sectional view taken along the section line S2d1 depicted in FIG. 2D1; and FIG. 2D3 is a cross-sectional view taken along the section line S2d2 depicted in FIG. 2D1.

In the present embodiment, the forming of the MOS FETs 114a, 114b and 114c includes steps as follows: An oxide capping layer 112 and a SiN hard mask 113 are formed to blanket over the substrate 101 for protecting the active region 101a from being damaged. After the portion of the capping layer 112 and the hard mask 113 covering on the periphery region 101b is removed, a plurality of n type MOS FETs 114a and 114b and a p type MOS FET 114c are formed on the periphery region 101b.

FIG. 2E1 is a top view illustrating the results after the patterned first dielectric layer 106, the patterned conductive layer 207 and the patterned second dielectric layer 108 depicted in FIG. 2D1 are subjected to another pattern process; FIG. 2E2 is a cross-sectional view taken along the section line S2e1 depicted in FIG. 2E1; FIG. 2E3 is a cross-sectional view taken along the section line S2e2 depicted in FIG. 2E1; and FIG. 2E4 is a cross-sectional view taken along the section line S2e3 depicted in FIG. 2E1.

In the present embodiment, portions of the patterned first dielectric layer 106, the patterned conductive layer 207 and the patterned second dielectric layer 108 surrounding the pillar channel structures 111 are remained, after an etching process is carried out, so as to form a plurality of ridge structures 216 intersecting the source lines 105, and a plurality of the gate lines 218 constituted by the remaining patterned conductive layer 207 are formed in the ridge structures 216 and radially surrounds the pillar channel structures 111 and the spacers 210. Wherein the gate lines 218 intersect to the source lines 105, and both of which are electrically separated from each other by the first dielectric layer 106 disposed in the ridge structures 216. The gate lines 218 also electrically separated from the pillar channel structures 111 by the spacers 210.

A plurality of drain electrodes 121 are formed on the top surface of the pillar channel structures 110, so as to form a plurality of SSL transistors 222 on the active region 101a. Wherein, each one of the drain electrodes 121 is formed on one of the pillar channel structure 110. FIG. 2F1 is a top view illustrating the results after the SSL transistors 222 are formed on the structure depicted in FIG. 2E1; FIG. 2F2 is a cross-sectional view taken along the section line S2f1 depicted in FIG. 2F1; FIG. 2F3 is a cross-sectional view taken along the section line S2f2 depicted in FIG. 2F1; and FIG. 2F4 is a cross-sectional view taken along the section line S2f3 depicted in FIG. 2F1.

In some embodiments of the present invention, a silicide layer 120 is preferably formed on the exposed source lines 105 to reduce the resistance of the source lines 105. After the forming of the SSL transistors 222, a planarized ILD 123 is formed on the active region 101a and the periphery region 101b. Thereinafter, a plurality of via plugs 124 are formed in the planarized ILD 123 used to electrically connect the MOS FETs 114a, 114b and 114c with external elements or circuits (not shown). As well, a plurality of via plugs 125 are formed in the planarized ILD 123 to connect the SSL transistors 122 with a plurality of memory cells 126 subsequently formed on the active region 101a.

FIG. 2G is a perspective view illustrating a 3D semiconductor memory device 200 in accordance with another embodiment of the present invention. The memory cells 126 connected in series are configured in a 3D memory cells array 127 formed on the structure depicted in FIGS. 2F1 to 2F4, wherein each one of the memory cells 126 is connected in series to one of the drain electrodes 121 disposed on the top surface of the pillar channel structures 110 of the corresponding SSL transistors 122.

In the present embodiment, the 3D memory cells array 127 includes a plurality of conductive planes 127a stacked with and electrically separated from each other, a plurality of conductive pillars 127b passing through the conductive planes 127a and a plurality of memory layers 127c disposed between the conductive planes 127a and the conductive pillars 127b. Each one of the memory cells 126 is formed at the point of intersection formed between the corresponding conductive plane 127a, the corresponding conductive pillar 127b and the corresponding memory layer 127c and electrically connected in series to the corresponding drain electrode 121 of the corresponding SSL transistor 222 disposed under the memory cells array 127.

In accordance with yet another embodiment of the present invention, a method for fabricating a 3D semiconductor memory device 300 is provided, wherein the method includes several steps as follows: Firstly, semiconductor substrate 301, and a plurality of STIs 302 are then formed in the semiconductor substrate 301. FIG. 3A1 is a top view of the semiconductor substrate 301 illustrated in accordance with one embodiment of the present invention; and FIG. 3A2 is a cross-sectional view taken along the section line S3a depicted in FIG. 3A1.

In some embodiments of the present invention, as shown in FIG. 3A2, a pad oxide layer 303 and a SiN layer 304 are preferably formed on the semiconductor substrate 301 after the STIs 302 are formed; and a planarization process, such as a CMP process, may be performed using the STIs 302 as a stop layer.

After the SiN layer 104 is removed, an ion implantation process is performed on the semiconductor substrate 301. FIG. 3B1 is a top view illustrating the results after the ion implantation process is performed on the structure depicted in FIG. 3A1; and FIG. 3B2 is a cross-sectional view taken along the section line S3b depicted in FIG. 3B1. After the ion implantation process is carried out, a P Well PW is formed in the semiconductor substrate 101 and an N well NW formed in the P Well PW. In the present embodiment, the STIs 302 are arranged as a plurality of parallel strips, and the semiconductor substrate 301 is divided into a plurality of semiconductor strips by the STIs 102. Each one of the semiconductor strips configured in the semiconductor substrate 301 can be referred to as a source line 305 of the 3D semiconductor memory device 300.

Next, a gate dielectric layer 306 and a plurality of gate lines 307 are formed on the semiconductor substrate 301. FIG. 3C1 is a top view illustrating the results after the gate dielectric layer 306 and the gate lines 307 are formed on the structure depicted in FIG. 3B1; FIG. 3C2 is a cross-sectional view taken along the section line S3c1 depicted in FIG. 3C1; and FIG. 3C3 is a cross-sectional view taken along the section line S3c2 depicted in FIG. 3C1.

In the present embodiment, the forming of the gate dielectric layer 306 and the gate lines 307 includes steps as follows: Firstly, a dielectric layer and a conductive layer are formed on the semiconductor substrate 301 in sequence. The dielectric layer and the conductive layer are then patterned to define the gate dielectric layer 306 and the gate lines 307 on the semiconductor substrate 301 intersecting to the source lines 305, wherein the source lines 305 and the gate lines 307 are electrically separated by the gate dielectric layer 306.

After the forming of the gate dielectric layer 306 and the gate lines 307, a plurality of spacers 308 are preferably formed on the sidewalls of the gate lines 307. Another ion implantation process may be performed using the spacers 308 and the gate lines 307 as the mask to form a plurality of heavy doping regions 305a in the portions of the source lines 305 that are not covered by the spacers 308 and the gate lines 307. In the present embodiment, the heavy doping regions 305a has an n type conductivity and has a doping concentration substantially greater than that of the source lines 305.

A silicon oxide layer 309 and a SiN hard mask 310 are formed on the semiconductor substrate 301. FIG. 3D1 is a top view illustrating the results after the silicon oxide layer 309 and the SiN hard mask 310 are formed on the structure depicted in FIG. 3C1; FIG. 3D2 is a cross-sectional view taken along the section line S3d1 depicted in FIG. 3D1; and FIG. 3D3 is a cross-sectional view taken along the section line S3d2 depicted in FIG. 3D1.

After the forming of the silicon oxide layer 309 and the SiN hard mask 310, an ILD layer 311 may be formed to cover the SiN hard mask 310, a planarization process, such as a CMP process, may be performed thereof and an oxide capping layer 312 is then formed on the planarized ILD layer 311. Thus the source lines and the gate lines 307 can be protected from being inversely affected by the processes performed on a periphery region (not shown) of the 3D semiconductor memory device 300 for forming some other elements, such as the process for forming a plurality of MOS FETs 114a, 114b and 114c.

At least one through hole 313 is then formed in each one of the gate lines 307, and a spacer 314 is then formed on the sidewalls of the through hole 313. FIG. 3E1 is a top view illustrating the results after the through hole 313 and the spacer 314 are formed in the structure depicted in FIG. 3D1; FIG. 3E2 is a cross-sectional view taken along the section line S3e1 depicted in FIG. 3E1; and FIG. 3E3 is a cross-sectional view taken along the section line S3e2 depicted in FIG. 3E1.

In the present embodiment, a dry etching process, such as an reactive ion etch (RIE), is performed to form an opening (the through hole 313) at each intersection points formed between the source lines 305 and the gate lines 307 and extending through the oxide capping layer 312, the planarized ILD layer 311, the SiN hard mask 310, the silicon oxide layer 309 and the gate lines 307, so as to expose portions of the source lines 305. A thermal oxidation process is then performed to form a silicon oxide layer on the sidewalls of each through hole 313 to serve as the spacers 308.

Subsequently, a SEG Si or SiGex process is performed to form a pillar channel structure 315 in each one of the through holes 313. FIG. 3F1 is a top view illustrating the results after the pillar channel structures 315 are formed in the structure depicted in FIG. 3E1; FIG. 3F2 is a cross-sectional view taken along the section line S3f1 depicted in FIG. 3F1; and FIG. 3F3 is a cross-sectional view taken along the section line S3f2 depicted in FIG. 3F1. In the present embodiment, poly-silicon can be formed to fill the through holes 313 to form one pillar channel structure 315 in each one of the through holes 313, wherein the bottoms of the pillar channel structures 315 are connected to the source lines 305. In the present embodiment, the SEG Si or SiGex process is performed on the surface of the oxide capping layer 312, and after the SEG silicon or SiGex process is carried out a CMP process is then performed to remove the portions of the SEG silicon or SiGex formed on the surface of the second dielectric layer 312, such that merely the portions of the SEG silicon or SiGex formed in the through holes 313 are only remained.

A plurality of drain electrodes 316 are formed on the top surface of the pillar channel structure 315, so as to form a plurality of SSL transistors 317 on the semiconductor substrate 301. Wherein, each one of the drain electrodes 316 is formed on one of the pillar channel structure 315. FIG. 3G1 is a top view illustrating the results after the SSL transistors 317 are formed on the structure depicted in FIG. 3F1; FIG. 3G2 is a cross-sectional view taken along the section line S3g1 depicted in FIG. 3G1; and FIG. 3G3 is a cross-sectional view taken along the section line S3g2 depicted in FIG. 3G1.

After the forming of the SSL transistors 317, a planarized ILD 318 is formed on the semiconductor substrate 301, and a plurality of via plugs 319 are formed in the planarized ILD 318 used to electrically connect the SSL transistors 317 with a plurality of memory cells 320 subsequently formed on the semiconductor substrate 301. FIG. 3H is a perspective view illustrating a 3D semiconductor memory device 300 in accordance with yet another embodiment of the present invention. In the present embodiment, the memory cells 320 connected in series are configured in a 3D memory cells array 321 formed on the structure depicted in FIGS. 3G1 to 3G4, wherein each one of the memory cells 320 is connected in series to one of the drain electrodes 316 disposed on the top surface of the pillar channel structures 315 of the corresponding SSL transistors 317.

In the present embodiment, the 3D memory cells array 321 includes a plurality of conductive planes 321a stacked with and electrically separated from each other, a plurality of conductive pillars 321b passing through the conductive planes 321a and a plurality of memory layers 321c disposed between the conductive planes 321a and the conductive pillars 321b. Each one of the memory cells 320 is formed at the point of intersection formed between the corresponding conductive plane 321a, the corresponding conductive pillar 321b and the corresponding memory layer 321c and electrically connected in series to a drain electrode 316 of the corresponding SSL transistor 317 disposed under the memory cells array 321.

In accordance with yet another embodiment of the present invention, a method for fabricating a 3D semiconductor memory device 400 is provided, wherein the method includes several steps as follows: Firstly, semiconductor substrate 401, and a plurality of STIs 402 are then formed in the semiconductor substrate 401. FIG. 4A1 is a top view of the semiconductor substrate 401 illustrated in accordance with one embodiment of the present invention; and FIG. 4A2 is a cross-sectional view taken along the section line S4a depicted in FIG. 4A1.

In some embodiments of the present invention, as shown in FIG. 4A2, a pad oxide layer 403 and a SiN layer 404 are preferably formed on the semiconductor substrate 401 after the STIs 402 are formed; and a planarization process, such as a CMP process, may be performed using the STIs 402 as a stop layer.

Next, an etching process is performed to remove portions of the STIs 402. FIG. 4B1 is a top view illustrating the results after the portions of the STIs 402 are removed from the structure depicted in FIG. 4A1; and FIG. 4B2 is a cross-sectional view taken along the section line S4b depicted in FIG. 4B1. In the present embodiment, a top portion of each STI 402 is removed by the etching process and merely the bottom portion of each STI 402 is remained, whereby a plurality of ridge structures 405 parallel to the semiconductor substrate 401 are defined in the semiconductor substrate 401.

Subsequently, portions of the ridge structures 405 are removed by another etching process. FIG. 4C1 is a top view illustrating the results after the portions of the ridge structures 405 are removed from the structure depicted in FIG. 4B1; FIG. 4C2 is a cross-sectional view taken along the section line S4c1 depicted in FIG. 4C1; FIG. 4C3 is a cross-sectional view taken along the section line S4c2 depicted in FIG. 4C1; and FIG. 4C4 is a cross-sectional view taken along the section line S4c3 depicted in FIG. 4C1.

In the present embodiment, the etching process for removing portions of the ridge structures 405 includes steps as follows: A polarized organic dielectric layer (ODL) (not shown) is firstly formed to fill the gaps formed by the process for removing a portion of the STIs 402. A patterned photoresist layer (not shown) is applied and using the remained STIs 402 as the stop layer to remove a portion ridge structures 405, so as to form a plurality of protruding portions 406 on the surface of the semiconductor substrate 401.

Next, at least one undercut 407 may be formed below each one of protruding portions 406. FIG. 4D1 is a top view illustrating the results after at least one undercut 407 is formed in the structure depicted in FIG. 4C1; FIG. 4D2 is a cross-sectional view taken along the section line S4d1 depicted in FIG. 4D1; FIG. 4D3 is a cross-sectional view taken along the section line S4d2 depicted in FIG. 4D1; and FIG. 4D4 is a cross-sectional view taken along the section line S4d3 depicted in FIG. 4D1.

In the present embodiment, the forming of the at least one undercut 407 includes steps as follows: An in situ steam generation (ISSG) is firstly performed on the semiconductor substrate 401, so as to form a silicon oxide film (not shown) blanketed over the horizontal surface of the semiconductor substrate 401, the sidewalls of the protruding portions 406 and the SiN layer 404 disposed on the top surface of the protruding portions 406. The portions of the silicon oxide film disposed on the horizontal surface of the semiconductor substrate 401 and SiN layer 404 disposed are then removed by a dry etching process, and the portion of the silicon oxide film covering on the sidewalls of the protruding portions 406 is remained to serve as spacers 408. Subsequently, a wet etching process is performed to form at least one opening (the undercuts 407) extending downwards into the semiconductor substrate 401 and extending laterally below the protruding portions 406.

A plurality of source lines 409 are formed in the semiconductor substrate 401 and extend into the undercuts 407. FIG. 4E1 is a top view illustrating the results after the source lines 409 are formed in the structure depicted in FIG. 4D1; FIG. 4E2 is a cross-sectional view taken along the section line S4e1 depicted in FIG. 4E1; FIG. 4E3 is a cross-sectional view taken along the section line S4e2 depicted in FIG. 4E1; and FIG. 4E4 is a cross-sectional view taken along the section line S4e3 depicted in FIG. 4E1.

In the present embodiment, the forming of the source lines 409 includes steps as follows: Firstly a SEG heavily doped N+ silicon or heavily doped N+ SiGex process is performed to form a poly-silicon layer on the semiconductor substrate 401 and partially extending into the undercuts 407. After the portions of the pad oxide layer 403 and the SiN layer 404 disposed on the protruding portion 406 are removed, an ion implantation process is performed to make the poly-silicon layer has a high n-type dopant concentrations.

A plurality of gate lines 410 are then formed to surround and cover the protruding portions 406 and make the gate lines 410 electrically separated from the source lines 409 and the protruding portions 406. FIG. 4F1 is a top view illustrating the results after the gate lines 410 are formed in the structure depicted in FIG. 4E1; FIG. 4F2 is a cross-sectional view taken along the section line S4$f$1 depicted in FIG. 4F1; FIG. 4F3 is a cross-sectional view taken along the section line S4$f$2 depicted in FIG. 4F1; and FIG. 4F4 is a cross-sectional view taken along the section line S4$f$3 depicted in FIG. 4F1.

In the present embodiment, a thermal oxidation process is performed to form a gate oxide layer 411 on the surface of the protruding portions 406, prior to the forming of the gate lines 410. After the gate lines 410 are formed on the gate oxide layer 411, a plurality of spacers 412 are then formed of the sidewalls of the gate lines 410 by another thermal oxidation process. The thermal process for forming the gate oxide layer 411 and the spacers 412 can make the n type dopants involved in the source lines 409 to diffuse into the locations beneath the protruding portions 406, so as to form a plurality of diffusion regions 409$a$ under the protruding portions 406 and connected to the adjacent source lines 409.

In detail, in the present embodiment, there are two undercuts 407 formed below each one of the protruding portions 406, one of the undercuts 407 extends below the protruding portions 406 from one sidewall of the protruding portions 406, and the other extends below the protruding portions 406 from the opposite sidewall of the protruding portions 406. The source line 409 that partially extends below the protruding portions 406 may include two source regions, such as a first source region 409$c$ and a second source region 409$d$, respectively extending into the two opposite undercuts 407, wherein the corresponding diffusion regions 409$a$ is located between and connect with the first source region 409$c$ and the second source region 409$d$. The first source region 409$c$ and the second source region 409$d$ respectively have a doping concentration substantially greater than that of the corresponding diffusion regions 409$a$.

A plurality of drain electrodes 413 are formed on the top surface of the protruding portions 406, so as to form a plurality of SSL transistors 414 on the semiconductor substrate 401. Wherein, each one of the drain electrodes 413 is formed on one of the protruding portions 406. FIG. 4G1 is a top view illustrating the results after the SSL transistors 222 are formed on the structure depicted in FIG. 4F1; FIG. 4G2 is a cross-sectional view taken along the section line S4$g$1 depicted in FIG. 4G1; FIG. 4G3 is a cross-sectional view taken along the section line S4$g$2 depicted in FIG. 4G1; and FIG. 4G4 is a cross-sectional view taken along the section line S4$g$3 depicted in FIG. 4G1.

In some embodiments of the present invention, prior to the forming of the drain electrodes 413, a silicide layer 415 preferably can be formed on the top surfaces of the protruding portions 406, the first source region 409$c$ and the second source region 409$d$. A SiN hard mask 416 and an ILD layer 417 are formed to cover the protruding portions 406. The forming of the drain electrodes 413 includes steps as follows: A plurality of through holes 418 are firstly formed to penetrate through the ILD layer 417, the SiN hard mask 416, the silicide layer 415, the gate lines 410 and the gate oxide layer 411 to expose a portion of the protruding portions 406. An n type doping region is then formed on the top surface of each one of the protruding portions 406.

After the SSL transistors 414 are formed, a plurality of via plugs 419 are formed in the through holes 418. FIG. 4H1 is a top view illustrating the results after the via plugs 419 are formed on the structure depicted in FIG. 4G1; FIG. 4H2 is a cross-sectional view taken along the section line S4$h$1 depicted in FIG. 4H1; FIG. 4H3 is a cross-sectional view taken along the section line S4$h$2 depicted in FIG. 4H1; and FIG. 4H4 is a cross-sectional view taken along the section line S4$h$3 depicted in FIG. 4H1.

In the present embodiment, prior to the forming of the via plugs 419, a plurality of spacers 420 must be formed on the sidewalls of the through holes 418 to make the via plugs 419 electrically separate from the gate lines 410.

Subsequently, the memory cells 422 are formed on the semiconductor substrate 401 to connecting in series to one of the drain electrodes 413 disposed on the top surface of the protruding portions 406 of the corresponding SSL transistors 414. FIG. 4I is a perspective view illustrating a 3D semiconductor memory device 400 in accordance with yet another embodiment of the present invention.

In the present embodiment, the memory cells 422 connected in series are configured in a 3D memory cells array 421 formed on the structure depicted in FIGS. 4H1 to 4H4. The 3D memory cells array 421 includes a plurality of conductive planes 421$a$ stacked with and electrically separated from each other, a plurality of conductive pillars 421$b$ passing through the conductive planes 421$a$ and a plurality of memory layers 421$c$ disposed between the conductive planes 421$a$ and the conductive pillars 421$b$. Each one of the memory cells 422 is formed at the point of intersection formed between the corresponding conductive plane 421$a$, the corresponding conductive pillar 421$b$ and the corresponding memory layer 421$c$ and electrically connected in series to a drain electrode 423 of the corresponding SSL transistor 414 disposed under the memory cells array 421.

In accordance with the aforementioned embodiments of the present invention, a 3D semiconductor memory device and method for fabricating the same are provided, wherein a FET having a vertical channel is applied to serve as the SSL transistor connected in series to the 3D memory cells array of the 3D semiconductor memory device. In some embodiments of the present invention, the vertical channel of the FET can be configured in a protruding portion of a semiconductor device. In some embodiment, the vertical channel of the FET can be configured on a top surface of a semiconductor substrate by a SEG process.

Since the FET with vertical channel has smaller footprint and the he electrical current-voltage (I/V) characteristic thereof is liner, thus it can be controlled more easily during a multi-bit operation. In other words, using the FET as the SSL transistor connected in series to the 3D memory cells array of the 3D semiconductor memory device can solve the problems of size reduction caused by the horizontally oriented gate FETs and the controlling problems caused by the bipolar junction transistors or the diodes, so as to obviate the drawbacks encountered from the prior art.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three dimensional (3D) semiconductor memory device, comprising:
   a semiconductor substrate, having a first protruding portion;
   a first transistor formed in the semiconductor substrate, comprising:
   a first source line, disposed in the semiconductor substrate and partially extending below the first protruding portion;
   a first gate line configured to surround and cover the first protruding portion and electrically separated from the first source line and the first protruding portion; and
   a first drain electrode formed on and connecting to the first protruding portion;
   a plurality of conductive planes stacked on the semiconductor substrate and electrically separated from each other;
   a first conductive pillar passing through the conductive planes and connecting to the first drain electrode;
   a first memory layer disposed between the conductive planes and the first conductive pillar; and
   a plurality of memory cells formed at a plurality points of intersection correspondingly formed between the conductive planes, the first conductive pillar and the memory layer; and connected in series by the first conductive pillar.

2. The 3D semiconductor memory device according to claim 1, wherein the semiconductor substrate comprises a first undercut extending below the first protruding portion from one sidewall of the first protruding portion, and a second undercut extend below the first protruding portions from an opposite sidewall of the first protruding portion to allow the first source line disposed therein.

3. The 3D semiconductor memory device according to claim 2, wherein the first source line comprises:
   a first source region, extending into the first undercut;
   a second source region, extending into the second undercut; and
   a diffusion region, below the first protruding portion and connected to the first source region and the second source region.

4. The 3D semiconductor memory device according to claim 1, further comprising:
   a second protruding portion, disposed on the semiconductor substrate and adjacent to the first protruding portion;
   a second transistor formed in the semiconductor substrate, comprising:
   a second source line, parallel to the first source line and partially extending below the second protruding portion;
   a second gate line configured to surround and cover the second protruding portion and electrically separated from the second source line and the second protruding portion; and
   a second drain electrode formed on and connecting to the second protruding portion;
   a second conductive pillar passing through the conductive planes and connecting to the second drain electrode;
   a second memory layer disposed between the conductive planes and the second conductive pillar; and
   a plurality of memory cells formed at a plurality points of intersection correspondingly formed between the conductive planes, the second conductive pillar and the second memory layer; and connected in series by the second conductive pillar.

5. The 3D semiconductor memory device according to claim 4, further comprising:
   a third protruding portion, disposed on the semiconductor substrate and adjacent to the first protruding portion;
   a third transistor formed in the semiconductor substrate, comprising:
   a second source line, parallel to the first source line and partially extending below the second protruding portion; and
   a third gate line configured to surround and cover the third protruding portion and electrically separated from the third source line and the third protruding portion;
   a third conductive pillar passing through the conductive planes and connecting to the third drain electrode;
   a third memory layer disposed between the conductive planes and the third conductive pillar;
   a plurality of memory cells formed at a plurality points of intersection correspondingly formed between the conductive planes, the third conductive pillar and the third memory layer; and connected in series by the second conductive pillar.

6. A method for fabricating a 3D semiconductor memory device, comprising:
   providing a semiconductor substrate having a protruding portion;
   forming a source line in the semiconductor substrate and partially extending below the protruding portion;
   configuring a gate line to surround and cover the protruding portion and electrically separated from the source line and the protruding portion;
   forming a drain electrode on and connecting to the protruding portion;
   forming a plurality of conductive planes stacked on the semiconductor substrate and electrically separated from each other;
   forming a conductive pillar passing through the conductive planes and connecting to the drain electrode;
   forming a memory layer disposed between the conductive planes and the conductive pillar; and
   forming a plurality of memory cells at a plurality points of intersection correspondingly formed between the conductive planes, the conductive pillar and the memory layer to make the plurality of memory cells connected in series by the conductive pillar.

7. The method according to claim 6, wherein the process for providing the semiconductor substrate comprises:
   forming a plurality of shallow trench isolations (STIs) in the semiconductor substrate;
   partially etching each one of the STIs to form a plurality of ridge structures parallel to the remaining STIs; and
   removing portions of the ridge structures using the remaining STIs as an etching stop layer, so as to form at least one of the protruding portion.

8. The method according to claim 6, wherein the step for forming the source line comprises:
   etching the semiconductor substrate to form at least one undercut below the protruding portion; and
   performing a selective epitaxial growth (SEG) process to form a poly-silicon layer on the semiconductor substrate and partially extending into the undercut.

9. The method according to claim 8, prior to the forming of the gate line, further comprising steps of performing a thermal oxidation process to forming a gate oxide layer surrounding and covering the protruding portion, and forming a diffusion region below the protruding portion to connect to the poly-silicon layer.

* * * * *